(12) United States Patent
David

(10) Patent No.: US 10,401,683 B2
(45) Date of Patent: Sep. 3, 2019

(54) LOW BLUE LIGHT DISPLAYS

(71) Applicant: SORAA, INC., Freemont, CA (US)

(72) Inventor: Aurelien J. F. David, Freemont, CA (US)

(73) Assignee: SORAA, INC., Fremont, CA (US)

( * ) Notice: Subject to any disclaimer, the term of this patent is extended or adjusted under 35 U.S.C. 154(b) by 153 days.

(21) Appl. No.: 15/712,019

(22) Filed: Sep. 21, 2017

(65) Prior Publication Data
US 2019/0041699 A1 Feb. 7, 2019

Related U.S. Application Data

(63) Continuation-in-part of application No. 14/996,143, filed on Jan. 14, 2016.
(Continued)

(51) Int. Cl.
| G02F 1/13357 | (2006.01) |
| F21V 9/16 | (2006.01) |
| G02F 1/1335 | (2006.01) |
| F21V 9/38 | (2018.01) |
| F21V 8/00 | (2006.01) |
| G02B 5/20 | (2006.01) |
| H01L 25/075 | (2006.01) |
| F21Y 115/30 | (2016.01) |

(Continued)

(52) U.S. Cl.
CPC .......... *G02F 1/133617* (2013.01); *F21V 9/38* (2018.02); *G02B 5/201* (2013.01); *G02B 6/005* (2013.01); *G02F 1/133553* (2013.01); *H01L 25/0753* (2013.01); *F21Y 2115/10* (2016.08); *F21Y 2115/15* (2016.08); *F21Y 2115/30* (2016.08); *G02F 1/133514* (2013.01); *G02F 2001/133624* (2013.01); *H01L 33/42* (2013.01); *H01L 33/44* (2013.01); *H01L 33/50* (2013.01)

(58) Field of Classification Search
CPC .......... G02F 1/133617; F21V 9/38; F21V 9/32
See application file for complete search history.

(56) References Cited

U.S. PATENT DOCUMENTS

| 8,491,816 B2 | 7/2013 | Kijima et al. |
| 2012/0140466 A1 | 6/2012 | Yang et al. |

(Continued)

OTHER PUBLICATIONS

Chen, et al., "Recent Advances on Quantum-Dot-Enhanced Liquid-Crystal Displays", IEEE Journal of Selected Topics in Quantum Electronics, vol. 23, No. 5 p. 1900611, Sep./Oct. 2017.
(Continued)

*Primary Examiner* — Karabi Guharay
(74) *Attorney, Agent, or Firm* — Fisherbroyles LLP

(57) ABSTRACT

A display for emitting display light comprising: (a) a light source for emitting a source light; and (b) a filter positioned in the path of said source light, said filter comprising at least short, medium and long filters, wherein said short filter is configured to transmit short-primary light from said source light, said short-primary light comprising a violet portion having wavelengths from 400 to 440 nm and at least a second portion having wavelengths above 440 nm such that said short-primary light is perceptually blue, said short-primary light having a short-primary SPD having a short-primary power between 380-780 nm and a blue power between 440-500 nm, wherein said blue power is less than 5% of said short-primary power.

40 Claims, 40 Drawing Sheets

Related U.S. Application Data

(60) Provisional application No. 62/541,444, filed on Aug. 4, 2017, provisional application No. 62/103,472, filed on Jan. 14, 2015.

(51) Int. Cl.
| | |
|---|---|
| *F21Y 115/10* | (2016.01) |
| *F21Y 115/15* | (2016.01) |
| *H01L 33/42* | (2010.01) |
| *H01L 33/44* | (2010.01) |
| *H01L 33/50* | (2010.01) |

(56) References Cited

U.S. PATENT DOCUMENTS

2017/0254933 A1* 9/2017 Li .............................. G02B 5/20
2017/0368210 A1* 12/2017 David .................... A61L 2/0052

OTHER PUBLICATIONS

Wang, et al., "Highly efficient narrow-band green and red phosphors enabling wider color-gamut LED backlight for more brilliant displays", Optics Express vol. 23, Issue 22, pp. 28707-28717 (2015).
Yang, et al., "Wide Viewing Angle TN LED Enhanced by Printed Quantum-Dots Film", Proc. SID Symp. Dig. Tech. Papers vol. 47, pp. 21-24, 2016.

* cited by examiner

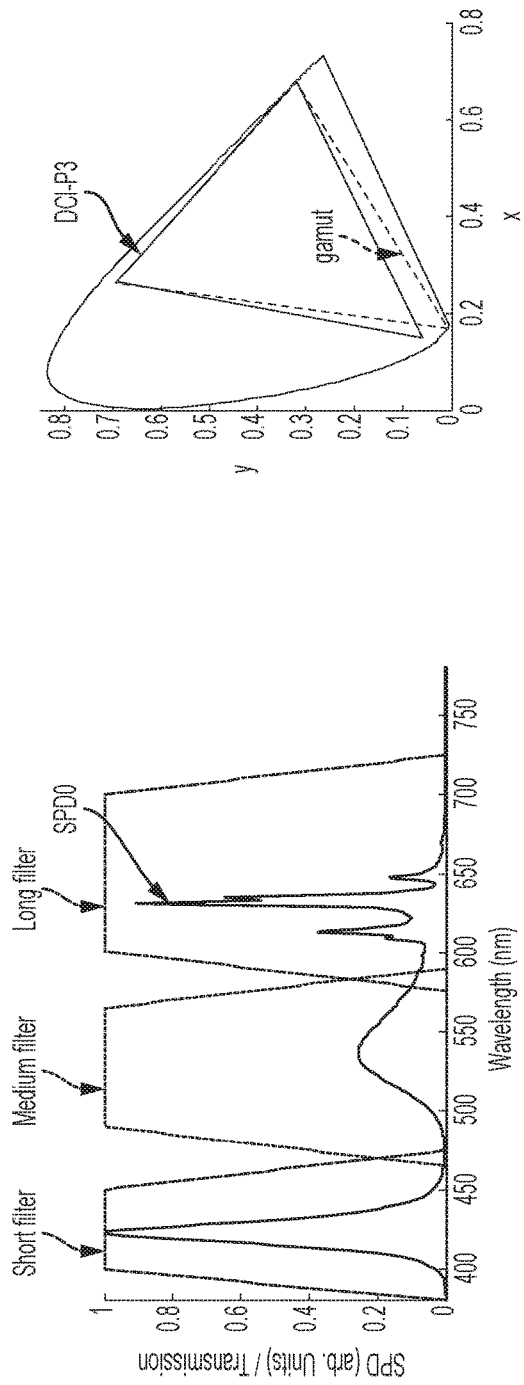
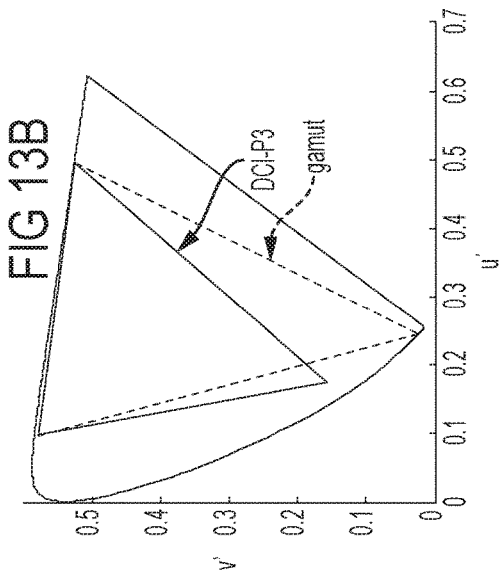
FIG 13A
FIG 13B
FIG 13C

LOW BLUE LIGHT DISPLAYS

CROSS-REFERENCE TO RELATED APPLICATION

This application is based on U.S. Provisional Application No. 62/541,444, filed Aug. 4, 2017, and is a continuation-in-part of application Ser. No. 14/996,143, filed Jan. 14, 2016, both of which are hereby incorporated by reference.

BACKGROUND

A typical LCD display for a computer, hand held device, television or other common electronic device comprises a light source for providing a source light, filters for transmitting primary colors of the source light, and a light modulator for selectively modulating the transmission of the source light through the filters. The light source in typical modern displays comprises solid-state emitters (such as LEDs, lasers, or OLEDs) and possibly light converting materials such as phosphors and quantum dots. The filters are configured to transmit primary colors, which are typically, blue, green and red, and are usually arranged in pixels, in which each pixel comprises filters for transmitting each of the primary colors. The light modulator is commonly an electrically-controlled liquid crystal. Such displays and their components are well known in the art.

Of particular interest herein is the emission of the blue primary color, which has a peak emission around 450-480 nm. FIG. 1 shows the white spectra emitted by the displays of two phones, an Apple iPhone (LCD with LED source) and a Samsung Galaxy (OLED screen), with a strong blue primary providing a good color gamut and high efficiency. However, the high level of blue light in these displays is a cause of concern due to its impact on the circadian cycle of the user.

Applicants have discovered that a spectrum can be configured to appear substantially white, despite a substantial absence of blue radiation, as described in Application U.S. Ser. No. 14/996,143. For simplicity, such spectra is referred to herein as blue-free. Blue-free emitters are desirable due to their reduced impact on the human circadian cycle, which is important for instance, in the evening before going to sleep.

Despite the advantages of blue-free emitters, the lack of blue radiation can be problematic in display devices. First, blue pump LEDs are preferred to excite wavelength-converting materials having a preferential absorption in the blue range. Second, the absence of blue radiation may negatively impact the color gamut. Third, the physical configuration of common displays may not be compatible with the presence of violet emitters.

Therefore, there is a need for a display system that is blue free, yet provides a good color gamut with good performance. The present invention fulfills this need among others.

SUMMARY OF INVENTION

The following presents a simplified summary of the invention in order to provide a basic understanding of some aspects of the invention. This summary is not an extensive overview of the invention. It is not intended to identify key/critical elements of the invention or to delineate the scope of the invention. Its sole purpose is to present some concepts of the invention in a simplified form as a prelude to the more detailed description that is presented later.

One aspect of the invention is providing a blue free display with a good color gamut. Specifically, the short wavelength filter of the display is configured to allow transmission of violet light and a second portion of light having a longer wavelength than violet, for example, cyan or green light. The combination of violet light and this second portion of light is configured to have a dominant wavelength in the blue range (for instance 450-480 nm), and therefore provide a screen having a short primary perceived as a saturated blue rather than a saturated violet. In other words, Applicants recognize that by combing violet light with a higher wavelength light to form a perceptually blue emission, the "blue" primary of the display may appear blue, yet be blue free. Applicants have found that such displays have an excellent color gamut. In particular, some embodiments are able to substantially match or fully match standardized gamuts, including sRGB, NTSC, Adobe RGB, DCI-P3, Rec2020, and other standards known in the art.

Accordingly, in one embodiment, the display comprises: (a) a light source for emitting a source light; and (b) a filter positioned in the path of the source light, the filter comprising at least short, medium and long filters, wherein the short filter is configured to transmit short-primary light from the source light, the short-primary light comprising a violet portion having wavelengths from 400 to 440 nm and at least a second portion having wavelengths above 440 nm such that the short-primary light is perceptually blue, the short-primary light having a short-primary SPD having a short-primary power between 380-780 nm and a blue power between 440-500 nm, wherein the blue power is less than 20% of the short-primary power.

Another aspect of the invention is providing a source light for a blue free display which is blue free, yet efficient. Specifically, Applicants discovered surprisingly suitable performance/efficiency in various configurations of blue-selective materials with a violet pump in the absence of any species emitting substantial blue radiation. Without being tied to a particular theory, Applicants suspect that this unexpected high efficiency may be attributed to the fact that loading of the blue-selective material remains moderate, contrary to expectations. Indeed, due to the lower sensitivity of the human visual system to violet radiation (compared to blue), a high violet leak is required to white-balance a blue-free emitter—i.e. to target its chromaticity to a proper value for display, for instance D65 or other high-CCT chromaticity. This high violet leak in turn requires moderate phosphor loading, so that the package efficiency remains high—e.g. at least 60%, 70%, 80%, or even 90%.

Accordingly, in one embodiment, the light source comprises: (a) one or more solid state light emitters comprising at least a violet solid-state emitter emitting pump light with a peak wavelength in a range 400-430 nm; and (b) one or more wavelength converting materials comprising at least a first wavelength-conversion material configured to absorb a portion of the pump light and to convert the portion to converted light, the first wavelength-conversion material having a first absorption coefficient at the peak wavelength, and a second absorption coefficient at 450 nm, wherein the first absorption coefficient is less than 70% of the second absorption coefficient; wherein the one or more solid state emitters and the one or more wavelength-conversion materials are configured such that the first wavelength-conversion material does not substantially absorb light between 440-490 nm; and wherein the emitted light is substantially white light essentially free of blue light.

In another embodiment, a high efficiency blue free emitter comprises a violet pump emitter combined with quantum dots (Qdots). Applicants have discovered that the use of shorter-wavelength pump emitters had unexpected advantages when combined with Qdots. This enables a substantial reduction in the loading of the Qdots, which may make the system safer, and compliant with regulations. Without being tied to a particular theory, Applicants believe this reduction in loading is a result of (1) a higher absorption at shorter wavelengths, and (2) a higher violet leak required for a blue-free spectrum, which means that a lower fraction of the light needs to be converted to longer-wavelengths. In yet another embodiment, a high efficiency blue free emitter comprises a violet pump emitter combined with a wavelength-conversion material having a high absorption for short-wavelength light (typically violet) but a very low absorption for longer wavelengths (typically blue, green and red). Still other embodiments will be obvious to those of skill in the art in light of this disclosure.

BRIEF DESCRIPTION OF FIGURES

FIG. 13A shows the spectral power distribution SPD0 emitted by a white LED (before the color filters are applied), comprising a violet pump LED (peak wavelength 423 nm), a beta-SiAlON green phosphor (peak wavelength 537 nm) and a KSF red phosphor.

FIG. 13B shows the (xy) color diagram, and shows the resulting color gamut (dashed lines) as well as the DCI-P3 standard gamut (solid line).

FIG. 13C shows the (u'v') color diagram, and shows the resulting color gamut (dashed lines) as well as the DCI-P3 standard gamut (solid line).

DETAILED DESCRIPTION

Referring to FIG. 23, one embodiment is shown of a display 2300 for emitting display light which is essentially blue-free. The display 2300 emits display light comprises a light source 2301 for emitting a source light, and a filter 2302 positioned in the path of the source light. The filter 2302 comprises at least short, medium and long filters, 2302a, 2302b, 2302c, respectively. The short filter is configured to transmit short-primary light from the source light. The short-primary light comprises a violet portion having a wavelength range of 400-440 nm, plus at least a second portion having a wavelength above 440 nm such that the short-primary light is perceptually blue. The short-primary light has a short-primary SPD having an overall power between 380-780 and a blue power between 440-500 nm, wherein the blue power is less than 20% of the overall SPD power. In this embodiment, either the light source is configured to emit blue-free light or the filter is configured to block blue light. But in either embodiment, the short-primary light is essentially free of light having a blue wavelength (in the range 440-500 nm), but nevertheless appears blue.

Figure 27:
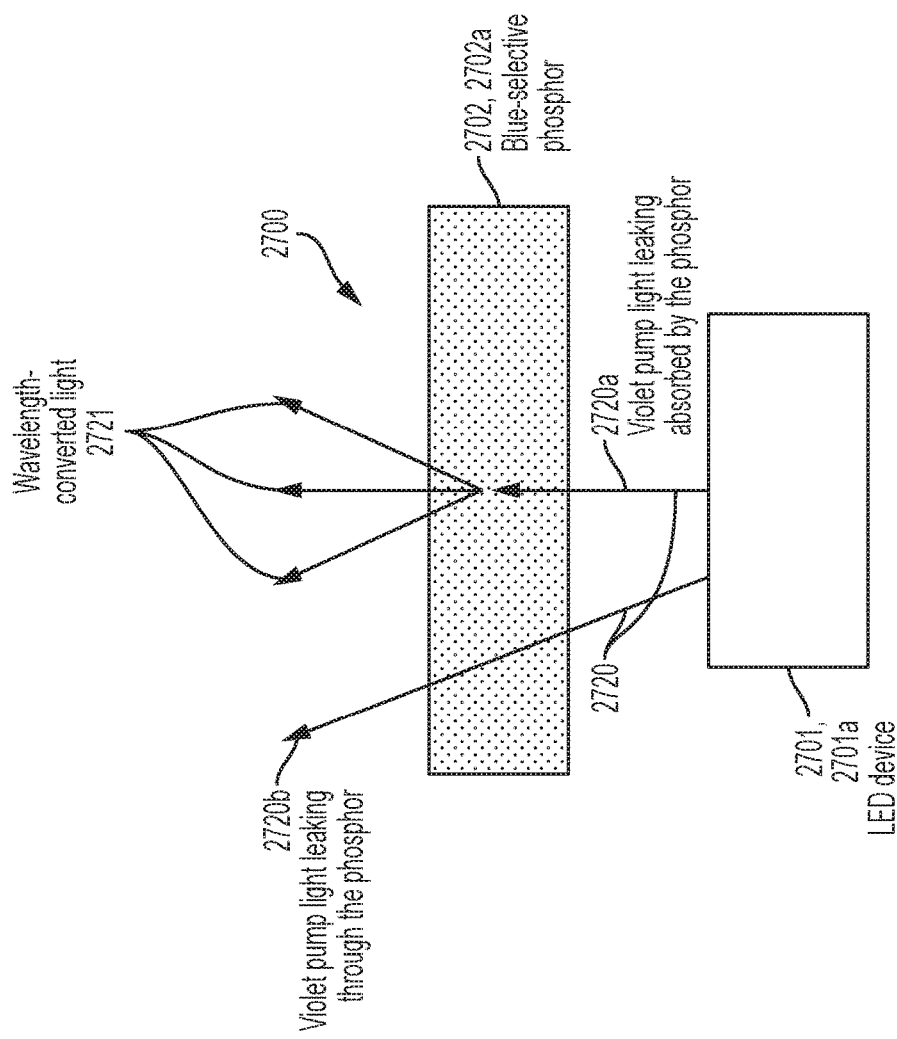
FIG. 27 shows a schematic of one embodiment of a light source of the present invention.

Referring to FIG. 27, another embodiment of a light source 2700 for emitting blue-free light is shown. The light source 2700 comprises one or more solid state light emitters 2701 comprising at least one violet solid-state emitter 2701a emitting pump light 2720 with a peak wavelength in a range 400-430 nm. The light source also comprises one or more wavelength converting materials 2702 comprising at least a first wavelength-conversion material 2702a configured to absorb a portion 2720a of the pump light and to convert the portion to converted light 2721. The first wavelength-conversion material has a first absorption coefficient at the peak wavelength, and a second absorption coefficient at 450 nm, wherein the first absorption coefficient is less than 70% of the second absorption coefficient. The solid state emitters and the one or more wavelength-conversion materials are configured such that the first wavelength-conversion material does not substantially absorb light between 440-490 nm (meaning, substantially no light in this wavelength range is available for the material to absorb, despite the fact that its absorption coefficient in this wavelength range is high). The emitted light is substantially white light even though it is essentially blue free. In one embodiment, the one or more wavelength converting materials 2702 are configured to leak a second portion 2702b of the pump light such that the emitted light comprises the second portion Before addressing the features of the present invention in detail, Applicants describe below considerations for blue-free displays. In the following, and unless otherwise noted, when an output light or output spectral power distribution (SPD) of the display is mentioned, it should be understood as the net light/SPD emitted by the display when it is set to emit a neutral white. In a typical display, this may be a white spectrum with a chromaticity near that of standard illuminant D65. This SPD is sometimes different from the spectral power distribution ("SPD0") emitted by the emitters (such as LEDs) inside the display (for instance, for a side-coupled LCD display, SPD0 is further modulated by the transmission of the waveguide, the liquid crystals, the polarizers, the color filters, the backside reflectors, and possibly other optical elements inside the display). One skilled in the art will know how to target SPD0, taking into account the transmission of the optical system, such that the desired output SPD is obtained.

Further, color targeting may be computed using a variety of color matching functions (CMFs). Conventional color targeting uses the 1931 2° CMFs. However, these are known to be inaccurate, especially at short wavelength. For a display emitting a blue-free spectrum, where a lot of the radiation is in the violet range, these CMFs may result in poor perceptual chromaticity (for instance, the chromaticity may appear too pink despite being nominally on-target). Instead, different CMFs with higher accuracy at short wavelength may be used. Possible choices include the 1964 10° CMFs, or the new CIE physiologically-relevant CMFs, also called 2006 CMFs, available in 2°, 10°, and other viewing angles. In particular, the viewing angle may be selected to match the foreseen viewing conditions of the display. More details on color-targeting with these CMFs can be found in U.S. application Ser. No. 15/633,425 which is incorporated by reference. Unless otherwise noted, chromaticities described and claimed in this application are calculated using 1964 10° CMFs, and the term "substantially white light" refers to light with a chromaticity within a distance in (xy) space less than 0.03 from the Blackbody locus, calculated with 1964 10° CMFs. In addition, it may be desirable for embodiments to have a chromaticity which is around or below the Blackbody locus (resulting in a pinkish tint) rather than far above the blackbody locus (resulting in a greenish tint), because studies have shown that the former was preferred over the latter. Accordingly, the term "preferred white light" refers to light with a chromaticity which is either: (a) below the Blackbody locus, with a distance in (xy) space less than 0.05 from the Blackbody locus; or (b) above the Blackbody locus, with a distance in (xy) space less than 0.01 from the Blackbody locus; these chromaticities being calculated with 1964 10° CMFs.

Also, as used herein, the terms essentially blue-free light, light essentially free/absent of blue light, or substantially no blue light refer to any light (white or otherwise) in which the blue light component is deminimis. In one embodiment, these terms refer to perceptually white light (blue-free white light) and mean that the light is characterized by an SPD, the SPD's radiometric power in the wavelength range 440-500 nm being less than 5% of the SPD's radiometric power in the range 380-780 nm. In one embodiment, these terms refer to perceptually blue light (blue-free blue light) and mean that the light is characterized by an SPD, the SPD's radiometric power in the wavelength range 440-500 nm being less than 20% of the SPD's radiometric power in the range 380-780 nm.

Emitters and Wavelength-Converting Materials

One approach for reducing the blue component in displays involves reducing the blue component emitted in the light source of the display. In one particular embodiment, a violet solid state light emitter is used in combination with a blue-selective wavelength converting material. Although the following description refers to violet LEDs in particular, this is for illustrative purposes, and other light emitters, such as lasers OLEDs, superluminescent LEDs, OLEDs having a quantum dot active emitter (sometimes called QLEDs) are also applicable.

The selection of wavelength-converting materials is generally known in the art in the case of blue pump LEDs, but the use of violet pump LEDs brings along unexpected results. Some wavelength-converting materials are characterized by a large absorption in the blue range and a small absorption in the violet range. Therefore, these blue-selective materials are often used in combination with blue pump LEDs, or more generally in emitters where blue radiation is emitted (for instance a violet pump LED plus a blue phosphor, where the blue radiation from the blue phosphor can pump the blue-selective material), where the blue radiation predominantly pumps the blue-selective material.

Figure 1:
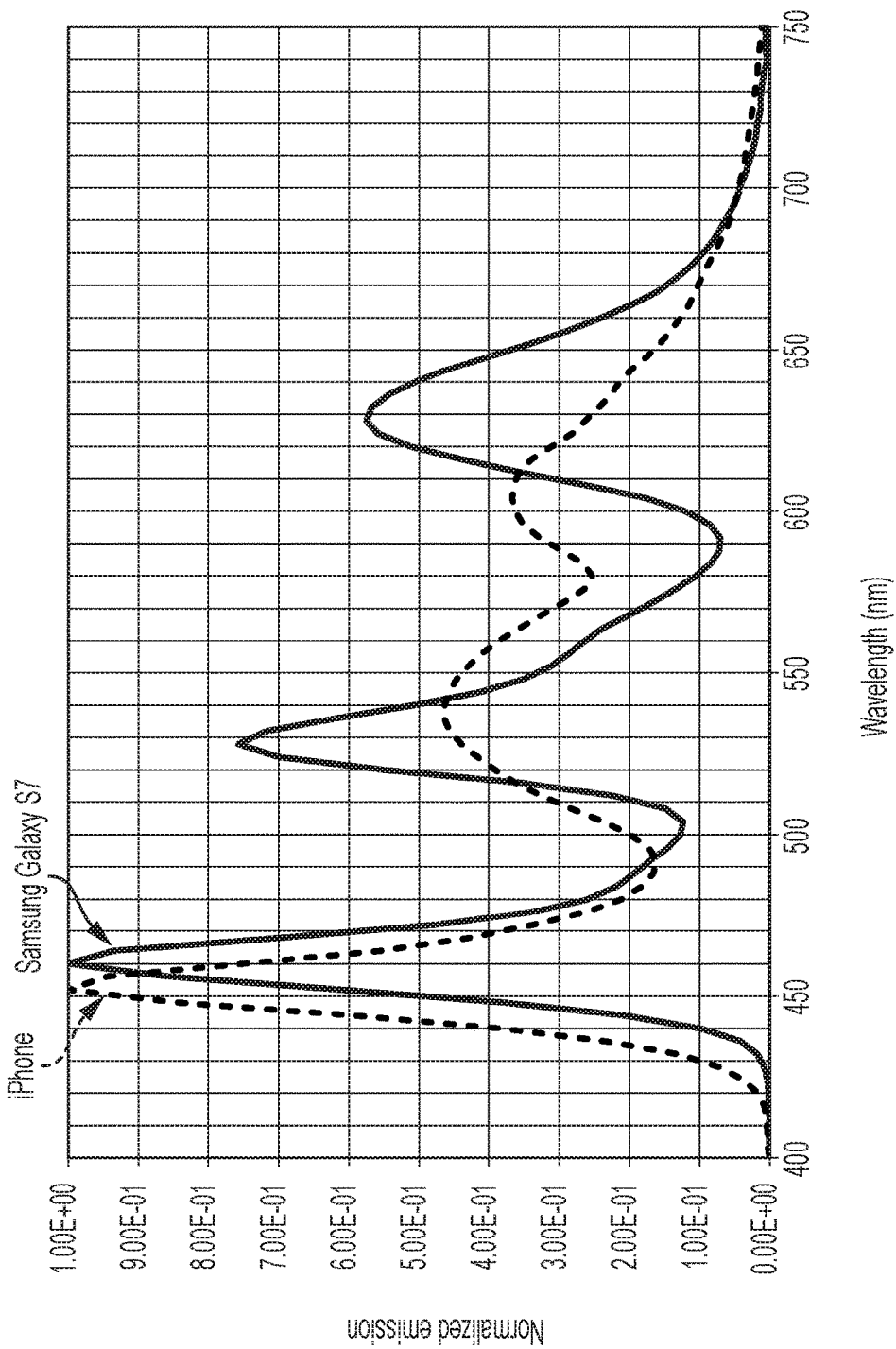
FIG. 1 shows the white spectra emitted by the displays of two phones.
Figure 2A:
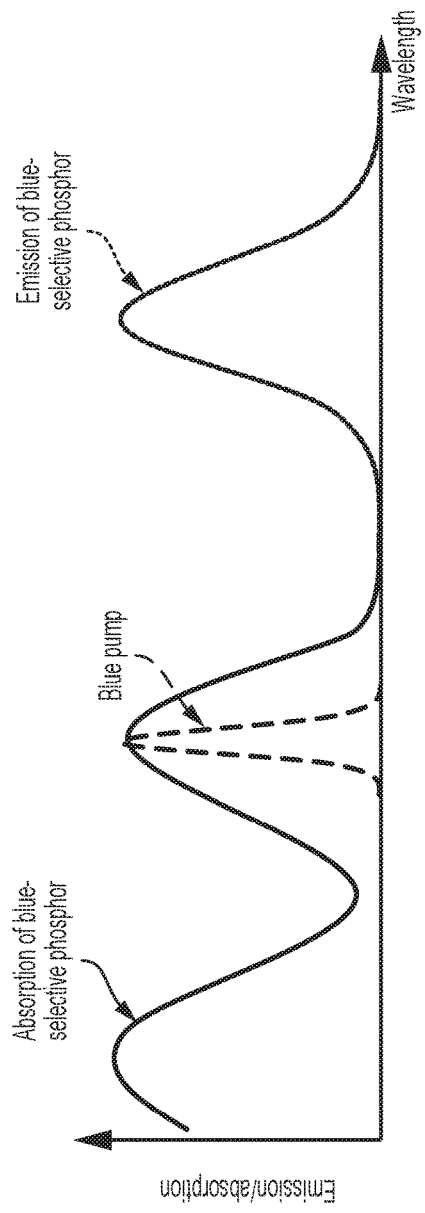
FIG. 2A shows a blue-pump LED exciting a blue-selective material.
Figure 2B:
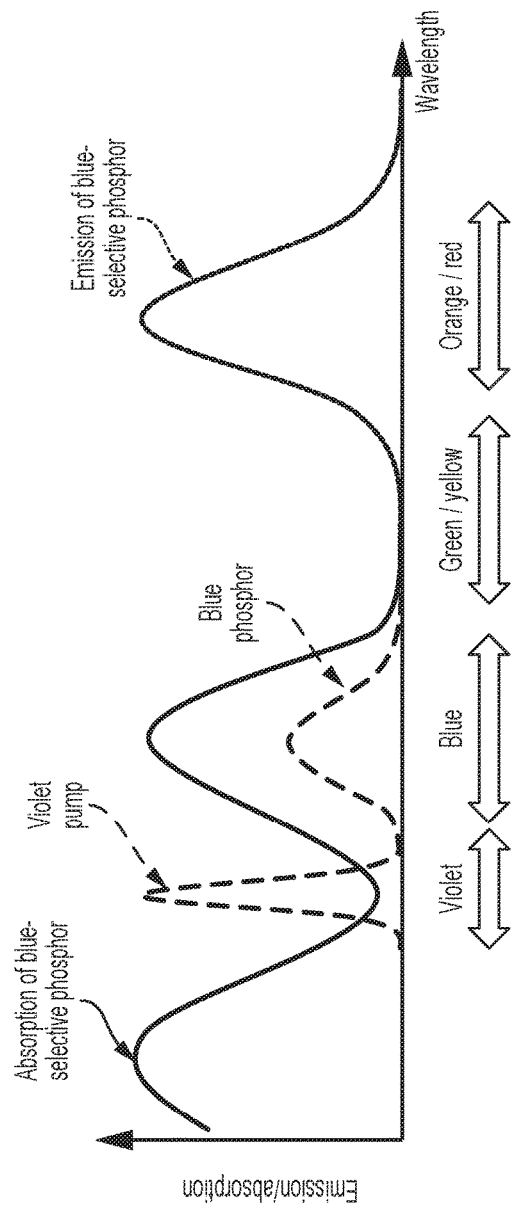
FIG. 2B shows a violet-pump LED exciting a blue phosphor.
Figure 2C:
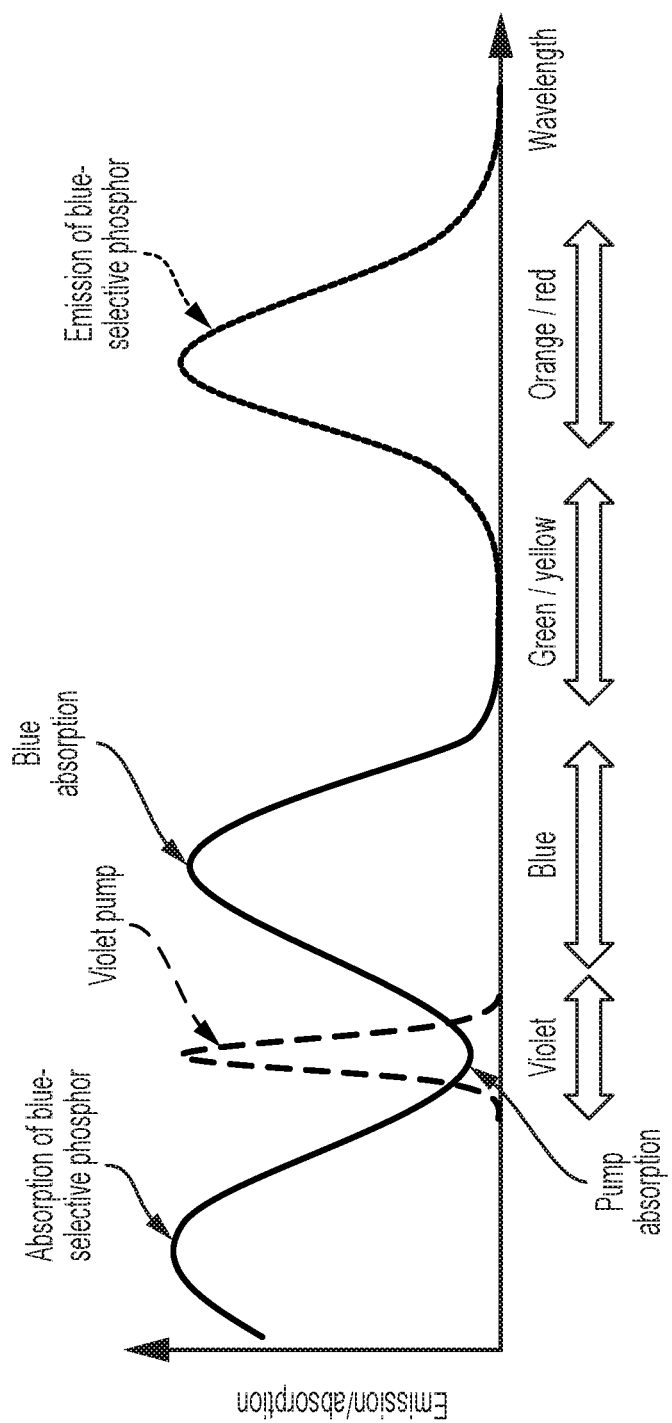
FIG. 2C shows a pump light source, which does not substantially emit blue light but rather emits a shorter-wavelength light, exciting a blue-sensitive wavelength converting material in the absence of blue emitting species.

FIG. 2 illustrates common use of blue-selective materials, in two cases. FIG. 2A shows a blue-pump LED which excites a blue-selective material. The absorption of the blue-selective material has a maximum in the blue range and a lower value in the violet range. The blue-selective material emits in the orange/red range. In this configuration, the blue pump LED has been selected to be near the maximum of absorption of the blue-selective material. Other phosphors (such as green, yellow) may be present but are not shown for clarity. FIG. 2B shows a similar configuration, where a violet-pump LED excites a blue phosphor. The combination of the violet LED and the blue phosphor then excites the blue-selective material. The blue phosphor is absorbed significantly by the blue-selective material.

In contrast, it might be anticipated that blue-selective materials are not suitable for use in an emitter where little or no blue radiation is generated. Indeed, to pump a blue-selective material with a violet LED, one would expect to increase the loading of the material significantly (due to its decreased absorption), which results in scattering and low optical efficiency. Surprisingly, however, Applicants have discovered suitable performance/efficiency in various configurations of blue-selective materials with a violet pump in the absence of any species emitting substantial blue radiation.

This high efficiency may be attributed to the fact that loading of the blue-selective material remains moderate, contrary to expectations. Indeed, due to the lower sensitivity of the human visual system to violet radiation (compared to blue), a high violet leak (e.g., at least 20, 30, 40, 50, 60 or 70%) is required to white-balance a blue-free emitter (i.e. to target its chromaticity to a proper value for display, for instance D65 or other high-CCT chromaticity). The violet leak may be the fraction of the SPD's power which is below 430 nm, or in a range 400 nm-430 nm, or in a range 380 nm-440 nm.

This high violet leak in turn requires moderate phosphor loading, so that the package efficiency remains high. Indeed, in certain embodiments, the ratio of the white power to the violet pump power is high (e.g., at least 40, 50, 60, 70 or 80%). For clarity, this ratio is defined based on the following quantities. The violet power is the power delivered by the violet LEDs to the phosphors; in case the phosphors are in a high-index binder around the LED, the violet power is also equal to the power which would be emitted by the violet LED into a transparent encapsulated medium (such as a silicone with optical index about 1.4 or 1.5); it can be measured experimentally by encapsulating the violet LED, with a dome-shaped encapsulation such that violet light is properly extracted, as is known in the art. The "white" power is the actual power emitted by the LED with phosphors to the outside world, and comprises the combination of pump light leaking through the phosphor and phosphor-converted light (the term "white" does not require this emission to necessarily be white; it simply denotes the emission after wavelength conversion has occurred) This ratio is the product of three terms: package efficiency, Stokes shift, and net quantum yield of the phosphors. In certain embodiments, the package efficiency is at least 60, 70, 80, or even 90%, the Stokes shift is at least 70, 80, or 90%, and the cumulative quantum yield is estimated to be at least 70, 80, 90, or 95% (the high package efficiency value is due in part to the high violet leak described above).

Accordingly, several embodiments are characterized by the following features: a pump light source which does not substantially emit blue light and emits shorter-wavelength light (for instance violet light), a blue-selective wavelength-conversion material, and no species for substantially emitting blue light. This corresponds to the configuration of FIG. 2C. In this case, the violet pump LED excites the blue-selective material, in the absence of a blue emitting species (pump LED or phosphor).

Figure 3A:
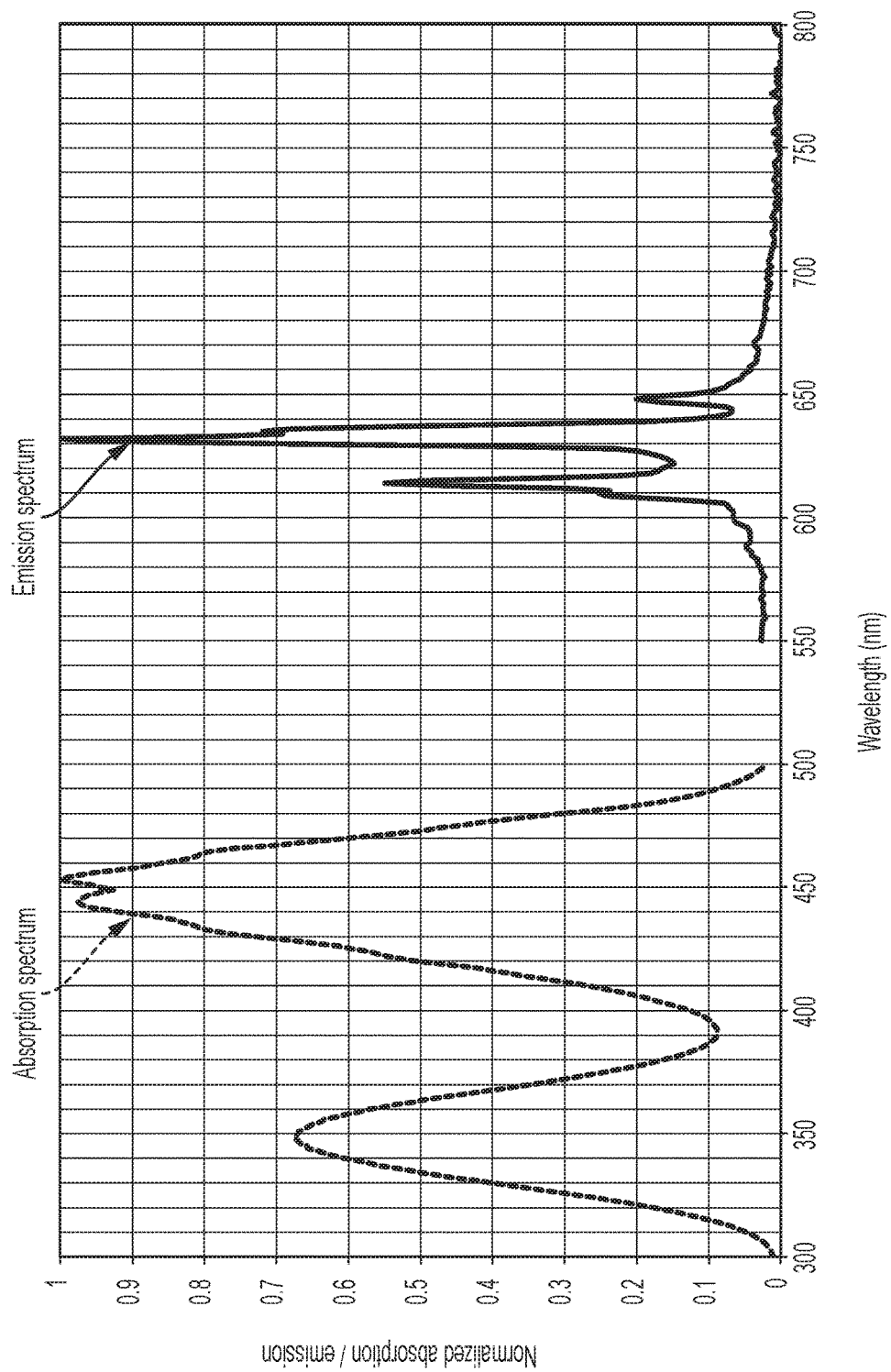
FIG. 3A shows experimental data for a given blue-selective material.

FIG. 3A shows experimental data for a given blue-selective material, the narrow red phosphor ($K_2SiF_6:Mn^{4+}$), also called KSF. This phosphor has a maximum absorption near 450 nm and a local minimum of absorption near 400 nm. The minimum is about 10% of the maximum—meaning the absorption at 400 nm is about 10% of that at 450 nm.

Surprisingly, despite this low absorption, Applicants were able to configure highly efficient blue-free emitters with KSF and demonstrate high performance experimentally.

Figure 3B:
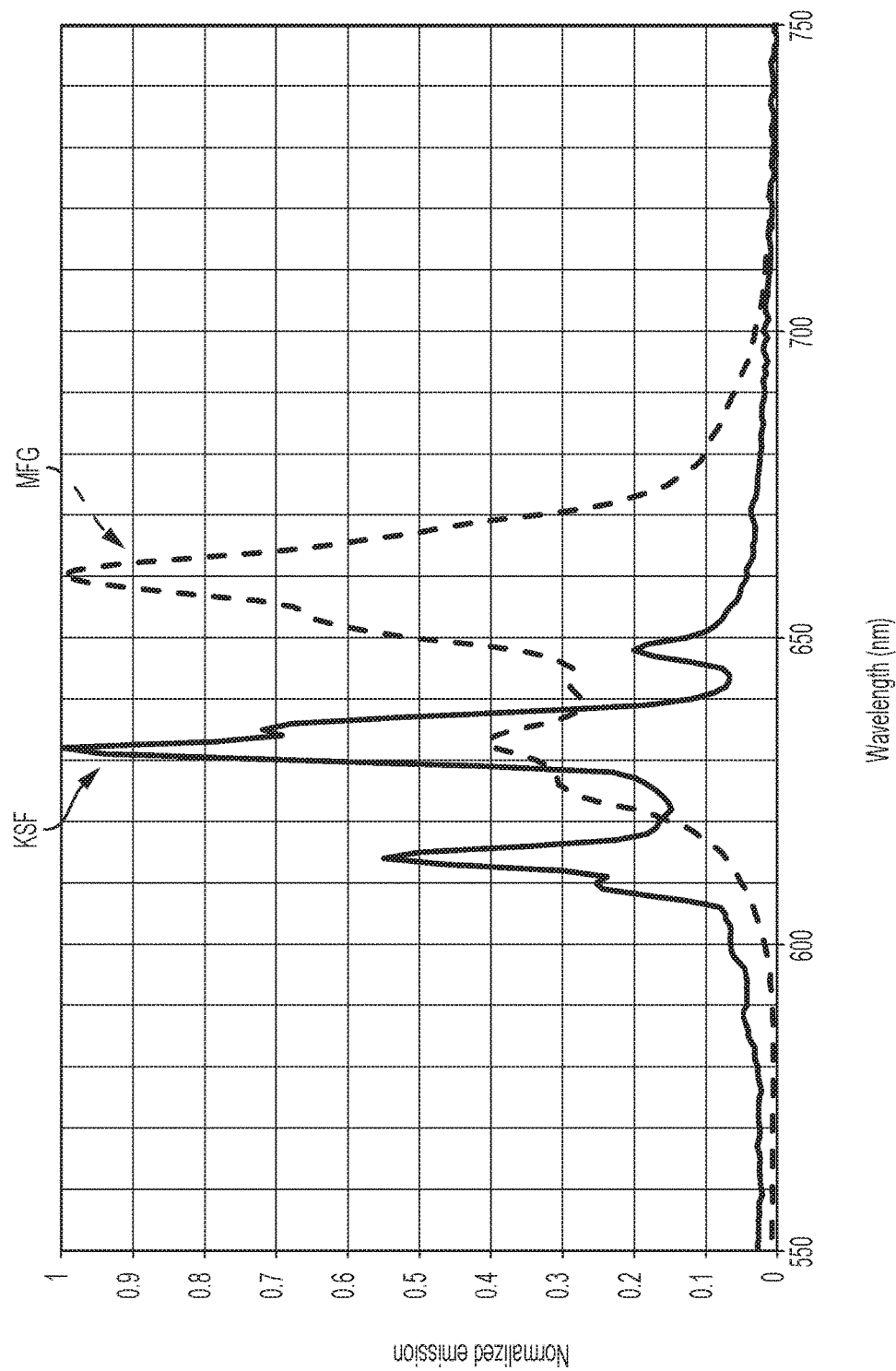
FIG. 3B shows that emission of narrow-red phosphors.

FIG. 3B further shows that other narrow-red phosphors can be employed, including the MFG material system. FIG. 3B compares the emission spectra (or SPDs) of KSF and MFG. The two phosphors respectively have main emission peaks at about 630 nm and 660 nm. Both of these values can be useful for specific applications (depending for instance on the trade-off between lumen efficiency and color gamut, as will be discussed hereafter). Accordingly, some embodiments make use of blue-selective narrow-red emitters having a FWHM less that 10 nm (or 20 nm, 30 nm, 40 nm, 50 nm, 60 nm) and a peak wavelength which is within the range 620-650 nm, or is within +/−5 nm of 630 nm (or 600 nm, 610 nm, 620 nm, 640 nm, 650 nm, 660 nm).

Some embodiments using blue-selective wavelength converters further comprise other wavelength conversion materials—for instance a green (or yellow) phosphor which is optically excited by the pump light source. In some cases, the blue-selective material can substantially absorb light from such a green phosphor (for instance it has a high absorption at the peak emission wavelength of the green phosphor, substantially equal to its blue absorption). In other cases, on the contrary, the blue-selective material has relatively low absorption for light emitted by the green phosphor. In some cases, the blue-selective material is mostly excited by the pump light, or mostly by light from the green phosphor, or substantially by both. Either of these configurations can be advantageous depending on the situation (i.e. minimize the loading of the blue-selective material vs. minimize cascade pumping events which cause more quantum yield loss). As can be seen from FIG. 3A, in the case of KSF, absorption is very low in the green/yellow range (for instance absorption is less than 5% of its peak value for wavelengths above 500 nm, and is low enough that it is not shown on FIG. 2A).

Figure 4:
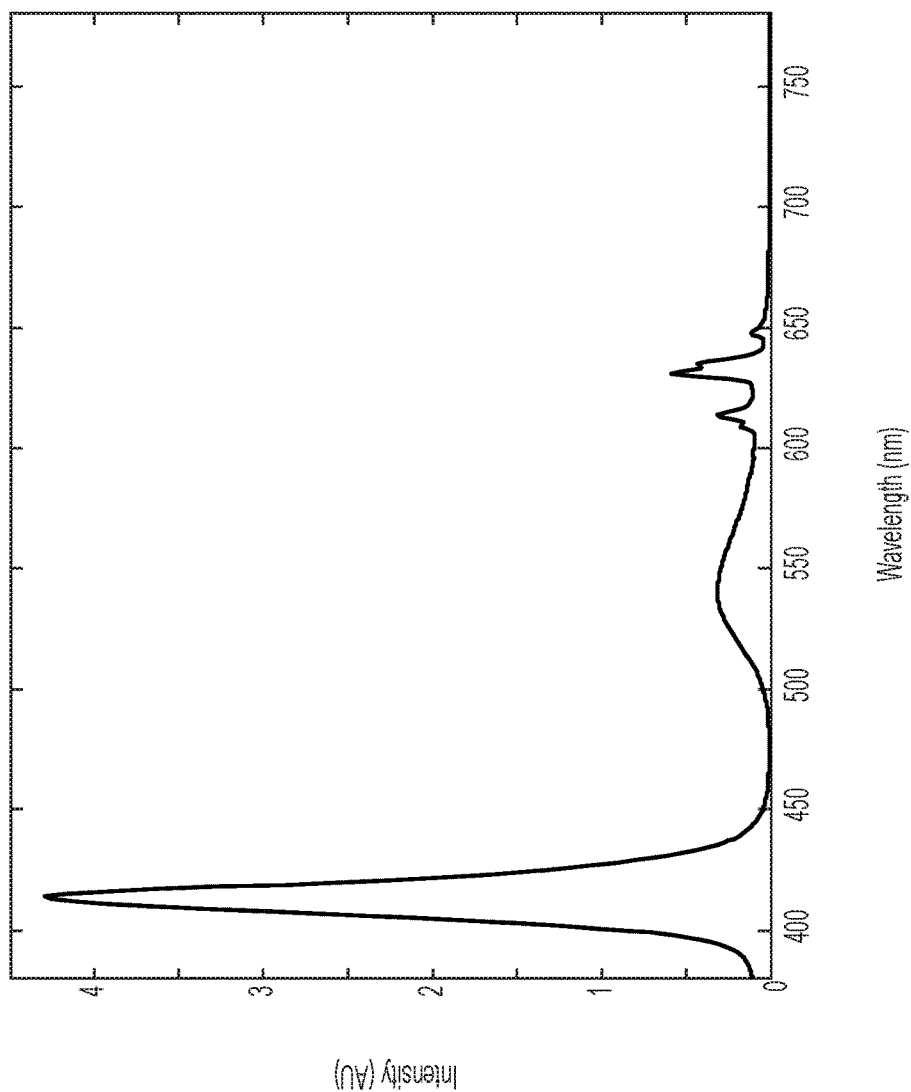
FIG. 4 shows an experimental spectrum emitted by an emitter comprising a violet pump LED, a beta-SiAlON green phosphor, and a KSF red phosphor.

FIG. 4 shows an experimental spectrum emitted by an emitter comprising: a violet pump LED, a beta-SiAlON green phosphor, and a KSF red phosphor. In this experiment, the relative weight loadings of the phosphor slurry are as follows: silicone 100 mg (using a methyl silicone, which offers good reliability with a violet pump LED), KSF 16 mg, beta-SiAlON 1.5 mg. This can be characterized as a relative KSF loading of 16% (i.e. its weight relative to silicone). In other embodiments, the relative loading of the blue-selective material may be low or moderate: it may be below 100%, below 50%, below 25%, below 15%, below 10%, below 5%.

Despite the absence of a blue species to pump KSF, in the experiment of FIG. 4, the efficiency of the emitter is high. The white emitter emits 114 mW of optical radiation (at 80 C and 160A·cm' drive current), and the encapsulated pump LED emits 142 mW of violet radiation under the same conditions. Therefore, the ratio of the white power to the violet pump power is 80%. This figure is the product of three terms: package efficiency, Stokes shift, and net quantum yield. The Stokes shift is 91%. The cumulative quantum yield is estimated at 98%, and the package efficiency at about 90%. As mentioned above, this high efficiency may be attributed to the fact that the KSF phosphor loading remains moderate to produce a high violet leak (70% for the experiment of FIG. 4) as required to white-balance a blue-free emitter. Note that the accurate estimate of the cumulative phosphor quantum yield can be difficult, but the current breakdown uses an optimistic value so that the package efficiency estimate is a lower bound; a less optimistic quantum yield estimate of 95% would translate into an even-higher package efficiency of about 94%.

Figure 5:
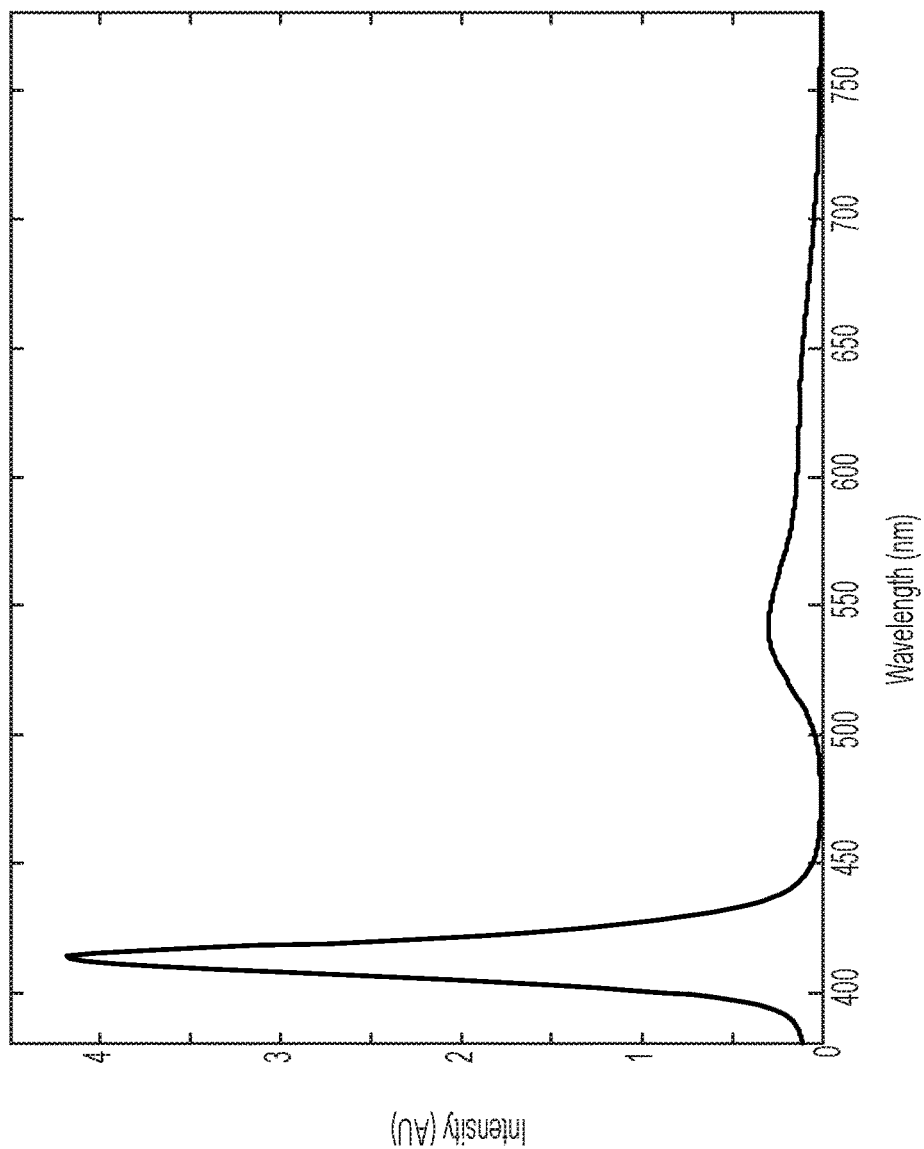
FIG. 5 shows a blue-free spectrum using a standard nitride red phosphor.

For comparison, FIG. 5 shows a blue-free spectrum using a standard nitride red phosphor. Nitride reds are readily excited by violet pump LEDs. The performance of this emitter is substantially equal to that of the emitter of FIG. 4 (the white output is 114.7 mW in FIG. 5, versus 113.9 mW in FIG. 4). This demonstrates that the use of a blue-selective red phosphor does not lead to a penalty in performance compared to a legacy red phosphor. On the other hand, the narrow width of KSF is beneficial for lumens and color gamut—as will be discussed hereafter.

The SPDs of FIGS. 4 and 5 are both color-targeted at (u'=0.2, v'=0.43), which may be a suitable chromaticity for obtaining a D65 white point at the output of the display.

Other examples of blue-selective materials include: other narrow red phosphors such as MFG; and some garnet green and yellow phosphors (possibly including YAG and LuAG and combinations thereof, and more generally [GaLuY]AG, depending on the specific absorption spectra of such garnets).

In some embodiments, the blue-selective material is characterized by two values of its light absorption coefficient: a blue absorption which is defined as the peak absorption in a blue range 430-480 nm, and a pump absorption at the peak wavelength of the pump light source (for instance: 400 nm, 405 nm, 410 nm, 415 nm, 420 nm, 425 nm, 430 nm). The blue absorption is substantially higher than the pump absorption. For instance, it is at least 5 (or 1.5, 2, 3, 10, 20) times higher. For instance, FIG. 3A shows that for KSF, the blue absorption is about 10 times higher than the absorption at 400 nm and 2 times higher than the absorption at 420 nm and 1.5 times higher than the absorption at 430 nm. Equivalently, the pump absorption is at most 50% (or 70%, 30%, 10%, 5%) of the blue absorption.

Figure 6:
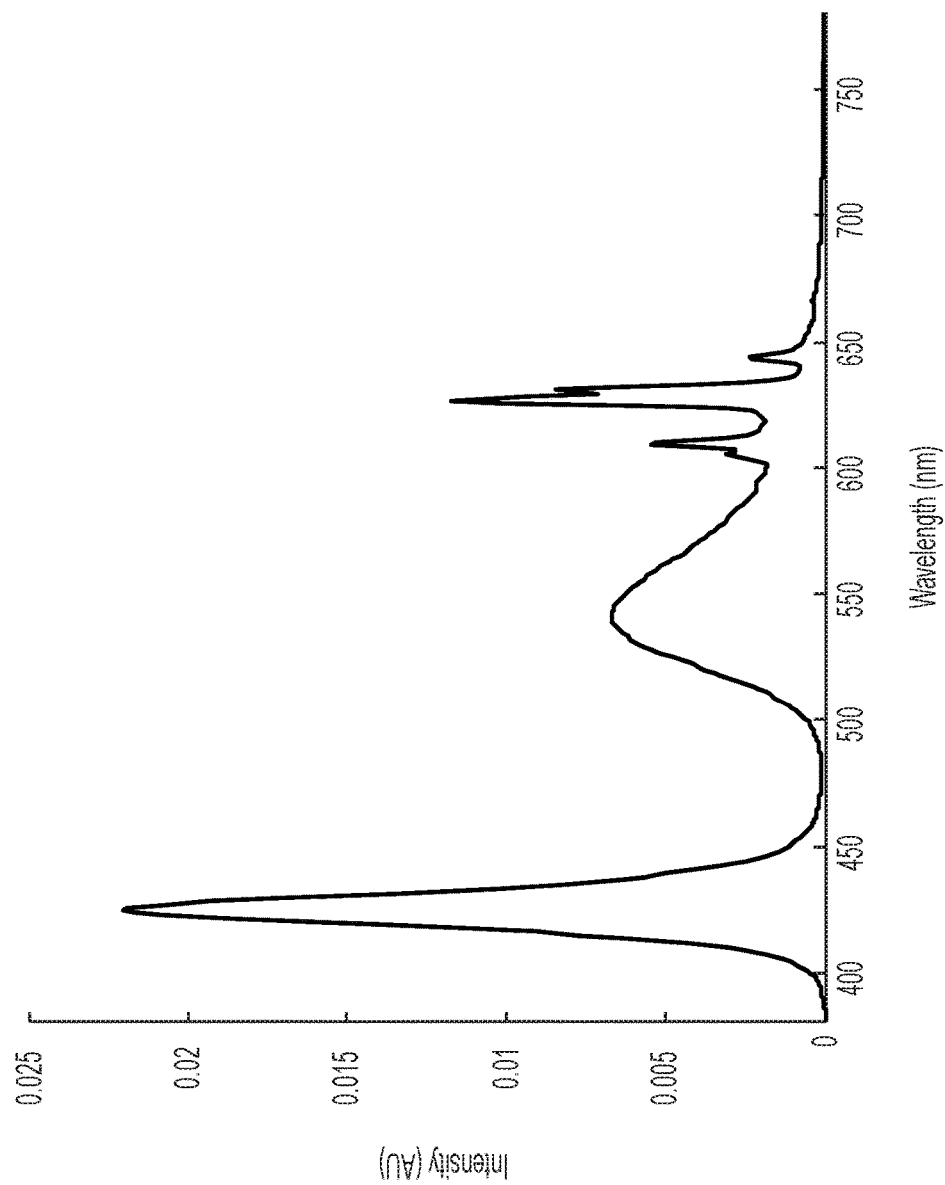
FIG. 6 shows an SPD similar to that of FIG. 4, but with a violet pump LED having a peak at 425 nm.

Other SPDs exist with similar spectral features. By numerical modeling, Applicants have investigated such SPDs. For example, FIG. 6 shows features similar to the SPD of FIG. 4, including the type of emitters. However, the violet pump LED has a peak at 425 nm, and the chromaticity is targeted to D65 (namely x=0.3127, y=0.3290). This SPD has a violet leak (defined here as the fraction of SPD's power in the range 400-450 nm to the total SPD power) of about 40%.

Figure 7:
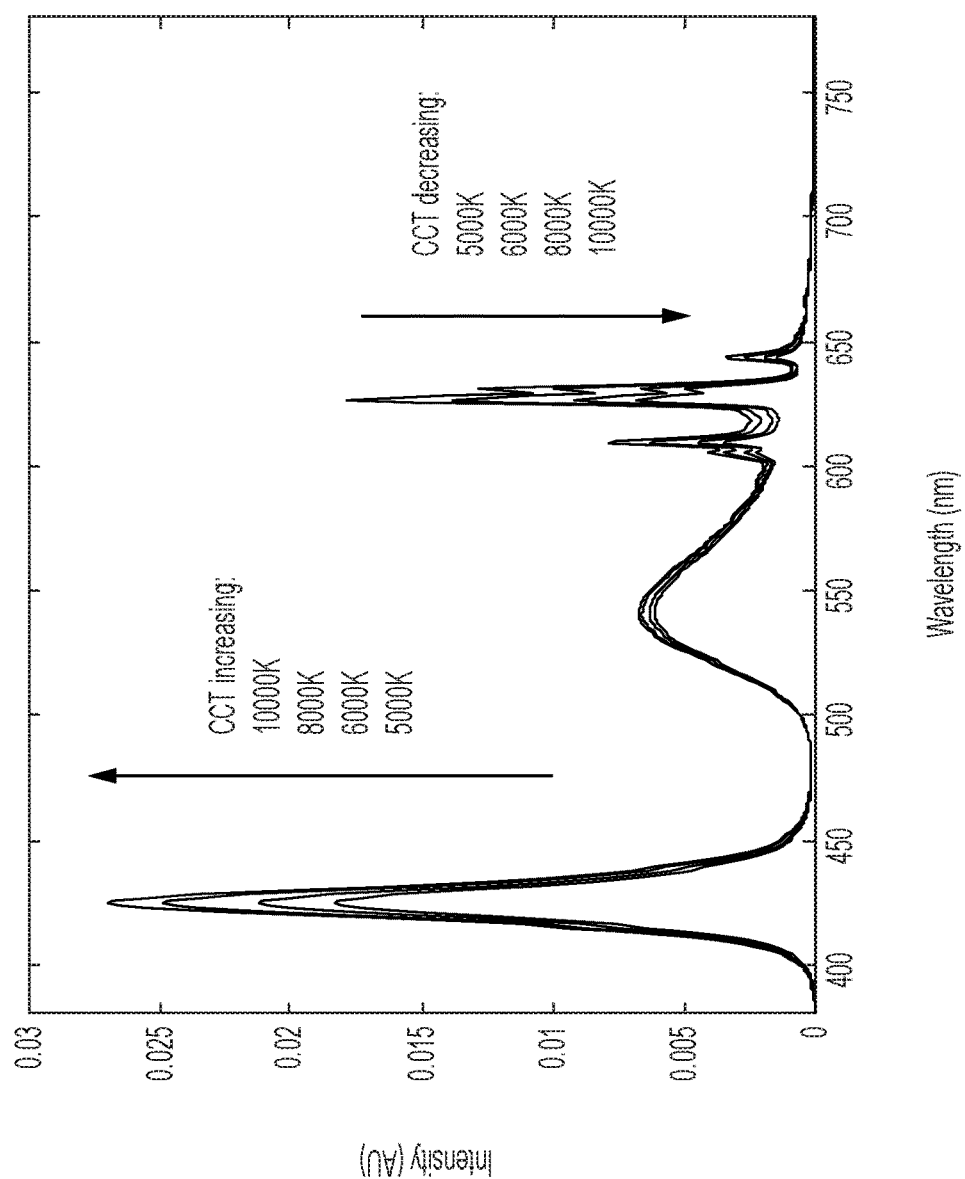
FIG. 7 shows an SPD similar to that of FIG. 6, targeted on-Planckian with correlated color temperatures (CCTS) of 5000K, 6000K, 8000K, 10000K.

FIG. 7 shows a series of SPDs similar to that of FIG. 6, targeted on-Planckian with correlated color temperatures (CCTS) of 5000K, 6000K, 8000K, and 10000K. As the CCT increases, the violet power increases and the red power decreases. Accordingly, the raw spectrum emitted by emitters, SPD0, may be configured, taking into account the optical transmission of the whole display system, such that the final emitted SPD matches one of those shown on FIG. 6, or more generally an SPD of desired CCT and chromaticity.

Some embodiments are display systems which emit a spectral power distribution (SPD) characterized by being free of blue radiation or essentially blue free. This may be expressed by one of the following criteria:

(1) A local minimum near (for instance, within +/−5 nm, or +/−10 nm, or +/−20 nm) the peak of absorption of the blue-selective material and a local maximum in a violet range (such as 400-430 nm or 410-425 nm);

(2) An intensity at the peak absorption wavelength of the blue-selective material which is less than 5% (or 20%, 10%, 2%, 1%, 0.5%, 0.1%) of its peak value in a violet range (such as the range 400-430 nm). This is the case for the SPD of FIG. 4: its intensity at 450 nm (where KSF's absorption peaks) is 1% of its peak violet value (at 413 nm);

(3) A local minimum near 440 nm (or 445 nm, 450 nm, 455 nm, 460 nm, 465 nm, 470 nm, 475 nm, 480 nm); or within +/−10 nm (or 5 nm, 20 nm, 25 nm, 30 nm) of a peak absorption wavelength of the blue-selective material. This is the case for the SPD of FIG. 4: it has a local minimum around 470-480 nm;

(4) An intensity near 440 nm (or 445 nm, 450 nm, 455 nm, 460 nm, 465 nm, 470 nm, 475 nm, 480 nm) which is less than 5% (or 2%, 1%, 0.5%, 0.1%) of its average value in the range 380-780 nm. This is the case for the SPD of FIG. 4: its intensity at 470 nm is 2.4% of its average value in the range 380-780 nm; and (5) An integrated power in the range 440-480 nm (or 440-500 nm) that is less than 3% (or 5%, 2%, 1%, 0.5%, 0.2%, 0.1%) of its integrated power in the range 380-780 nm. This is the case for the SPD of FIG. 4: its integrated power in the range or 440-500 nm is about 1.6% of its integrated power in the range 380-780 nm.

For the sake of clarity, unless another characterization is otherwise stated, a blue-free white spectrum will be characterized by an SPD, the SPD's radiometric power in the wavelength range 440-500 nm being less than 5% of the SPD's radiometric power in the range 380-780 nm. This value contrasts with standard blue-LED-based white spectra: especially at the high CCTs used in display applications (above 5000 K), such spectra often have more than 20% of their spectral content in the range 440-500 nm.

An exemplary embodiment is a light emitter comprising: a violet pump LED with an emission peak in the range 415-430 nm; a blue-selective narrow red phosphor such as KSF; a narrow green phosphor with an emission peak in a range 520-560 nm.

Another exemplary embodiment is a light-emitting system (for instance a display) comprising a violet pump LED with a peak pump wavelength in the range 415-430 nm; a first wavelength-converting material having an peak absorption wavelength in a blue range 430-480 nm; such that an absorption at the peak pump wavelength is at most 70% of an absorption at the peak absorption wavelength; a second wavelength-converting material; the system being configured such that the light-converting material is substantially excited by the pump LED and is not substantially excited by any other radiation source (in particular, the system does not possess a radiation source substantially emitting light at the peak absorption wavelength which would be configured to pump the first wavelength-converting material); and such that the system emits a substantially white light. The embodiment is characterized by a package efficiency above 70%.

Although the discussion above focuses on blue-selective materials and blue-free emitters, the same concept can be used with a different wavelength range than blue. For instance, one may use the present teachings to conceive a yet-unanticipated green-free source having a phosphor which preferentially absorbs green light, combined with a non-green pump light source and an absence of green emitter.

In some display applications, quantum dots (Qdots) are desirable because they have a narrow linewidth (such as less than 20 nm or 30 nm or 40 nm or 60 nm FWHM) and their wavelength can be precisely tuned, for instance by size selection. These properties can be useful to optimize the gamut of the display.

Relevant chemistries for Qdots comprise the following compounds, and derived materials: Group II-VI (Cd-based): CdS/CdSe/CdTe/ZnSe/ZnS; Group III-V (Cd-free): TnP/ZnS; and Group I-III-VI2 (Cd-free): CuInS2/CuInSe2/ZnS.

On the other hand, Qdots do pose challenges. Some Qdots may comprise toxic heavy metals such as cadmium. They may also have low-to-moderate absorption in the blue range, which is the conventional range for pump wavelengths in a display. Due to this, a high loading of Qdots may be necessary to absorb the pump light sufficiently, but such a large amount of toxic material may be problematic, or may even be banned.

Applicants have discovered that the use of shorter-pump emitters had unexpected advantages when combined with Qdots. Accordingly, embodiments use violet-pump LEDs rather than longer-wavelength pump LEDs (e.g. blue LEDs). This enables a substantial reduction in the loading of the Qdot, which may make the system safer, and may make it compliant with regulations. This reduction in loading comes from two factors: 1) a higher absorption at shorter wavelength (as will be illustrated below) and 2) a higher violet leak required for a blue-free spectrum, which means that a lower fraction of the light should be converted to longer-wavelengths.

Figure 8:
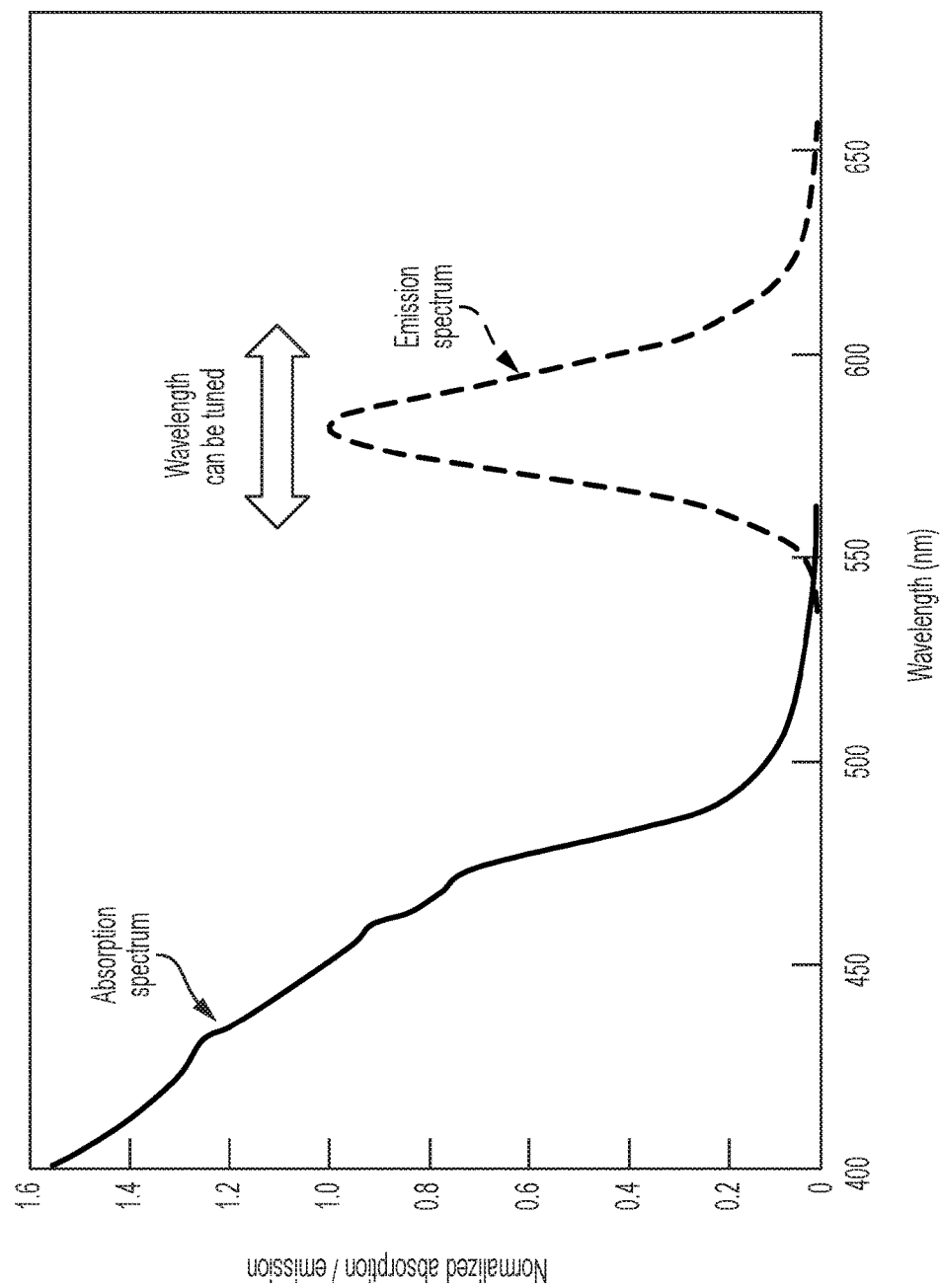
FIG. 8 shows the absorption and emission spectra of a quantum dot converter.

FIG. 8 shows the absorption and emission spectra of a quantum dot converter. In this example, the emission has a FWHM of about 30 nm. Importantly, manufacturers of such materials have shown that the peak emission wavelength of Qdots could be shifted independently from their absorption spectrum. Therefore, the emission spectrum shown on FIG. 8 is illustrative and can be shifted to shorter wavelength or longer wavelength. The absorption spectrum increases gradually with shorter wavelength. With absorption normalized to unity at 450 nm, absorption is about 1.25 at 430 nm and about 1.5 at 400 nm. These higher absorption values mean that the loading of the Qdot can be reduced when a shorter-wavelength pump is employed.

In some embodiments, the Qdot is characterized by a blue absorption and by a pump absorption, and the pump absorption is substantially higher than the blue absorption. The blue absorption may be the peak absorption in a blue wavelength range, or in the range 440-460 nm, or at 450 nm. The pump absorption may be the absorption at the peak emission wavelength of the pump LED. The pump absorption may be at least 1.2, 1.3, 1.5, 2, 3, 5, or 10 times higher than the blue absorption.

Figure 9:
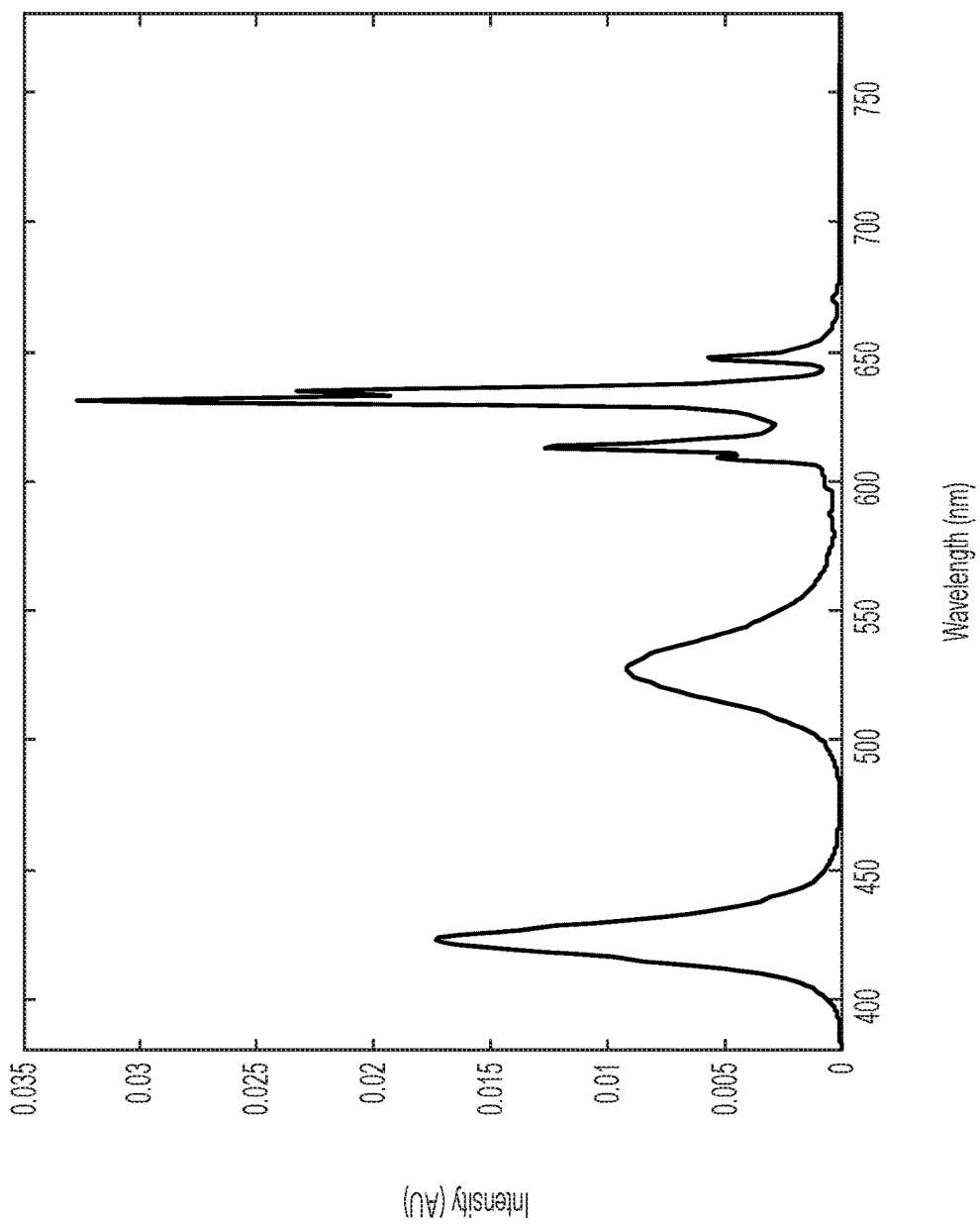
FIG. 9 shows a modeled SPD for an embodiment, comprising a violet pump LED, a green quantum dot phosphor (with a FWHM of about 30 nm), and a KSF red phosphor.

FIG. 9 shows a modeled SPD for an embodiment, comprising a violet pump LED, a green quantum dot phosphor (with a FWHM of about 30 nm), and a KSF red phosphor. This SPD is color-targeted close to D65, such that the display's output is D65 with proper filters.

Figure 10:
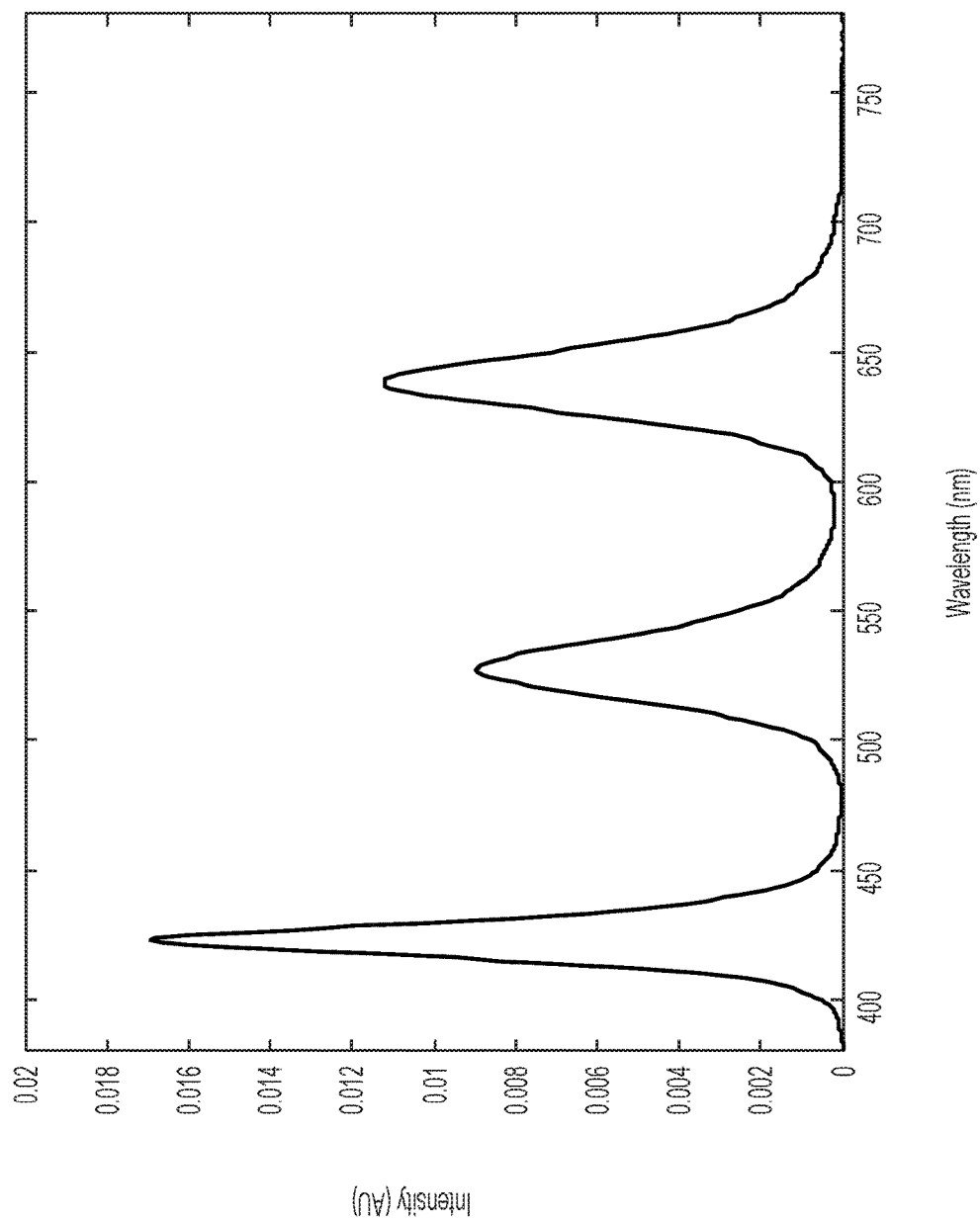
FIG. 10 shows a modeled SPD for an embodiment, comprising a violet pump LED, a green quantum dot phosphor (with a FWHM of about 30 nm), and a red quantum dot phosphor (with a FWHM of about 30 nm).

FIG. 10 shows a modeled SPD for an embodiment, comprising a violet pump LED, a green quantum dot phosphor (with a FWHM of about 30 nm), and a red quantum dot phosphor (with a FWHM of about 30 nm). This SPD is color-targeted close to D65, such that the display's output is D65 with proper filters.

Some embodiments, owing to the moderate loading of QD materials, are characterized by a package efficiency above 80% (or 75%, 85%, 90%).

In some embodiments, the wavelength-converting materials are embedded in a mix with a binder (such as a silicone). The mix can be characterized by the weight loading of each component relative to the binder (i.e. a red phosphor loading of 50% means that the weight of the red phosphor is 50% of that of the binder). Some embodiments comprise one or several quantum dots, whose weight loading is less than 10% (or less than 100%, 20%, 5%, 1%, 0.1%, 0.01%, or 0.001%). In some cases, the loading is selected such that a heavy metal amount (such as Cd amount) is less than 100 pm (i.e. less than 0.01%).

In some embodiments, the Qdots have a short luminescence decay time, for instance shorter than 100 us, 10 us, 1 us, 100 ns, 10 ns, or 1 ns. This is in contrast to some phosphors, with decay times of 10 ms or longer, which can limit the refresh rate of a display.

In some cases, it can be advantageous to employ wavelength-conversion materials which have a high absorption for short-wavelength light (typically violet) but a very low absorption for longer wavelengths (typically blue, green and red).

Figure 11:
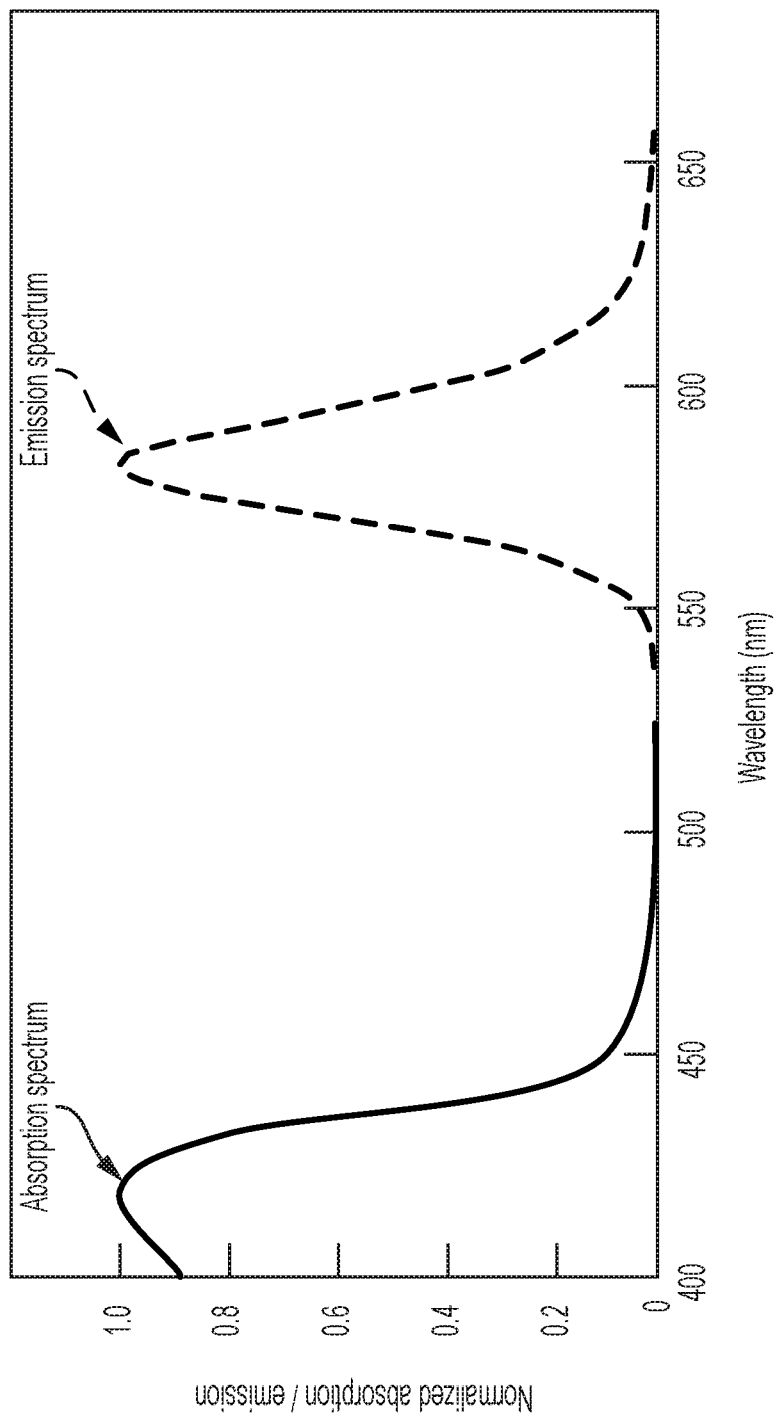
FIG. 11 shows a possible absorption and emission spectrum for such a violet-selective material.

FIG. 11 illustrates a possible absorption and emission spectrum for such a violet-selective material. The absorption has a maximum at about 425 nm, and has an absorption at 450 nm which is about 10% of the absorption at 425 nm. The material's peak emission wavelength may be configured independently from its absorption spectrum, leading to a material which preferentially absorbs violet light but emits at an arbitrary wavelength, including blue, green, yellow, orange, red. This material may be used with a 425 nm pump LED, without substantially absorbing other radiation (including radiation from emitting species in the system, as well as radiation from outside light sources like daylight).

In some embodiments, the violet-selective material is characterized by an absorption peak in the range 400-430 nm or 350-430 nm, or more generally below 430 nm. The violet-selective material may have an absorption at the violet pump peak wavelength which is at least 2 (or at least 1.5, 5, 10, 20, or 100) times higher than the absorption at a longer wavelength, for instance at 450 nm (or at 500 nm, 550 nm, 600 nm, or 650 nm).

In one embodiment, a display system has a violet pump LED with a peak pump wavelength below 430 nm; and has a violet-selective wavelength conversion material, whose absorption at the peak pump wavelength is at least 10 times higher than its absorption at 450 nm.

The violet-selective material may be, for example, a phosphor, a quantum dot, or a semiconductor-based material. Its electrical and optical properties (including the electronic band structure) may be engineered to tune its absorption and emission (for instance, by configuring its strain, material composition, doping, surface chemistry, size).

In some embodiments, the pump emitter is a violet LED (or other solid-state emitters including OLED, laser diode, superluminescent LED, OLED with quantum dots active region, etc. . . . ) selected for high efficiency. There is in general a tradeoff: a shorter peak wavelength reduces the amount of radiation in the blue range (which is caused for instance by the long-wavelength tail of the violet LED), which can be desirable for a blue-free emitter. On the other hand, the human vision system is more sensitive to longer violet wavelengths; therefore, the luminous efficacy of radiation (LER) of the display's output SPD increases for a longer peak wavelength.

Figure 12:
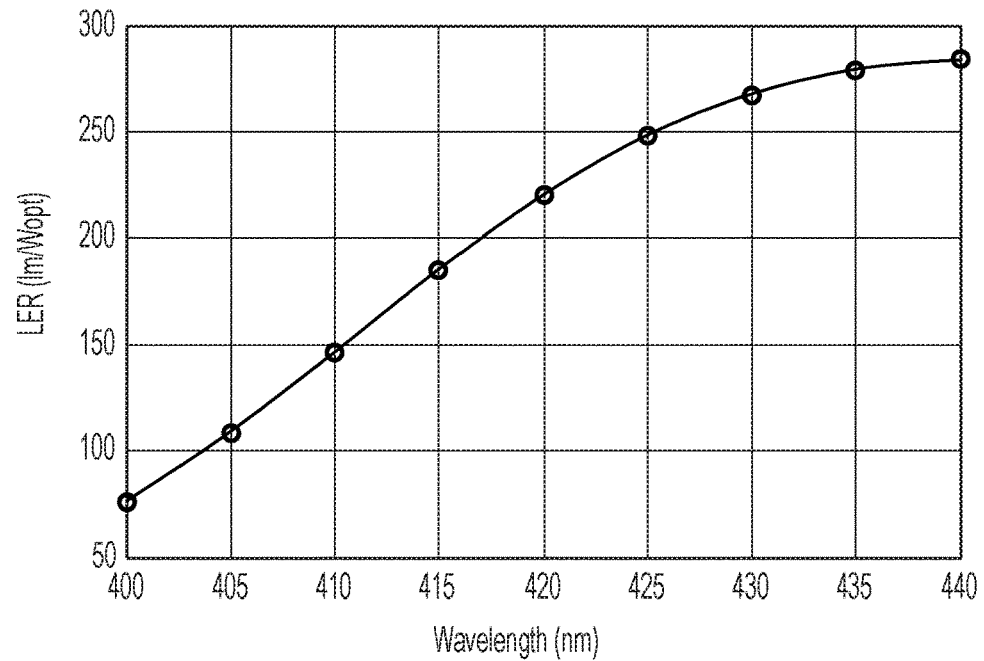
FIG. 12 shows the LER and blue fraction for embodiments having varied pump peak wavelengths in the range 400-440 nm.
Figure 12:
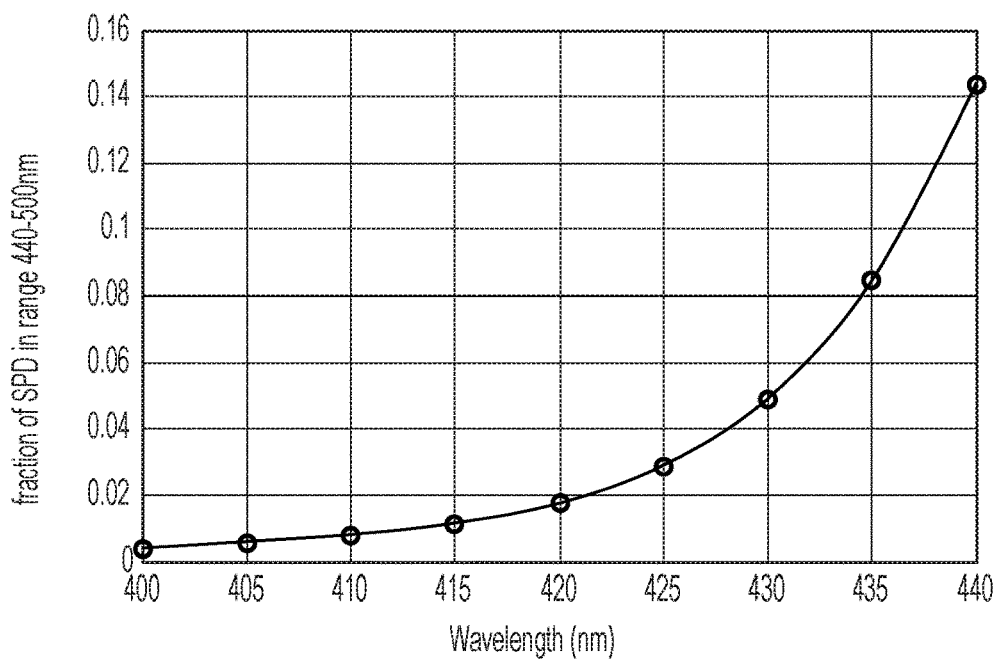

FIG. 12 illustrates this tradeoff. It shows the LER and blue fraction for blue-free white light embodiments having varied pump peak wavelengths in the range 400-440 nm. These are for SPDs having an LED pump, a quantum dot green with FWHM of 30 nm and a peak at 527 nm, and a KSF red phosphor, color-targeted on D65. The blue fraction is defined as the ratio of the SPD's power in the range 440-500 nm to the total SPD power (in practice, in the range 380-780 nm).

As the peak wavelength increases, the LER increases rapidly. Above 425 nm, the blue fraction also increases rapidly. For comparison, the blue fraction for a legacy emitter (i.e. an emitter with a blue pump LED at 450 nm and the same phosphors and chromaticity) is about 20-30%. Therefore, emitters with a peak wavelength below 430 nm (which have 5% blue fraction or less) provide substantially lower blue fraction than a legacy emitter Depending on the relative importance of the LER and blue fraction, a preferred peak wavelength may be selected. For instance, a peak in the range 415-430 nm or 417-428 nm or 420-425 nm (or substantially at 420 nm or 425 nm) may be suitable as it provides relatively high LER and low blue fraction. A peak at 425 nm can provide a high LER (about 90% of the value of a legacy emitter) and a low blue fraction (25% of the value of a legacy emitter).

In one case, the LER should be above 200 lm/Wopt (at least 66% of a conventional system) and the fraction of the SPD in the range 440-500 nm should be below 4% (less than 15% of a conventional system). Accordingly, the range 417-428 nm may be selected for the peak pump wavelength.

This discussion of preferred wavelength ranges depends on the spectral with of the violet solid-state emitter. A narrow emitter (such as a laser diode) may be configured at a longer peak wavelength without having emission in the range 440-500 nm; therefore, in the case of a narrow emitter, the peak wavelength may be 430 nm or 435 nm or in the range 430-439 nm, as this increases the LER without increasing the blue content.

In some embodiments, the pump emitter and the wavelength-conversion materials are configured together according to the above teachings, further taking into account the effect of the display's optical system (including color filters)

In some embodiments, care is taken that the display's optical elements have low absorption for violet light. For instance, a waveguide is made of PMMA, or has an optical absorption coefficient at the peak pump wavelength which is less than 0.1 cm-1 (or 1 cm-1, 0.01 cm-1, 0.001 cm-1, 0.0001 cm-1). Various optical elements (liquid crystal, polarizer, lenses . . . ) should transmit violet light; the single-pass transmission of violet pump light (at the peak pump wavelength) through a film of such an optical element may be more than 50%, 75%, 80%, 90%, 95% (for polarizers, this pertains to the maximum transmission of light polarized along the polarizer). Some optical elements should reflect violet light (reflecting films on a waveguide, DLP reflector . . . ); the reflectivity at the pump peak wavelength may be more than 80% (or 90%, 95%, 98%).

In some embodiments having filters, care is taken to use materials and filters with moderate absorption in the violet range (for instance, in the range of about 410-430 nm). Indeed, violet light may be a necessary aspect to embodiments of the invention as it may replace unwanted blue and cyan light. In some embodiments of the invention, the total transmission of the display system (which may be due to filters, waveguides, diffusers, polarizers and other elements) varies by less than 50% (or less than 20%, less than 10%) between 420 nm and 450 nm. In some embodiments, the total transmission of the display system in the range of about 410 to about 430 nm is more than 20%, more than 50%, more than 80%.

Filters

The following discussion pertains in part to the filters of the display, in cases where the display uses such color filters. As mentioned above, the filters comprise color filters, for instance to convert a broadband spectrum into several primaries. A well-known example is an LCD display with blue, green and red primaries. The color filters of such displays will be referred to as: short, medium, and long filter respectively. In a conventional LCD display, these would respectively correspond to a blue, a green, and a red filter. However, for embodiments, the short filter typically has to be adapted to transmit violet wavelength. Further, the primaries of such a display (i.e. the lights emitted when a pixel of the display fully transmits one filter and blocks the others) will be called short, medium and long primary. It should be understood however that some of the following discussion is more general, and may pertain to other display technology than LCDs with color filters, or displays with more than three static primaries.

In the following, a simplified approximation for the transmission of color filters will be used. All filters will be assumed to have plateaus of zero and unity transmission, connected by areas where the transmission varies linearly with wavelength (between 0 and 1) over a width of 25 nm. Such slopes are achievable with well-designed color filters. This approximation neglects details in the transmission of real filters (including tails and ripples), as well as below-unity transmission; however it is sufficiently realistic to be predictive of achievable color gamuts. One skilled in the art will know how to adapt the present teaching to real-world color filters.

It is desirable to achieve a large color gamut while retaining a good optical efficacy. This is in principle not trivial in the case of a blue-free emitter, for reasons which may include:

(1) the pump LED is violet rather than blue. This shifts the blue point of the color gamut towards violet, so saturated blues are not available. If a conventional short filter is used, trying to display a nominally-saturated-blue may in fact appear as a saturated violet, causing color distortion; and (2) as discussed above, some narrow phosphors which are desirable for high gamut are also blue-selective absorbers, and one may anticipate they are incompatible with a violet pump LED.

However, Applicants have found it was possible to obtain a large and satisfactory gamut with properly-configured blue-free emitters. In particular, some embodiments are able to substantially match or fully match some standardized gamuts, including sRGB, NTSC, Adobe RGB, DCI-P3, Rec2020, and other standards known in the art. One aspect of the invention, already discussed, is that some blue-selective phosphors can in fact be configured for efficient pumping by a violet LED. This includes narrow red phosphors such as KSF and MFG. They can therefore be used as red phosphors for saturated reds. Another aspect, already discussed, is the use of green and/or red quantum dots as a green/red phosphor for saturated greens/reds.

Yet another aspect is the proper design of color filters. In particular, the short filter may be designed to allow transmission of violet light and some transmission of a second portion of light having a longer wavelength than violet, for example, cyan or green light. The combination of violet light and this second portion of light may be configured to have a dominant wavelength in the blue range (for instance 450-480 nm) and therefore provide a screen having a short primary perceived as a saturated blue rather than a saturated violet. In other words, in one embodiment, the invention relates to a filter for emitting light which is perceptually blue, but essentially free of blue light.

Most standard color gamuts have a short primary whose dominant wavelength is in the range 450-480 nm (or 440-490 nm), and most often in the range 460-470 nm. This corresponds to perceptually blue light. Embodiments of the invention achieve short-primaries with similar dominant wavelengths, despite the use of violet pump emitters with a short peak wavelength (such as below 430 nm). For the sake of clarity, unless otherwise specified, dominant wavelengths herein are computed in (xy) color space and with respect to the D65 white point.

FIGS. 13 and 14 are modeled systems, which illustrate this concept. FIG. 13A shows the spectral power distribution SPD0 emitted by a white LED (before the color filters are applied), comprising a violet pump LED (peak wavelength 423 nm), a beta-SiAlON green phosphor (peak wavelength 537 nm) and a KSF red phosphor. FIG. 13A also shows three color filters (short: dashed; medium: dotted; long: dash-dotted). FIG. 13B shows the (xy) color diagram, and shows the resulting color gamut (dashed lines) as well as the DCI-P3 standard gamut (solid line). In this case, the short filter is simply designed to fully transmit the violet peak. This results in a gamut whose short primary is violet rather than blue, and hence a nominal "saturated blue" is displayed as a saturated violet. This may be undesirable (especially if accurate rendering of saturated blues is sought). FIG. 13C shows the same data as FIG. 13B, in the (u'v') color diagram, where the blue/violet discrepancy is more apparent.

For the sake of clarity, unless otherwise stated, gamut coverages will be calculated in (xy) color space. Hence a 90% coverage of the DCI-P3 gamut means that the display has a gamut whose total area, in (xy) space, is 90% of the area of the DCI-P3 gamut.

For the sake of clarity, referring to LED-based SPDs, the term "power" will, unless otherwise noted, refer to radiometric power, as is known in the art. For the sake of clarity, referring to LED-based SPDs, the term "total power" will, unless otherwise noted, refer to the integrated radiometric power in the range 380-780 nm (which in general is substantially all the power in the SPD).

FIG. 14 is similar to FIG. 13 but employs a different short filter, which also transmits cyan/green radiation in the range 500-520 nm. This shifts the chromaticity of the short-wavelength primary from a violet to a blue dominant wavelength. The resulting primary nearly coincides with the blue primary of the DCI-P3 standard. Further, the medium and long filters are configured such that the red and green apexes of the gamut (corresponding to the medium and long primaries) also comply with DCI-P3. In consequence, this system is nearly compliant with the DCI-P3 gamut, despite the use of a violet pump LED. Here SPD0 is configured to have a D65 chromaticity when all three filters are fully transmitting. In terms of gamut area, the embodiment has a gamut which is 99% of DCI-P3 (calculated in (xy)) or 96% of DCI-P3 (calculated in (u'v')).

Some embodiments of the invention generally employ this concept by having a short filter whose transmission extends in the cyan/green regime, such that the dominant wavelength of the short primary is shifted longer than the dominant wavelength of the pump LED. For instance, in FIG. 14, the violet LED has a dominant wavelength 413 nm, but the short primary has a dominant wavelength of about 470 nm.

In some embodiments, the short filter's transmission at 500 nm is at least 50% (or 80%, 30%) of the transmission at the violet LED's peak wavelength. In some embodiments, the short primary emits a spectrum where at least 10% (or 50%, 20%) of the radiometric power doesn't come from the violet pump emitter. In some embodiments, the emitters have pump LEDs with a peak wavelength below 430 nm (or below 428 nm or in the range 417-428 nm) but the display's short primary has a dominant wavelength which is above 440 nm, or above 460 nm, or in the range 440-490 nm. The dominant wavelength is calculated with respect to the screen's white point (D65 in the example of FIG. 14), as is known in color science.

In some embodiments, the difference between the violet LED's peak wavelength and the dominant wavelength of the short primary is at least 20 nm, or 30 nm, or 40 nm, or 50 nm. For instance, the peak wavelength is 425 nm and the dominant wavelength is 465 nm. This is in contrast to standard displays with blue pump LEDs, where the short primary's dominant wavelength is often within 10 nm of the pump LED's peak wavelength.

In some embodiments, the short primary is perceptually blue despite the lack of blue radiation (i.e. it is a "blue-free blue primary"). This lack of blue radiation can be characterized by the SPD of the short primary. For instance, for the embodiment of FIG. 14, the SPD of the short primary is such that its power in the range 440-500 nm is 7.5% of the total power in the range 380-780 nm, and its power in the range 450-490 nm is 2.2% of the total power in the range 380-780 nm. Accordingly, in some embodiments, the SPD's power in the range 440-500 nm is less than 20% (or 15%, 10%, 5%, 2%) of the SPD's power in the range 380-780 nm; or the SPD's power in the range 450-490 nm is less than 8% (or 5%, 3%, 1%) of the SPD's power in the range 380-780 nm. For comparison, a blue-LED-based display's short primary may have about 70-95% of its power in the range 440-500 nm.

Figure 14A:
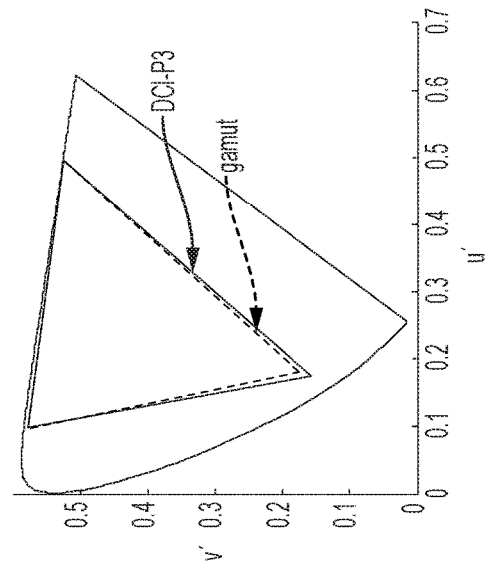
FIG. 14A shows a modeled embodiment similar to FIG. 13A, but which employs a different short filter that also transmits cyan/green radiation in the range 500-520 nm.
Figure 14C:
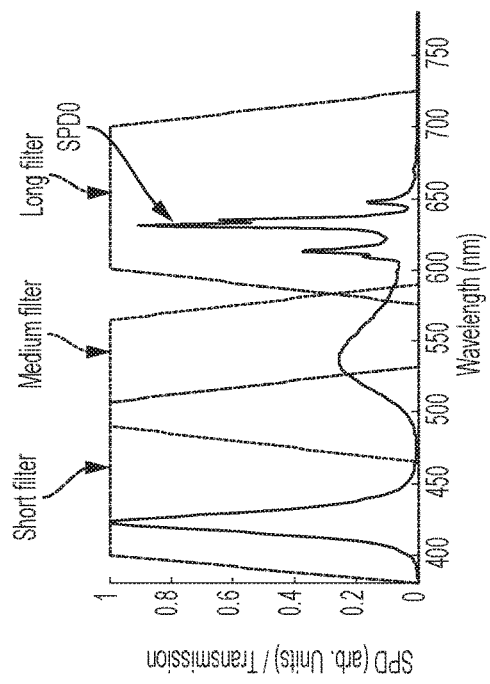
FIG. 14C shows the (u'v') color diagram, and shows the resulting color gamut (dashed lines) as well as the DCI-P3 standard gamut (solid line).
Figure 14B:
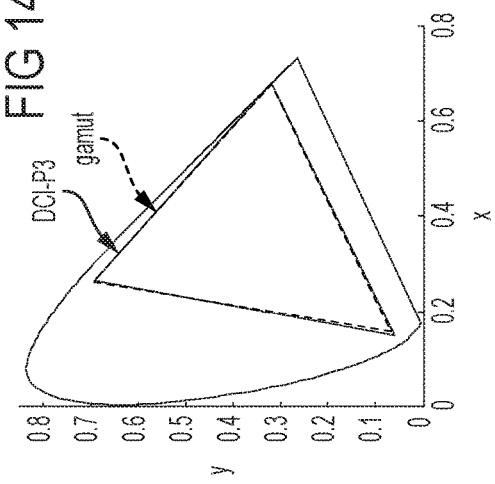
FIG. 14B shows the (xy) color diagram, and shows the resulting color gamut (dashed lines) as well as the DCI-P3 standard gamut (solid line).
Figure 14D:
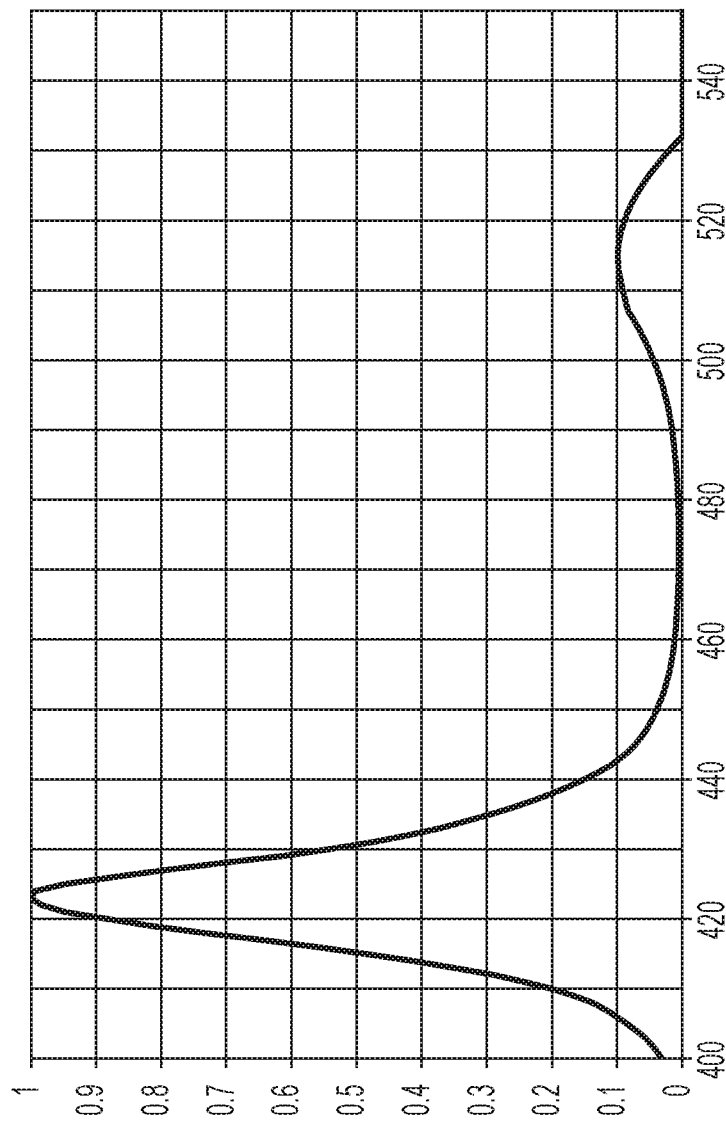
FIG. 14D shows the SPD of the short-wavelength primary for the system of FIG. 14A.

This is illustrated in FIG. 14D, which shows the SPD of the short-wavelength primary for the system of FIG. 14. In this case, referring to the SPD's total power in the range 380-780 nm: 82% of the power is in the range 400-440 nm (violet component), 7.5% is in the range 440-500 nm (blue component) and 10.6% of the power is in the range 500-550 nm (green component). The SPD is further characterized by a first maximum in the range 400-430 nm, a local minimum in the range 450-490 nm (or 440-500 nm), and a second maximum in the range 500-550 nm.

Embodiments may have a short-wavelength primary whose SPD has a violet component (range 400-440 nm) of at least 50% (or 60%, 70%, 80%, 90%) and a green component (range 500-550 nm) of at least 5% (or 3%, 8%, 10%, 12%, 15%, 20%).

As a consequence of this lack of blue light in the short-primary, some embodiments are further characterized by the fact that their white emission (the sum of the three primaries when they are fully transmitting, corresponding for instance to a D65 chromaticity) is a blue-free white spectrum, as described elsewhere in this Application. For instance, SPD1 has a blue content in the range 440-500 nm which is 4% of its total power.

In some embodiments, the short primary has a blue dominant wavelength, despite its SPD containing substantially no radiation at this wavelength. For instance, the value of the SPD at the dominant wavelength is less than 3% (or 1% or 0.5%) of its peak value.

Efficiency is an important consideration when designing a display—i.e., a high color gamut should not be obtained at the expense of efficiency. To quantify this, Applicants define the luminous efficacy of radiation of the display (LERD) as follows. Consider a display whose emitters (such as LED components) emit a spectrum SPD0. SPD0 is then injected in the display system and transmitted by the color filters and LCDs. The system, when set to a white point, emits a spectrum SPD1 which is the sum of the primaries (i.e. SPD0 filtered by each of the color filters when they are fully transmitting). Often, SPD0 and the filters are configured such that SPD1 has a target chromaticity such as D65 (targeted with suitable color matching functions, as discussed elsewhere). The user of the display perceives the lumens emitted by SPD1. Applicants define the LERD as the ratio of lumens in SPD1 divided by the optical power of SPD0. The LERD is thus expressed in lumens per optical watts. It is the equivalent of the LER (luminous equivalent of radiation) for an LED light source, but further accounts for the transmission of the filters. This distinction is important because maximizing LERD is not the same as maximizing LER. Note that, in a real-world display, one would also account for the transmission of other optical elements in the display and for the fact that each filter only transmits ⅓ of the optical power at best (because even with 100% transmission, the corresponding pixels only cover ⅓ of the display's area). These considerations would multiply the LERD discussed here by a numerical constant, but the general teachings of this invention can be easily adapted to real-world displays. Further, note that in the case of a direct-view display (without filters), LER and LERD may be equal.

Figure 15:
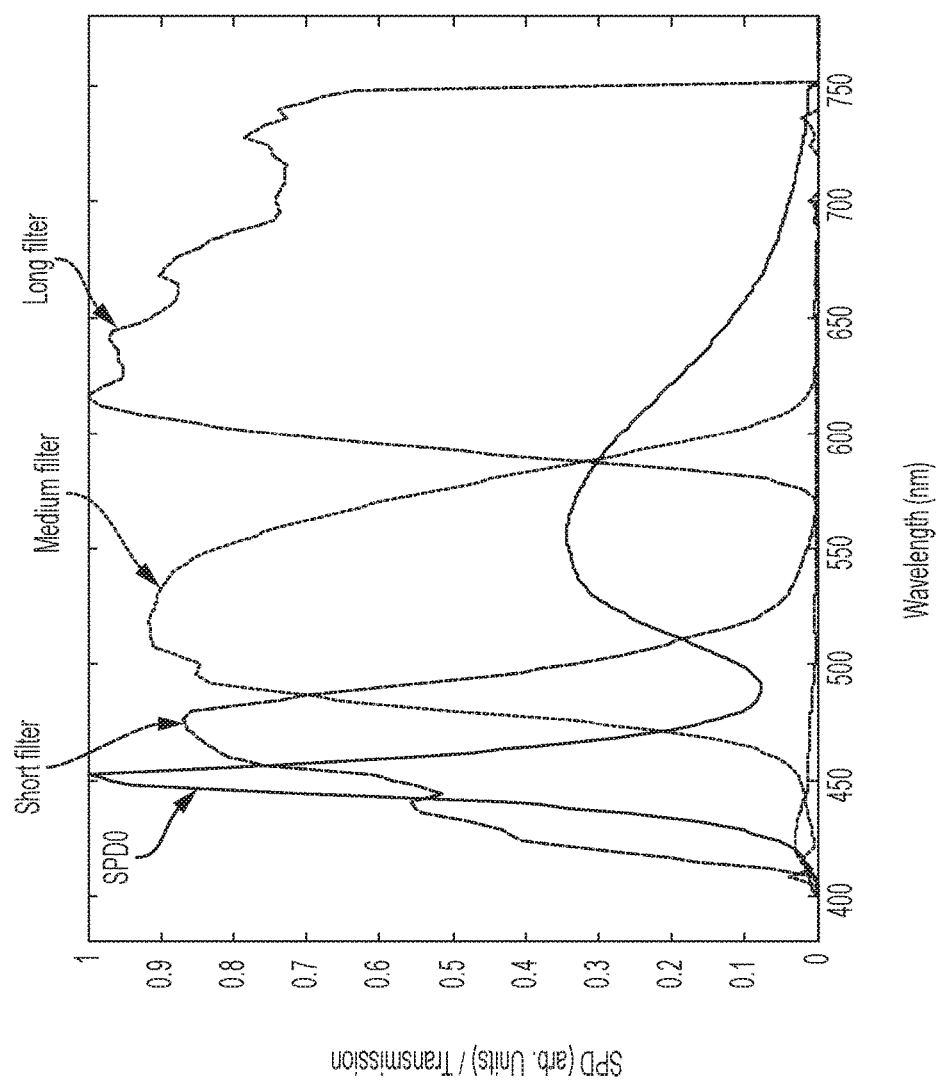
FIG. 15 shows spectral characteristics of a commercially-available LCD which complies with the sRGB color gamut and has a D65 white point.

As a comparison point, Applicants have measured a commercially-available LCD display (an Apple iPhone smartphone which complies with the sRGB color gamut and has a D65 white point). FIG. 15 shows the measured characteristics of the display: SPD0 (the emission of the side-emitting LED components inside the display) and the filter transmissions (normalized to a maximum transmission of 1 for consistency with the idealized filters discussed herein). SPD0 shows that the LED emitters comprise a blue pump LED and a garnet green-yellow phosphor. For this system, LERD=241 lm/W. This gives an order of magnitude of LERD for an efficient prior-art system having a moderate gamut and a simple phosphor set.

Figure 16:
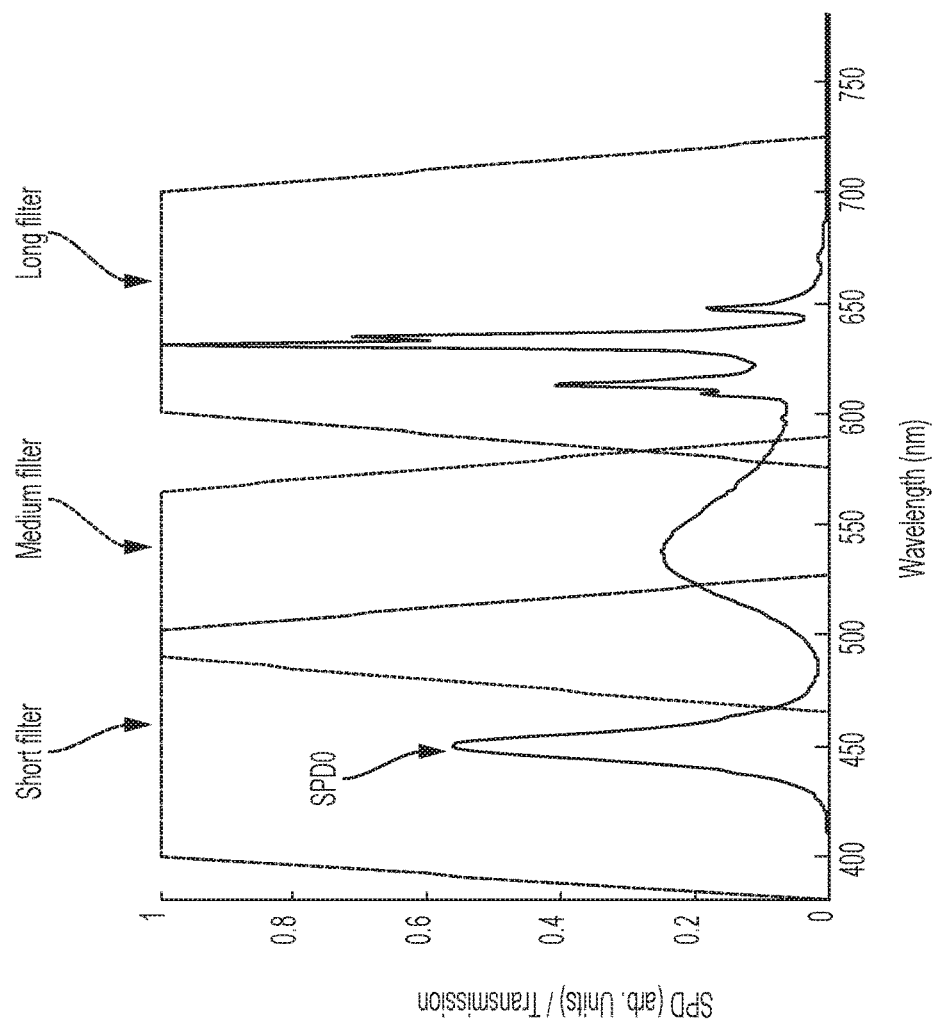
FIG. 16 shows spectral characteristics of a display with a blue-pumped LED plus the same phosphors as in FIGS. 13 and 14 (beta-SiAlON and KSF), and filters adapted to match the DCI-P3 gamut.

As another comparison point, Applicants have designed by modeling a display with a blue-pumped LED (peak at 450 nm), the same phosphors as in FIGS. 13 and 14 (beta-SiAlON and KSF), and filters adapted to match the DCI-P3 gamut. FIG. 16 shows this system, and illustrates SPD0 and the color filters. For this system, LERD=304 lm/W, and the white spectrum SPD1 has a blue content (integrated power) in the range 440-500 nm which is 27% of its total power. Further, the short primary has an SPD whose integrated power in the range 440-500 nm is 81% of its total power.

For comparison, the embodiment of FIG. 14 has an LERD=258 lm/W, and SPD1 has a blue content in the range 440-500 nm which is 4% of its total power. Therefore, this embodiment offers a similar gamut as a high-gamut blue-pump prior art system, with a moderate loss in LERD (85% of the prior art) and a much lower blue content (15% of the prior art).

The embodiment of FIG. 14 substantially matches the gamut of DCI-P3. Some embodiments achieve an even higher gamut, for instance, closer to the Rec2020 gamut standard. This can be achieved by further configuring the color filters (the filters can cut off the tails of emission of a primary to augment its purity) and a proper selection of emitters, including quantum dots.

Figure 17A:
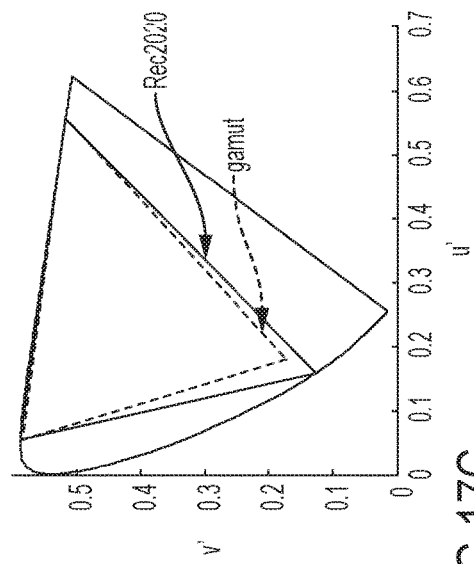
FIG. 17A shows a modeled embodiment similar to FIG. 14A with a violet pump LED, and beta-SiAlON and KSF emitters, with different filters.
Figure 17B:
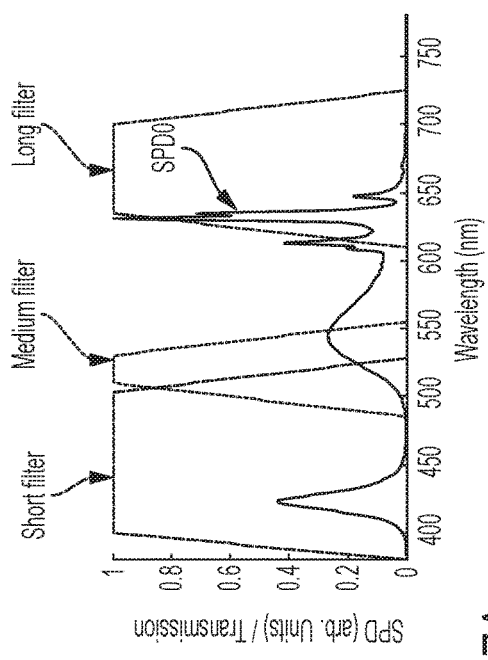
FIG. 17B shows the (xy) color diagram, and shows the resulting color gamut (dashed lines) as well as the Rec2020 standard gamut (solid line).
Figure 17C:
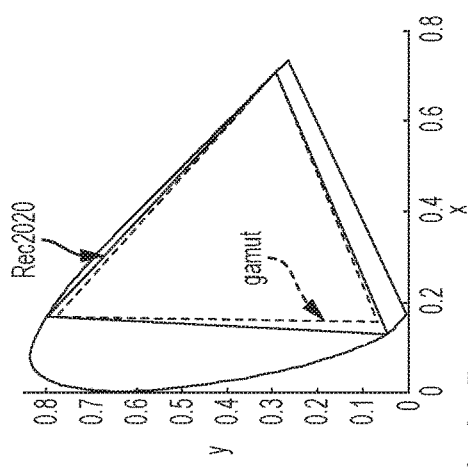
FIG. 17C shows the (u'v') color diagram, and shows the resulting color gamut (dashed lines) as well as the Rec2020 standard gamut (solid line).

FIG. 17 shows a modeled embodiment similar to FIG. 14, with a violet pump LED, and beta-SiAlON and KSF emitters. The display's white point is D65. The green phosphor peak wavelength and filters are configured to come close to the Rec2020 gamut, especially for the green and red primaries. The embodiment's gamut is 92% of Rec2020 in (xy) space and 89% of Rec2020 in (u'v') space. The LERD is 140 lm/W. This moderate value is caused by the need to use a narrow green filter, so that some emission from the green phosphor is lost.

To further improve upon this, some embodiments use even narrower green emitters, including quantum dots, or direct green LEDs (based on III-Nitride, or AlInGaAsP, or other semiconductor compounds).

Figure 18A:
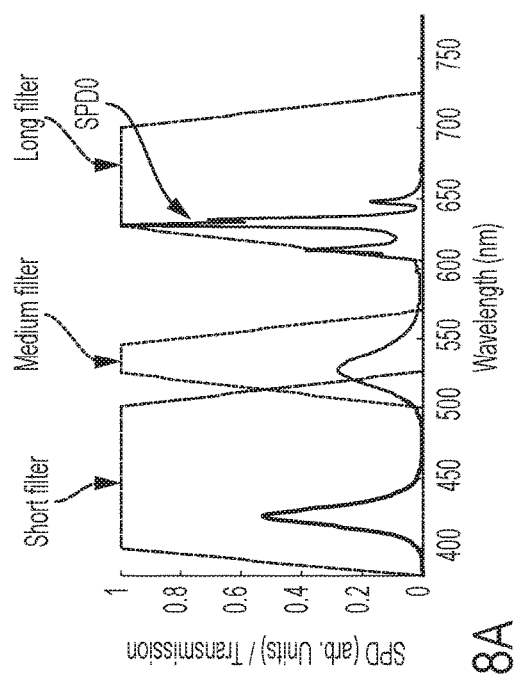
FIG. 18A shows a modeled embodiment that uses an even narrower green emitter than that of FIG. 17A, including quantum dots, or direct green LEDs (based on III-Nitride, or AlInGaAsP, or other semiconductor compounds).
Figure 18C:
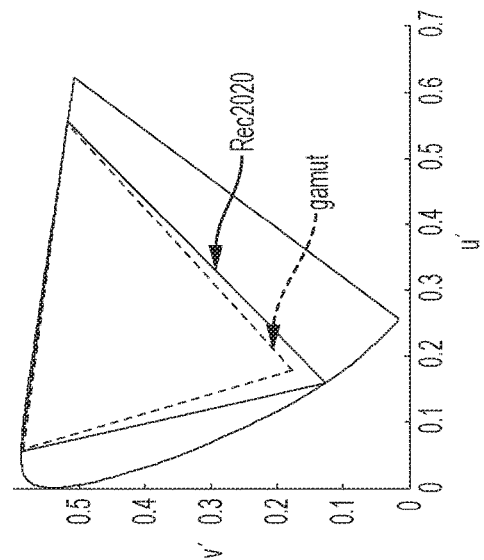
FIG. 18C shows the (u'v') color diagram, and shows the resulting color gamut (dashed lines) as well as the Rec2020 standard gamut (solid line).
Figure 18B:
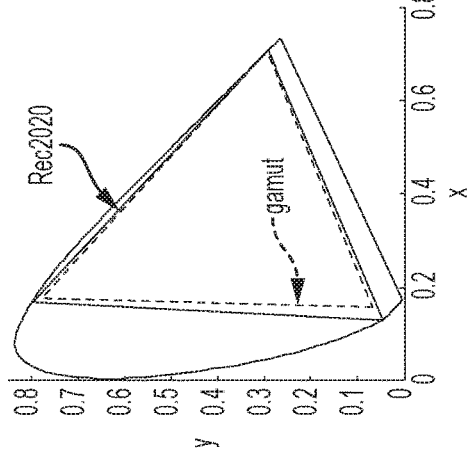
FIG. 18B shows the (xy) color diagram, and shows the resulting color gamut (dashed lines) as well as the Rec2020 standard gamut (solid line).

FIG. 18 shows such an embodiment. This embodiment uses green quantum dots (FWHM 30 nm, peak 527 nm) and appropriate filters to closely match Rec2020's green and red primaries with good performance. The LERD is 208 lm/W. This higher efficiency is reached thanks to the narrow green emitter. The gamut area relative to Rec2020 is 91% in (xy) and 86% in (u'v').

A variety of narrow red emitters can also be used. Besides KSF, red quantum dots or direct red emitters (based on III-Nitride of AlInGaAsP or other semiconductor compounds) may be suitable.

Figure 19A:
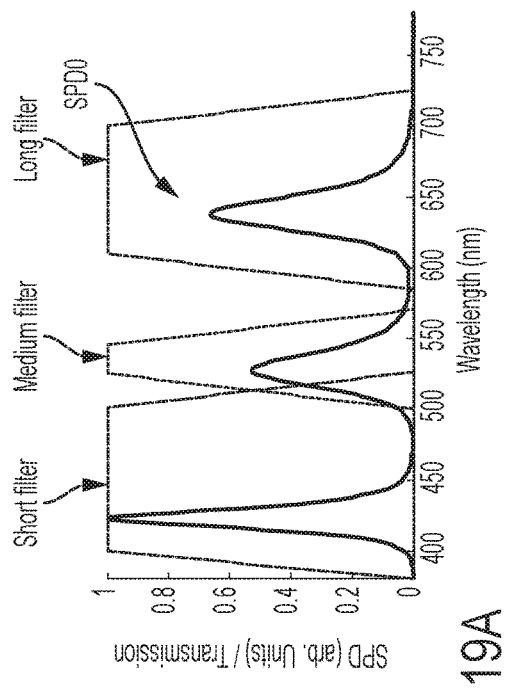
FIG. 19A shows a modeled embodiment that uses green and red quantum dots (FWHM 30 nm, peak 527 nm and 638 nm) and appropriate filters to closely match Rec2020's green and red primaries with good performance.
Figure 19C:
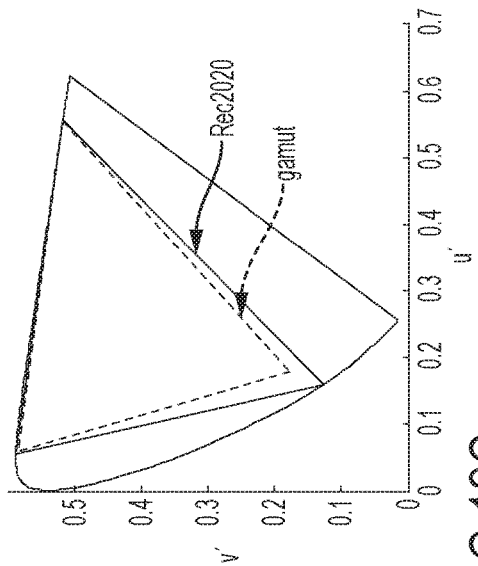
FIG. 19C shows the (u'v') color diagram, and shows the resulting color gamut (dashed lines) as well as the Rec2020 standard gamut (solid line).
Figure 19B:
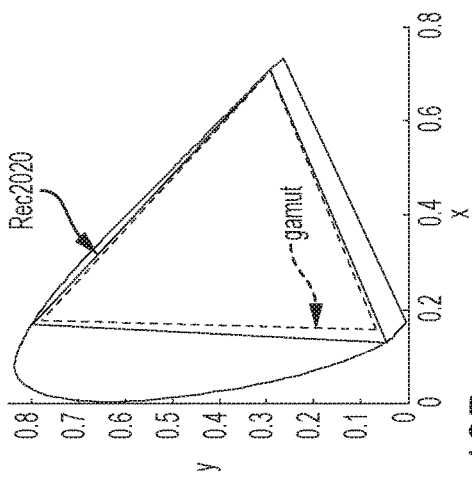
FIG. 19B shows the (xy) color diagram, and shows the resulting color gamut (dashed lines) as well as the Rec2020 standard gamut (solid line).

FIG. 19 shows such an embodiment. This embodiment uses green and red quantum dots (FWHM 30 nm, peak 527 nm and 638 nm) and appropriate filters to closely match Rec2020's green and red primaries with good performance. The LERD is 204 lm/W. This higher efficiency is reached thanks to the narrow green emitter. The gamut area relative to Rec2020 is 91% in (xy) and 87% in (u'v').

Some embodiments have a gamut area which is at least 95% (or at least 80%, 85%, 90%, or 100%) of that of DCI-P3, calculated either in (xy) or (u'v') color space. Some embodiments have a gamut area which is at least 95% (or 80%, 85%, 90%, 100%) of that of Rec2020, calculated either in (xy) or (u'v') color space.

Some embodiments have a primary whose chromaticity substantially matches that of a primary of a standard gamut, including sRGB or DCI-P3 or Rec2020. As used in this context, substantially means that the two chromaticities (i.e. the primary of the embodiment and the primary of the standard gamut) are within an (xy) distance less than 0.03 from each other, calculated with 1964 10° CMFs. In other embodiments, the short primary of an embodiment is within a distance Dxy or Du'v' less than 0.1 (or less than 0.05, less than 0.02, less than 0.01, less than 0.005, less than 0.001) of the blue primary of DCI-P3 or Rec2020. This distance may be calculated with suitable color matching functions, as discussed earlier. Likewise, the medium (long) primary of an embodiment may be within a predetermined distance of the green (red) primary of a standard gamut like DCI-P3 of Rec2020.

Although the above discussion considers simplified color filters with unity transmission, similar results can be obtained with more realistic color filters. In particular, in real displays, the short-wavelength filter often has the lowest transmission and the long-wavelength filter often has the highest transmission.

Figure 28A:
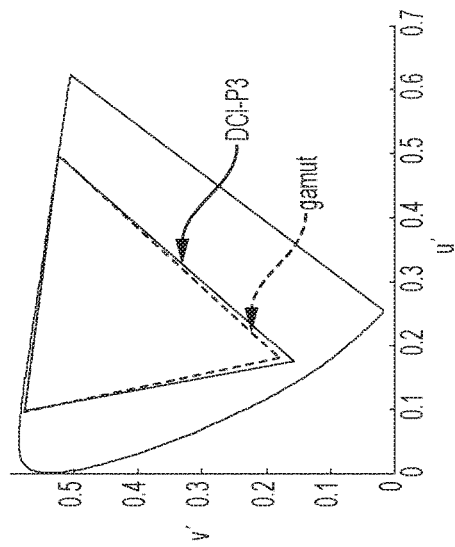
FIG. 28A shows SPD0 emitted by the LED, together with three color filters.
Figure 28B:
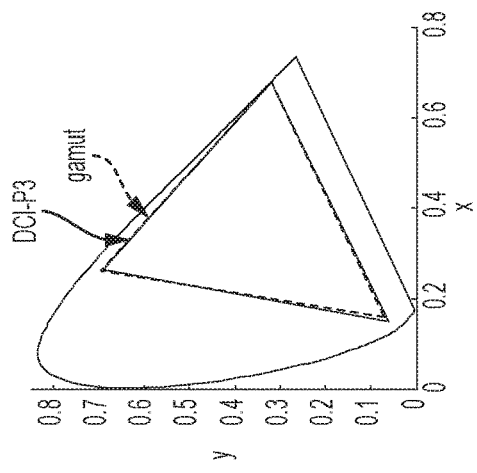
FIG. 28B shows the (xy) color diagram, and the resulting color gamut (dashed triangle) for the configuration of 28a, and the DCIP3 reference gamut (full triangle) is also shown for comparison.
Figure 28C:
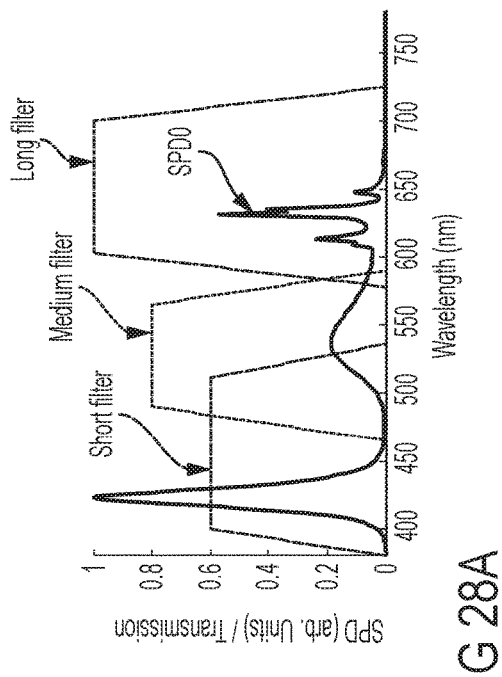
FIG. 28C is the same as FIG. 28B but plotted in the (u'v') color diagram.

FIG. 28 shows an embodiment corresponding to such a situation. FIG. 28 is similar to FIG. 14 (same phosphors, chromaticity, gamut etc. . . . ) but the short-wavelength filter has a peak transmission of 60%, the medium-wavelength filter has a peak transmission of 80%, and the long-wavelength filter has a peak transmission of 100%. The emitter's spectrum SPD0 is simply adapted to these transmissions (more violet and green than in FIG. 14) to compensate and result in the desired color characteristics.

System Implementation/Software

Implementations of the blue-free light emitters described above in display systems are discussed below, both in terms of hardware and software. The blue-free mode of operation may be desirable at some times of the day but not at other times. For instance, during daytime, a screen emitting blue light may be acceptable, whereas at night a blue-free emission may be preferred. This choice is based on various considerations, including efficiency: a blue-containing SPD may have a higher LERD or a better gamut and may be preferable at times when blue radiation is acceptable.

In some embodiments, the light-emitting system is able to emit a blue-containing SPD (SPD1) and a blue-free SPD (SPD2). The two SPDs may have different CCTs, or substantially the same CCT. In some embodiments, the system comprises a display screen with the ability to tune between SPD1 and SPD2.

The tuning may be controlled by a variety of inputs. It may be controlled by the user. For instance, the user can activate a mode (such as a night mode), which transitions to SPD2 (over a predetermined time, such as one or a few seconds or minutes or hours).

Tuning may also be controlled by environmental measurements. For instance when the light is dim enough (which can be measured by a light detector, such as a photodiode embedded in a phone), the display reduces the brightness and the amount of blue light concurrently. Or the system has a camera (such as a CCD camera on a phone/tablet) which can infer the color temperature of ambient light and adapt the blue level (for instance, low CCT below 4000K or 3000K may trigger blue-free emission). The display's CCT may also be determined based on an ambient light CCT.

Tuning may further be controlled by measurements of user behavior or actions. This includes biometric measurements (body temperature, heart rate, pupil dilation . . . ) or measures of user activity, movement and presence at a location, actions on a device (such as a smartphone), specific words and gestures. These measurements may be provided by appropriate devices. Based on this information, a processor may determine that a user is getting tired, or on the contrary that a user is not showing signs of fatigue at a time where he should (based for instance on a desired sleep schedule). The light emitted by the display can then be tuned accordingly, with an increase or decrease in blue light and intensity.

Such responses may be employed to match the spectrum to the condition of the user (for instance, lower the circadian cycle when the user becomes sleepy or prepares for sleep) or to modify the condition of the user (e.g., detect sleepiness and increase circadian stimulation to lessen it). In some cases, the response can be determined by the user's behavior in combination with other measurable conditions or cues such as time of the day, weather and/or changing weather, amount of outdoor light, etc. In some cases, the cues can be obtained from another "smart" system (another appliance, a smartphone, or other electronic device) which monitors the user's behavior—the cues can then be communicated over a network (wired or wireless) between said smart system and the lighting system, such as a network enabled by a smart-home hub. In some cases the cues relate to the user's past behavior, such as the time the user woke up or his past sleep pattern, which has been recorded by a system such as the user's smart phone.

Tuning may also be controlled by simple software input: the shift may happen at a certain time (which may be related to the schedule of daylight). For instance, the screen transitions to SPD1 at dawn and to SPD2 at dusk. The transition may be continuous and spread over a period of time (such as a few minutes to an hour), so that it is not evident to the user. The shift may also be based on user preferences. In some cases, the shift is based on user habits, including the user's desired/habitual wake-up time and bed time.

In one embodiment, the user specifies a desired wake-up time Tw. If the lighting system emits light in a predetermined time window around Tw (for instance, starting one hour before Tw), the system emits SPD1. In another embodiment, Tw is set by the user setting an alarm clock. For instance if an alarm clock is set for 7 am, Tw is set to 7 am. In some cases, the system keeps emitting SDP1 throughout the day, until a condition to emit SPD2 is met.

In one embodiment, the user specifies a desired sleep time Ts. If the lighting system emits light in a predetermined time window around Ts (for instance starting two hours before Ts), the system emits SPD2. In some cases, the system keeps emitting SDP2 throughout the night, until a condition to emit SPD1 is met.

In one embodiment, the system emits SPD1 in a time region starting one hour (or two hours or 30 or 15 minutes) before the user's wake-up time and ending two hours (or 3 or 1 hours) before the user's sleep time, and emits SPD2 otherwise.

In some embodiments, machine learning (supervised or unsupervised) is used to determine the transition times and other display emission properties. For instance, in a teaching phase, the user at first inputs information, including by indicating when he wants the blue-free mode or by temporarily de-activating ("snoozing") the blue-free mode or by setting the luminosity of the display. This input is used by a machine learning algorithm to refine the timing of the spectrum transmission and the display luminosity. For instance, the system learns to associate these settings with specific cues and the tuning is then performed automatically in response to the cues, (e.g., rather than being triggered manually). Learning can be achieved by a variety of machine-learning techniques known to those skilled in the art, such as via a neural network and/or using Bayesian inference.

A specific example of the previous scenario is as follows: The user follows a routine (e.g., a series of actions performed repeatedly with some periodicity) a few hours before going to bed. Such a routine might include leaving the dining table, brushing his teeth, watching TV etc. Data of this routine are collected by various appliances (TV, toothbrush, motion sensors) and communicated with the lighting system through a wireless protocol. In the teaching phase, the user also tunes the spectrum of the lighting system to reduce circadian stimulation—for example, the user the lighting system to a non-stimulating setting a few hours before going to bed. Once the system has associated these settings with one or more cues of the routine, and with an approximate hour, the tuning occurs automatically to help reduce the circadian response before the user goes to bed. Conversely, tuning can also occur in the morning to stimulate the circadian system.

While the discussion above mentions two SPDs, more general embodiments with more SPDs, and continuous transitions of SPD, can be envisioned.

In some embodiments, information about selecting the emitted light is exchanged/shared between several systems. This can be useful so that several light-emitting systems agree on a light spectrum schedule (for instance, the lights in a home, the smartphone and the TV all switch to blue-free mode in the evening). A lighting system may obtain information on the SPD to emit from another system (this may happen through a wireless communication). The user may specify preferences (including wake-up and sleep times) on a device like his phone, computer, or smart watch. This device then shares information with other devices including light-emitting devices. For instance, a TV or a light bulb may receive information from a phone and may transition to a blue-free SPD based on this information. In case several users are present in a space (such as a family sharing a home) the shared light-emitting elements may be set to a common lighting policy based on inputs from several users. For instance, if two people in the same home have differing sleep times Ts1 and Ts2, the shared lighting systems (shared TV, lights in the living room . . . ) may go to blue-free mode at a time determined by the earliest of Ts1 and Ts2 (so that the "first sleeper" is not affected by blue light). If two people share a room and one of them indicates on their phone that they want to trigger a sleep mode, the shared lighting systems all go to a blue-free mode. On the other hand, non-shared light-emitting systems (personal phone, lights in a private room) may have schedules based on each individual. The determination of such a policy may be made in the cloud, or locally (in-home) by a computer system.

In some cases, the user indicates that he wants to change his sleep pattern. For instance, he wants to phase-shift his circadian cycle to an earlier time, to prepare for a trip. This can be achieved by providing blue light early in the morning. The lighting systems are then set to emit blue light before the usual wake-up time of the user.

While the previous examples assumed a domestic setting, such embodiments with automatic or 'smart' tuning can be used in other contexts such as in a professional context. For example, in an office setting, the lighting system may adapt to monitor used activity and increase blue content accordingly; or the blue content may be increased in the morning, reduced near the end of the work day, or adapted to complement the outside lighting conditions (which could vary with weather and season). System tuning may follow a simple timing scheme or also take into account the workers' behavior. Embodiments may also be used in other contexts where sleep pattern is affected, including night-shift worker facilities, long-range travel (such as airplane flights), care facilities for the elderly.

In a professional context, a lighting schedule may be applied throughout a given office/location, or it may be further customized for users. For instance, the amount of blue light emitted by computer screens may be tuned individually for each employee, in accordance with their personal schedule or with their work schedule (including night/day shift).

Display Architecture

Various display architectures can fulfill the functions of the invention. This includes direct-lit displays, projection displays, and waveguide-based displays (including edge-lit and back-lit).

Direct-lit displays have individual emitters at the pixel level. Typically each pixel comprises a plurality of colored emitters. For instance each pixel may comprise a plurality of LEDs or OLEDs. In typical embodiments, one of the emitters is a violet emitter, having a wavelength below 430 nm. These embodiments differ from the prior art, which doesn't use violet emitters but instead uses blue emitters with a peak wavelength around 440-470 nm. Efficient LED emitters have been developed by Applicants and can be used advantageously. Regarding OLED emitters, violet luminescence may come either from "direct" OLED emission having a violet-emitting organic layer, or from a luminescent species embedded in the organic matrix such as violet-emitting quantum dots.

Efficient violet emitters may be characterized by a wall-plug efficiency of at least 50% (or 60%, 70%, 80%) under the operating conditions. The operating base temperature is typically in the range 25 C-100 C. The operating current density may be high for a standard display having a few emitters (i.e. in the range 3-300A·cm-2 or 10-100A·cm-2, or at 35A·cm-2 or 50 A·cm-2 or 100 A·cm-2); or it may be very low for a direct-view display with small emitters (i.e. in a range 1-10 uA·cm-2 or 10-100 uA·cm-2 or 100-1000 uA·cm-2).

Figure 20B:
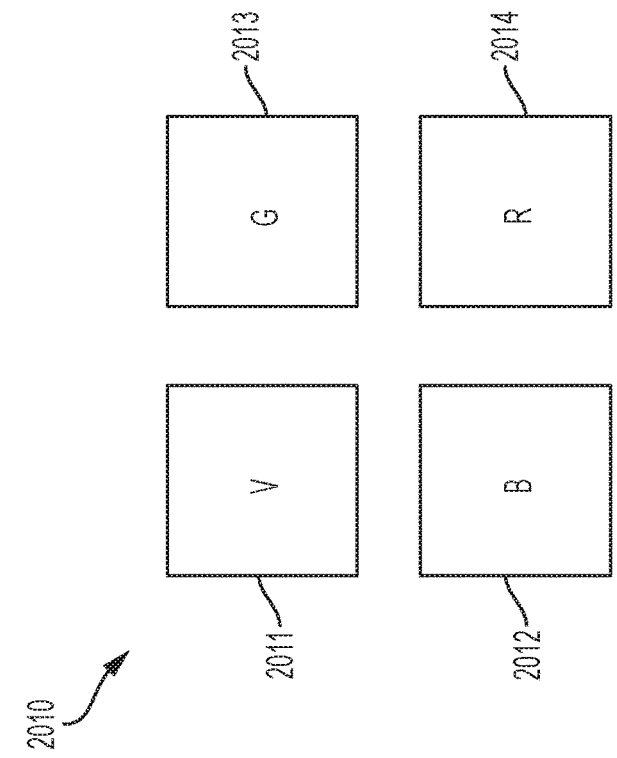
FIG. 20B shows a pixel with violet, blue, green and red emitters.
Figure 20A:
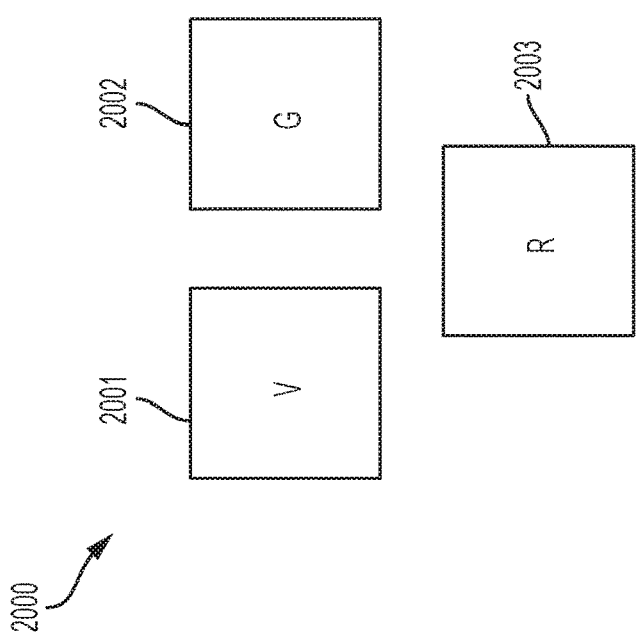
FIG. 20A shows a pixel with violet, green and red emitters.

Direct-lit displays typically also comprise a red and a green emitter in each pixel. FIG. 20a shows a pixel 2000 with violet, green and red emitters 2001, 2002, 2003. The red and green emitters may be direct emitters or wavelength-converted.

Further, embodiments may comprise a blue (or cyan) emitter in addition to the violet emitter, thus forming a four-emitter system (violet-blue-green-red). FIG. 20b shows a pixel 2010 with violet, blue, green and red emitters 2011, 2012, 2013, 2014. In blue-free mode the violet emitter emits and the blue emitter doesn't emit. The blue emitter may be used in "day mode" when the blue-free mode is not needed. In some cases, in day mode, the blue emitter emits and the violet emitter doesn't emit.

The emitters in each pixel may be small (for instance, with a characteristic lateral size of less than 1 um, 5 um, 10 um, 50 u or 100 um). Appropriate techniques may be used for handling (including pick-and-place) of such LEDs, including electrostatic, electro-magnetic, stamping, printing, etc.

The emitters and display may be substantially transparent. Partially-transparent OLED screens are known; embodiments improve upon this by enabling high transparency and transparent displays with inorganic LEDs (which may be preferable for high brightness). This may be useful for applications such as augmented reality. In some cases, the display has a clear optical member to which the LEDs are mechanically coupled (they may be embedded in the member or attached on it). The member may be rigid or flexible. The LEDs themselves are substantially transparent, including transparent substrate and epitaxial layers. In particular, III-Nitride epitaxial layers may be substantially transparent through the visible range (aside from the light-emitting layers, which may be thin enough to cause small absorption). Materials for transparent substrates include GaN (and other III-Nitride substrates), sapphire, gallium oxide, SiC. The LED contacts may comprise transparent contacts including TCOs (ITO, ZnO, GaOx, etc. . . . ). It may comprise small patches of metallic contacts, whose area is limited.

Transparency may be characterized by an optical transmission of at least 80% (or 70%, 90%, 95%) across the area of the LED, averaged in the range 450-650 nm. Transparency may also require that opaque elements (such as metallic contacts) occupy a limited area of the LED's footprint, such as less than 10% (or 20%, 5%, 2%).

Figure 20C:
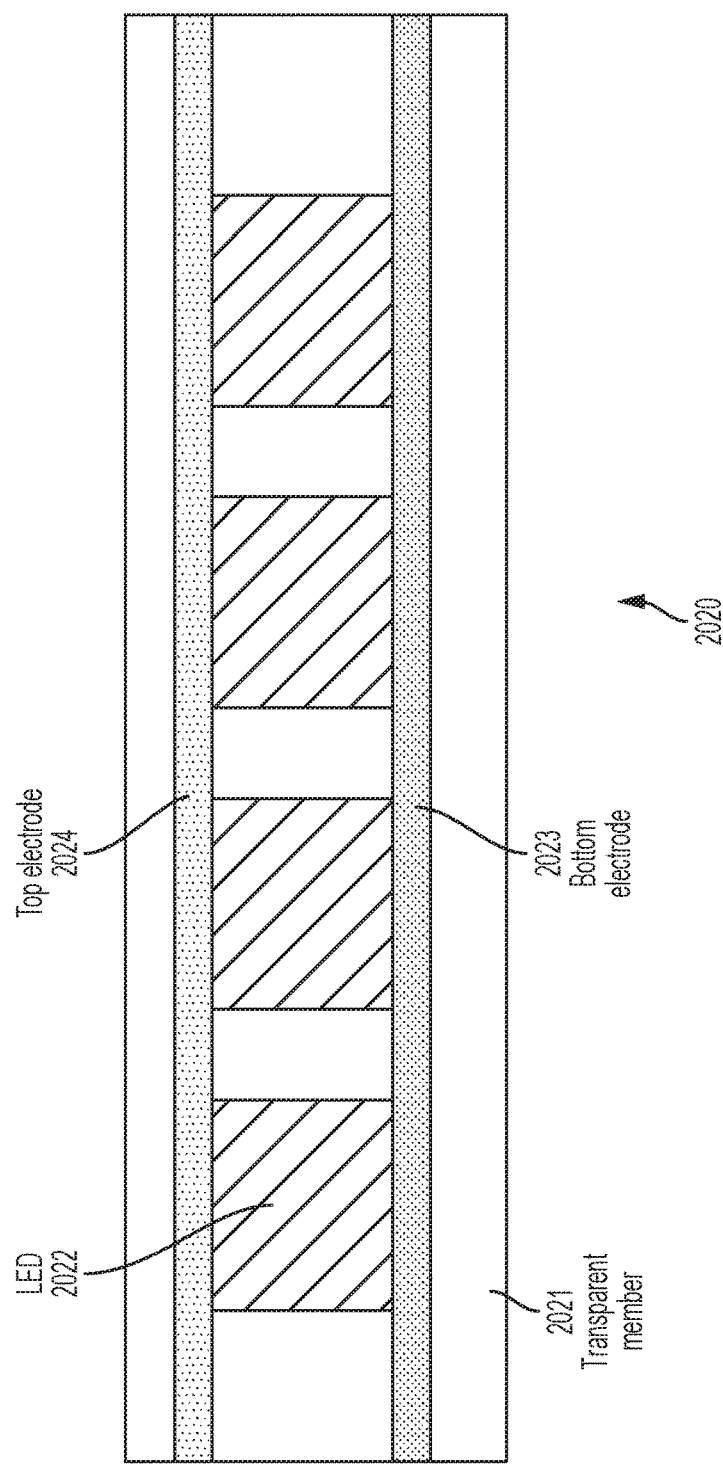
FIG. 20C shows a simplified cross-section of a transparent display.

FIG. 20C shows a simplified cross-section of a transparent display 2020. The system is embedded in a transparent member 2021. Here the LEDs 2022 are vertical devices: the n- and p-contacts (not shown) are on either sides of the LED (such transparent LEDs may be achieved by removing an absorbing/insulating substrate, or by using a transparent conductive substrate such as GaN or GaOx). A transparent bottom electrode 2023 contacts one type of contact (say n), and a transparent top electrode 2024 contacts the other type of contact (say p). For simplicity only one type of LED is shown; however the LED generally have various emission wavelengths and may comprise violet LEDs. LEDs of different colors are contacted to different electrodes. For simplicity, in FIG. 20C the electrodes are shown along one dimension; however, as is known in the art, the two electrodes may have a grid layout (i.e. one electrode is along rows of pixels and the other along columns of pixels). The spaces in-between the LEDs may be left as air; or they may preferentially be filled with a high-index medium to reduce reflections and increase transparency. In some embodiments, the space in-between LEDs is substantially filled with a transparent medium of optical index higher than 1.4 or 1.8, or whose index is within less than 1 from the optical index of the LEDs. For instance the LEDs are GaN-based with an index of about 2.4 and the medium is a spin-on-glass with an index of about 1.8.

Figure 20D:
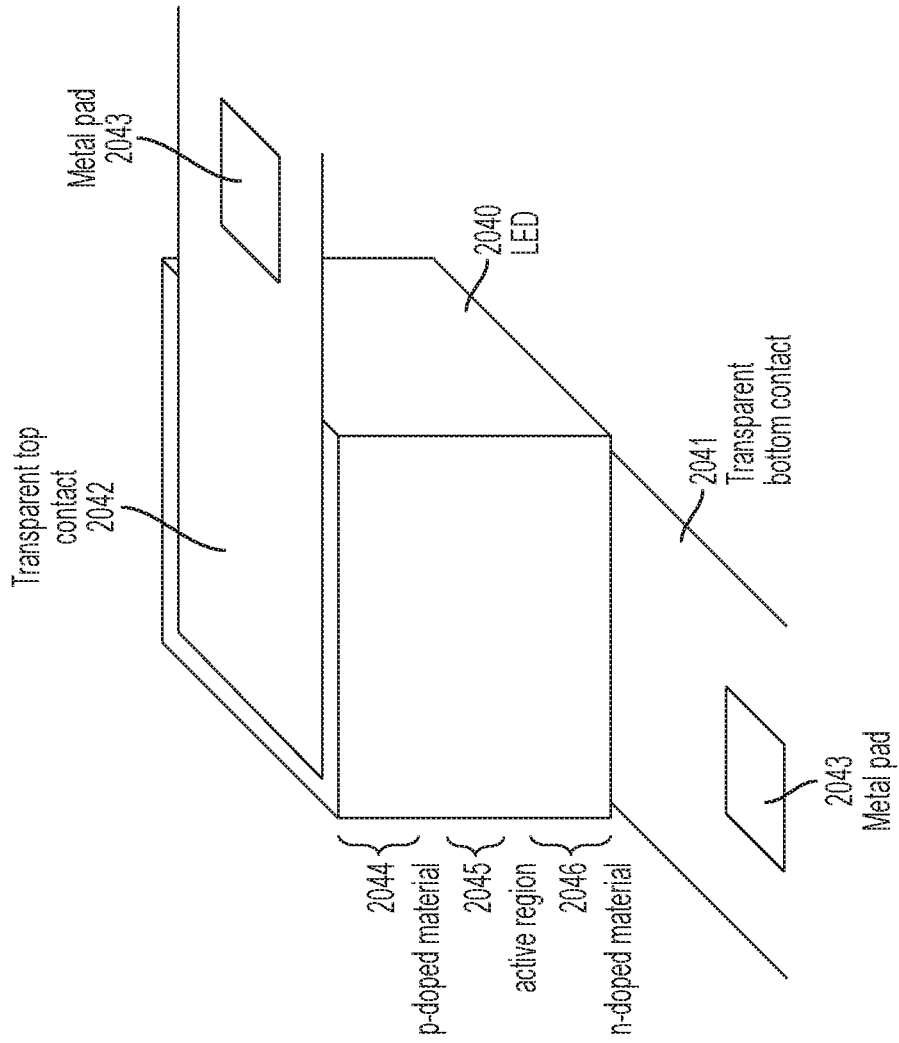
FIG. 20D shows a perspective view of an LED showing contacts of one type along one direction and another type along the other direction.

FIG. 20D shows a perspective view of an LED 2040 showing contacting of one type along one direction and another type along the other direction. Here the n-contact 2041 is at the bottom and the p-contact 2042 at the top. The transparent contacts are further contacted to other components (such as TFTs and capacitors for pixel addressing). Metal pads 2043 may be present to help this contacting. Current spreading may be achieved by transparent contacts on the LED chip, or by doped layers 2044 in the LED chip on either side of the active region 2045.

Figure 20E:
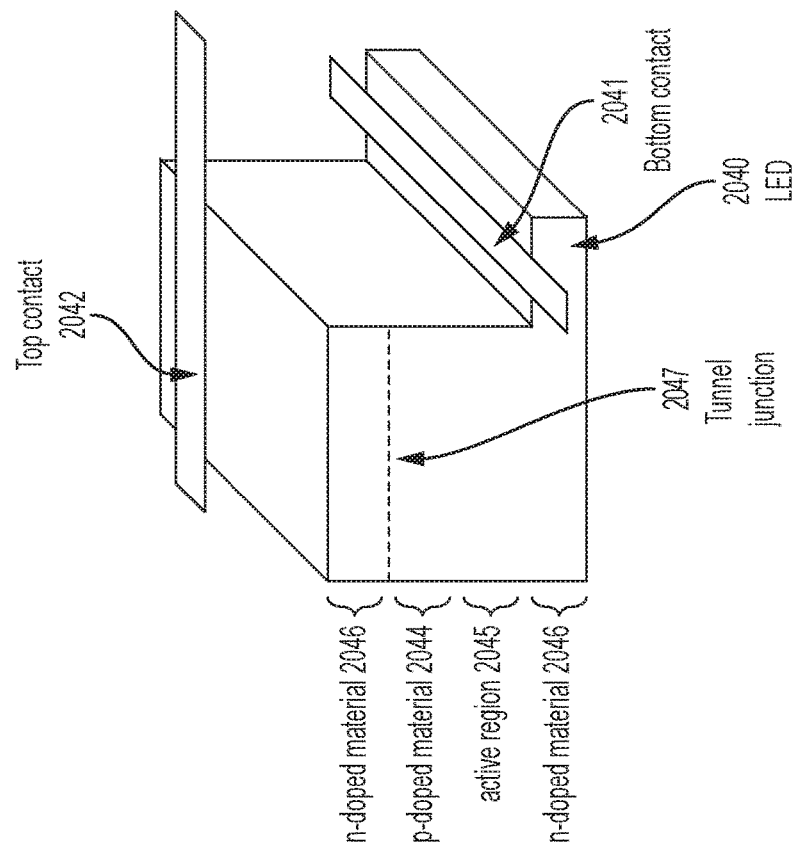
FIG. 20E shows a perspective view of an LED where a tunnel junction is formed on the p-doped material, such that both LED contact layers are n-doped.

In the case of GaN, spreading in p-doped material is usually poor; this may be improved by using a tunnel junction contact to an n-doped material. FIG. 20E illustrates this. A tunnel junction 2047 is formed on the p-doped material 2044, such that both LED contact layers are n-doped 2046. Here material is etched so that the bottom contact is made from the top of the LED in a lateral configuration (however a vertical configuration can also use a tunnel junction scheme). Contacts are formed on both n-doped layers. These may be metallic or transparent contacts. Since current spreading is good in n-doped material, small contacts may be suitable. Good n-spreading may be enabled by a bulk doped substrate, or by highly doped material (with carrier density of at least 1E19 cm-3 or 1E20 cm-3).

FIG. 20E shows how a grid contacting scheme may be achieved in a lateral die configuration, with the top contact running along one dimension of the LED and the bottom contact running over the other direction. A transparent material may be flown around the LED for mechanical support to separate the top and bottom contacts. The lateral scheme of FIG. 20E may also be used without a tunnel junction, with the top contact substantially making contact to all the p-doped material and substantial current spreading only on the n-side of the LED. A flip-chip die configuration may also be used.

Selective addressing of pixels may be achieved by transistors (including TFTs) at each pixel. The size of these TFTs may be selected to minimize their light absorption. Alternatively, the TFTs may be substantially transparent. They may be based on GaN and III-Nitride materials, or other transparent semiconductors (either epitaxial or non-epitaxial), or organic materials. Charge at each pixel may be maintained by a capacitor. The size of these capacitors may be selected to minimize their light absorption. Alternatively, the capacitors may be substantially transparent. Capacitors with optical transmission above 90% have been demonstrated. TFTs and capacitors may be formed by a variety of techniques, including epitaxy, sputtering, thin-film deposition, e-beam deposition, atomic layer deposition, pulsed layer deposition etc.

The LED may be subjected to other processing. For example, passivation layers may be formed on the sidewalls of the LED to avoid electrical leakage. Such passivation layers may be deposited during the wafer processing of the LEDs (for instance, they may be deposited on the sidewalls after the LEDs are singulated, using a process such as chemical vapor deposition, pulsed laser deposition, atomic layer deposition, spraying, spray-coating). Anti-reflective layers may be formed on surfaces of the display. Other geometries are possible, including geometries where the two electrodes are on the same side of the LEDs and are isolated from each other by insulating layers (such as dielectric layers). In one embodiment the LEDs are grown on bulk III-Nitride substrates. In another embodiment they are grown or sputtered on a transparent material such as a glass or sapphire or gallium oxide.

In some embodiments, the display is substantially transparent and is characterized by a single-pass transmission through the display of at least 50% (or 10%, 70%, 80%, 90%, 95%) at a wavelength in the range 400-700 nm, or averaged over the range 450-650 nm. This reflectivity may be the average taken over a large area of the display which averages several pixels (such as at least 1 mm$^2$ or 10 mm$^2$ or 1 cm$^2$). It may be taken in a direction normal to the display's plane (or local plane). It may be taken over an area which is at least 10% (or 1%, 5%, 50%) of the display's area. In some embodiments, the single-pass transmission through each component of the display is at least 50% (or 10%, 70%, 80%, 90%, 95%) at a wavelength in the range 400-700 nm, or averaged over the range 450-700 nm. In one embodiment, optical transmission through a direction locally normal to the display's surface, averaged over an area which is at least 5% of the display's surface, is at least 80% averaged over the wavelength range 450-650 nm. In some embodiments, the transparent display comprises at least three primaries (for instance green, red and violet/blue) and each primary LED comprises a III-Nitride material.

In some embodiments, redundant emitters are present in each pixel. For instance each pixel has two LEDs of each color (i.e. two violet, two green etc). This may be useful for reliability: if one emitter fails or degrades, the other emitter can compensate to maintain a more even light output for the pixel. The redundancy may also be used to improve color consistency and die usage yield by averaging wavelengths. Consider a typical LED production process where the LED-to-LED peak wavelength standard deviation is more than 5 nm (and sometimes more than 10 nm, 20 nm) due to on-wafer and wafer-to-wafer variation. The wavelength in the display's pixels may need to be more consistent; for instance all green emitters may need to be within +/−1 nm (or 0.5 nm, 2 nm, 5 nm) of a selected green wavelength, so that color looks uniform across the display. In a one-emitter-per-pixel scheme, a large fraction of the produced LEDs may thus need to be discarded to meet such color consistency. In a two-emitter-per-pixel scheme, the peak wavelengths of both LEDs may be combined such that the average wavelength is close to the desired target. For instance, if the target peak wavelength is lambda0, each pixel may combine an emitter with a peak wavelength of about lambda0+1 nm and an emitter with a peak wavelength of about lambda0-1 nm (other binning steps can be used, for instance +/2 nm, +/−3 nm, +/−5 nm, +/−10 nm) such that the combination of the two spectra has a peak wavelength which is substantially lambda0.

Figure 20F:
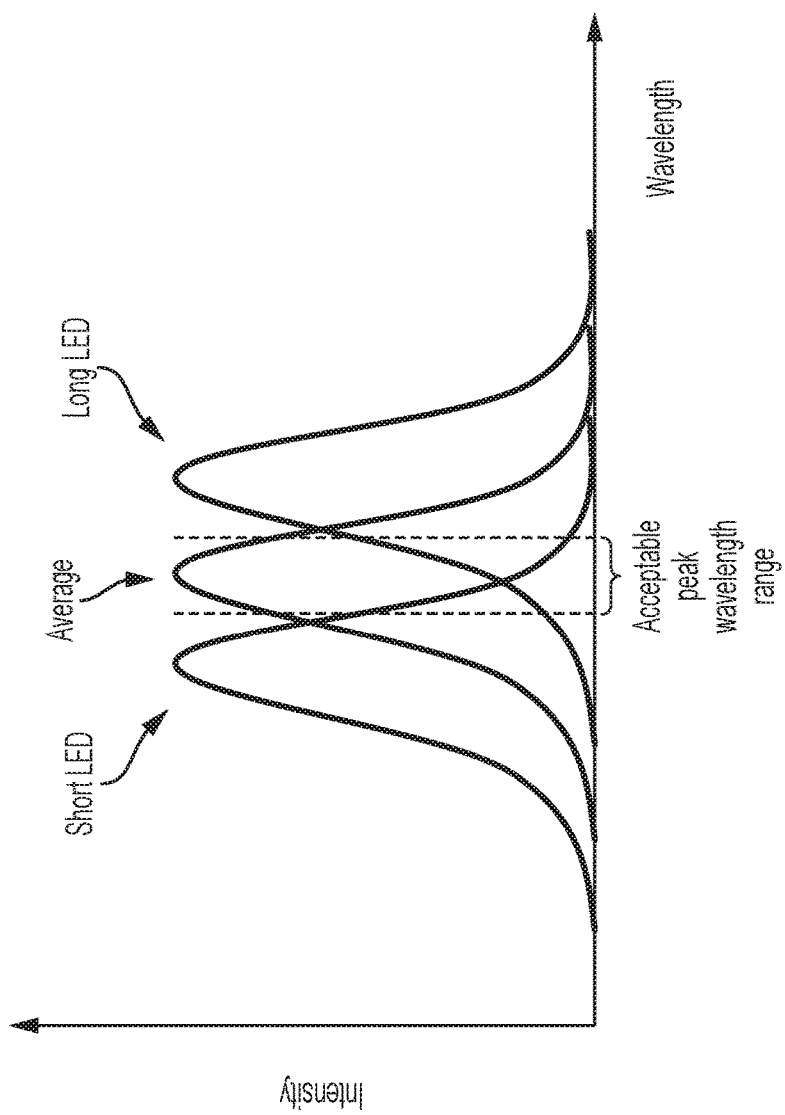
FIG. 20F shows the wavelength averaging scheme.

FIG. 20F illustrates the wavelength averaging scheme. It shows the spectra of a short LED and a long LED (for instance, having a peak wavelength which is about +/−5 nm from the target peak wavelength). The average of the two LEDs has a peak wavelength with is close to the target, and is inside a predetermined acceptable wavelength range: for instance within +/−1 nm (or 0.5 um, 2 nm, 3 nm) from the target peak wavelength).

In a one-emitter-per-pixel scheme, a similar approach may still be used to improve LED die utilization despite stringent requirements on color uniformity: LEDs in adjacent pixels may have "compensating" peak wavelengths. For instance, one pixel has a green LED with peak wavelength lambda0+2 nm, and a neighboring pixel has a green LED with peak wavelength lambda0-2 nm. If the screen resolution is sufficiently small, the perceived green may be averaged over the neighboring pixels, leading to better perceived color uniformity. This scheme can be used for each primary color of the pixel.

Figure 20G:
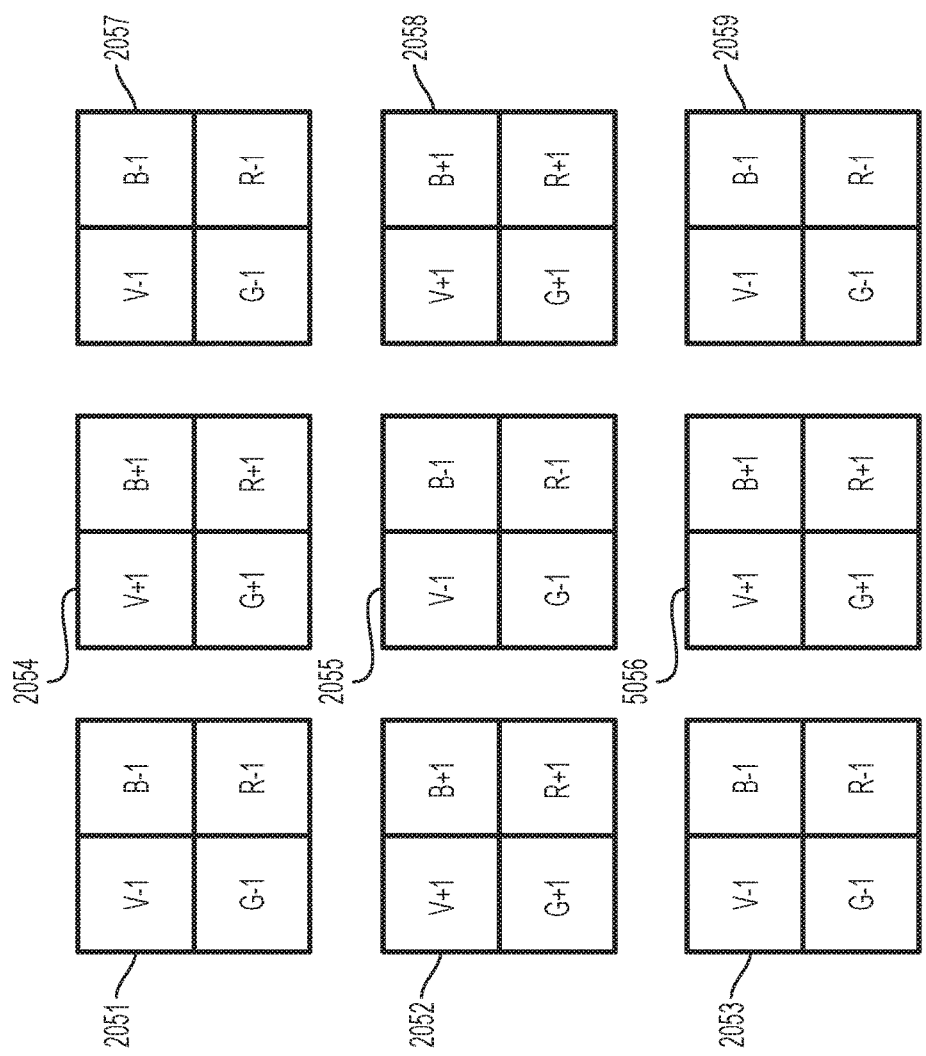
FIG. 20G shows corresponding pixel layouts for the scheme of FIG. 20f.
Figure 20H:
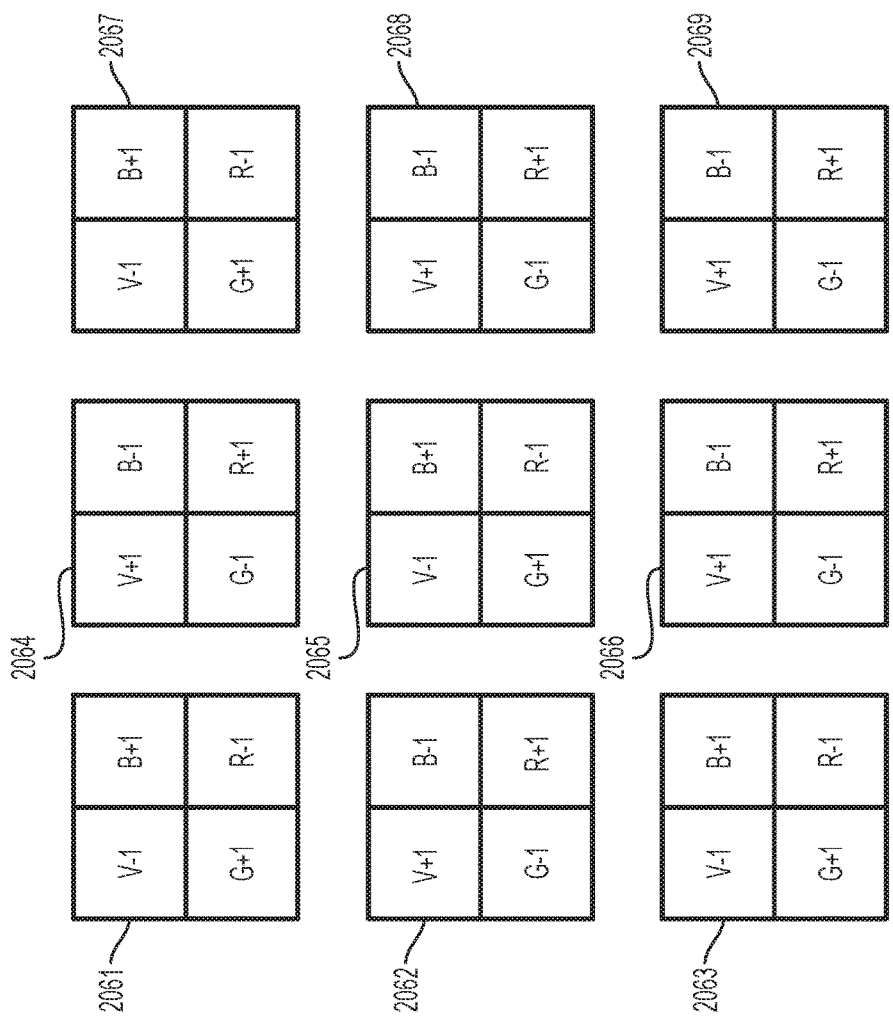
FIG. 20H shows pixels have short violet and red and long green and blue, or the converse.

FIG. 20G illustrates corresponding pixel layouts. It shows a set of nine pixels 2051-5059. Each pixel has four emitters (violet, blue, green, red). The target peak wavelengths of the display for each primary are noted as V, B, G, and R. The notations +1 and −1 denote an LED with a peak wavelength which is respectively longer/shorter than the target peak wavelengths (for instance by +/−1 nm, or by other amounts). In FIG. 20G, pixels of short and long wavelengths for all primaries are staggered. Other physical layouts can be used, as shown, for example in FIG. 20H. In FIG. 20H, pixels 2061-2066 have short violet and red and long green and blue, or the converse. Yet more layouts can be envisioned.

This concept can be used in direct-view displays with another number of primaries, including 3-primary displays like violet-green-red or blue-green-red.

Some embodiments have a pixel-to-pixel wavelength difference which is larger than one just noticeable difference (for instance as measured by the DE2000 color difference measure), but have a perceived screen color uniformity (when displaying a saturated primary) which is below one just noticeable difference.

In terms of die placement, this wavelength-averaging scheme may be achieved by having two populations of LEDs (for each color) and placing dies from each population in each pixel—for instance, two wavelength-binned LED tapes. Or, the LEDs may be combined at an intermediate level (for instance staggered on the same LED tape) then die-attached sequentially.

A direct-view display may be configured to behave like a three-primary system (i.e. having a triangular gamut shape in color space) despite the presence of four emitters. It may be configured such that day-mode and blue-free mode have substantially similar color gamuts. In particular, even in blue-free mode, the system may emit perceptually blue light (rather than violet light) when a saturated short primary is displayed. This can be achieved by mixing an appropriate amount of radiation from the green primary to radiation from the violet primary, such that the dominant wavelength of a pixel emitting a saturated short primary is pulled from the violet range to the blue range. To this effect, in some embodiments, in blue-free mode, pixels emit a saturated short-primary spectrum comprising a majority of radiation from the violet emitter, no radiation from the blue emitter, and at least 1% (or 2%, 5%, 10%) but no more than 30% (or 5%, 10%) radiation from the green emitter.

Figure 21:
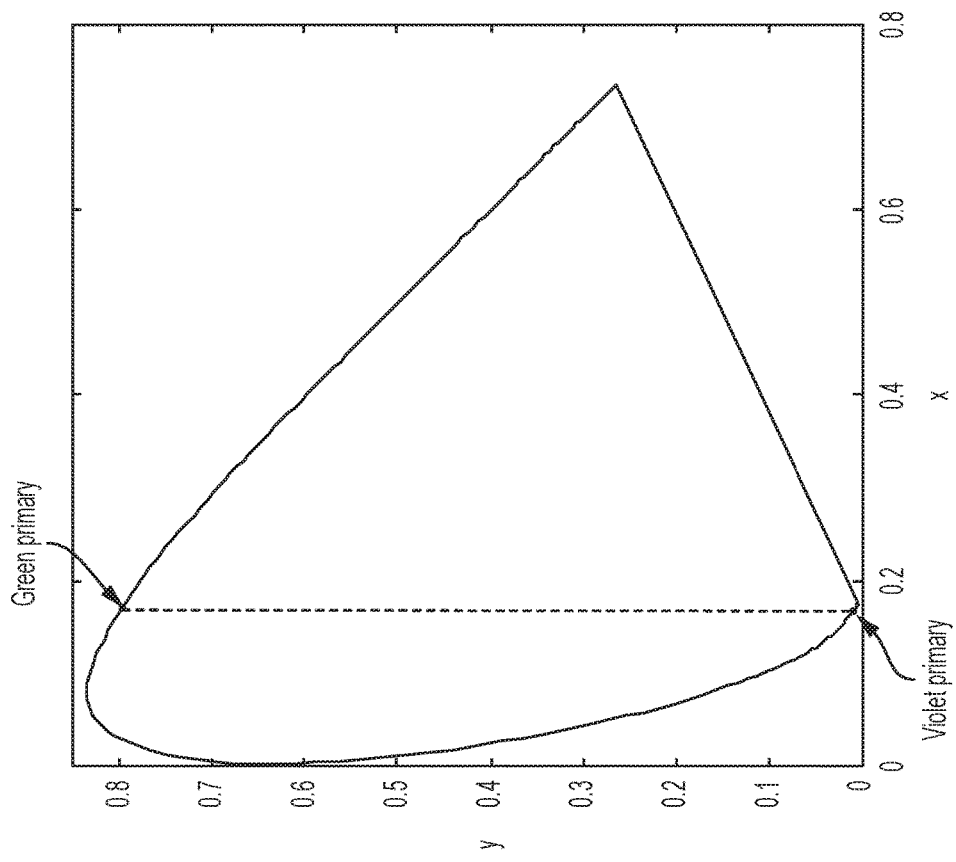
FIG. 21 shows the (xy) colorspace for a system having a violet emitter at 420 nm and a green emitter.

FIG. 21 illustrates this. It shows the (xy) colorspace for a system having a violet emitter at 420 nm and a green emitter. By allowing a small amount of radiation from the green emitter to contribute to the emission of the short primary, this primary is moved to a perceptual blue color along the dashed line.

Figure 22:
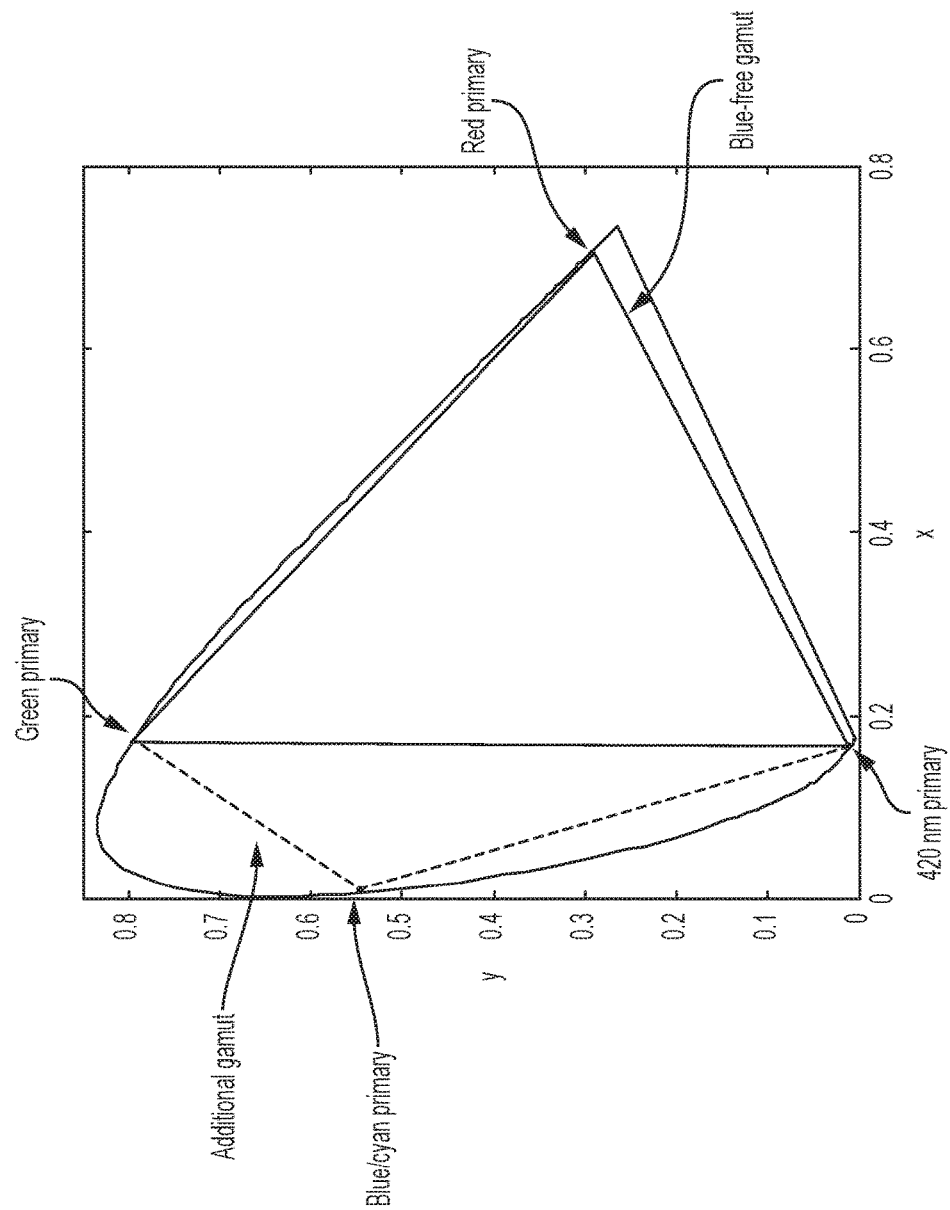
FIG. 22 shows a four-emitter system may make use of the four emitters to obtain a wider gamut.

Alternatively, a four-emitter system may make use of the four emitters to obtain a wider gamut. For instance, the system may be a 3-primary system (violet-green-blue) with a standard triangular-shape gamut in blue-free mode, and a 4-primary system with a quadrilateral gamut shape in day mode. FIG. 22 illustrates this. In this case, the fourth emitter may be selected as a blue, cyan or cyan-green emitter to provide an additional gamut. Its dominant wavelength may be in the range 480-520 nm or 470-500 nm.

Projection displays may have remote light sources projecting an image. The image may be projected onto a screen (or other object) observed by the user, or directly in the user's eye (for instance, forming an image on the retina). Relevant systems include a variety of systems, from large theater/conference projectors to head-up displays to microprojectors for personal use (for instance embedded in a phone or hand-held device) to wearable displays such as virtual-reality and augmented-reality glasses/headsets. The light emitters may be LEDs or OLEDs, but also other solid-state emitters (including lasers and superluminescent LEDs) whose directionality may be desirable in some cases.

Typically, the system comprises a violet emitter with a peak wavelength below 430 nm for emitting a blue-free spectrum, a red emitter and a green/yellow emitter. It may comprise a blue/cyan emitter, similarly to the direct-lit displays described above.

Waveguide-coupled displays may comprise light emitters optically coupled to the edges or to the backside of the waveguide, and may make use of color filters and liquid crystals to produce colored pixels. An example is an LCD display—typically, an active-matrix display where the liquid crystals (LC) with polarizers can transmit and block light at each subpixel, and where thin-film transistors control the state of the liquid crystals.

In some cases, the waveguide-coupled display comprises only blue-free emitters (such as a violet LED pumping a green and a red phosphor; or a combination of direct violet, green and red LEDs; or other similar combinations). The display is then a static display in terms of color gamut.

In other cases, the display also has the ability to emit blue light. For instance, the display comprises two types of emitters: LED1 (which emits some blue radiation) and LED2 (which is a blue-free emitter).

Figure 23A:
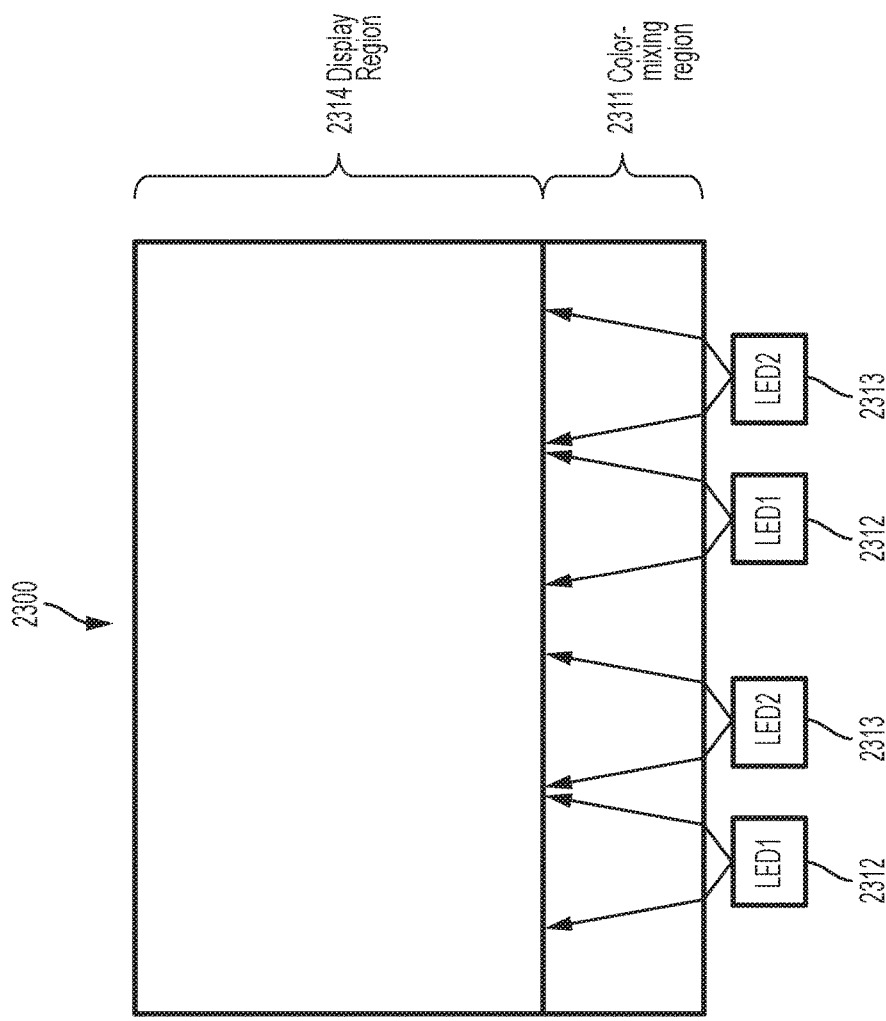
FIG. 23A shows a top view of an edge-lit display which comprises a color mixing region where light from LED1 and LED2 mixes for color uniformity, followed by a display region.

FIG. 23A illustrates a top view of an edge-lit display 2300 which comprises a color mixing region 2311 where light from LED1 and LED2 2312, 2313 mixes for color uniformity, followed by a display region 2314.

Figure 23B:
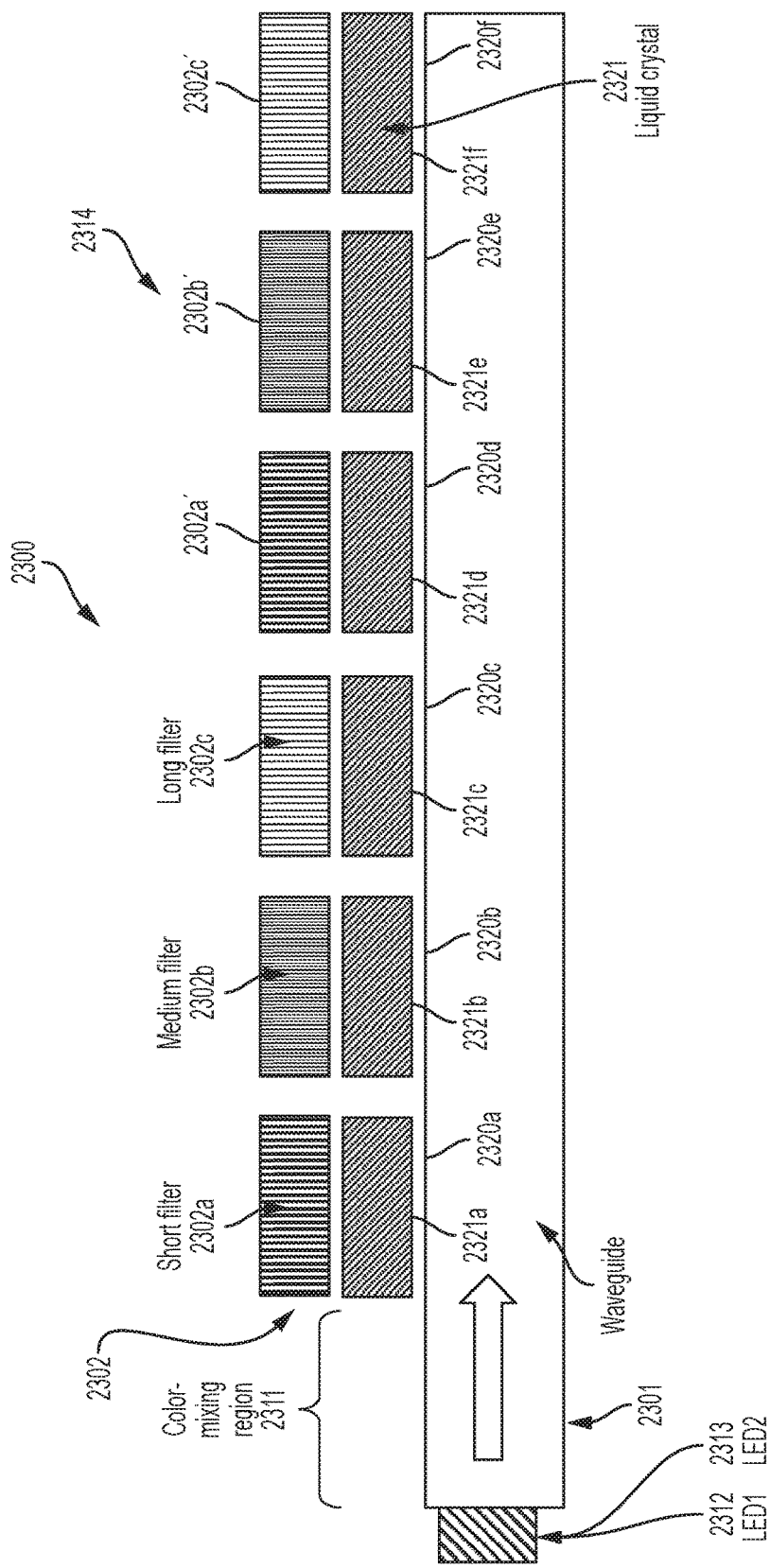
FIG. 23B shows a corresponding cross-section of the display of FIG. 23A.

FIG. 23B shows a corresponding cross-section of the display 2300. The display region 2314 has short-, medium- and long-wavelength subpixels 2320*a*-2320*f*. Each has a liquid crystal (with polarizers) 2321*a*-2321*f* to transmit/block light and a color filter 2302*a*, 2302*b*, 2302*c*, 2302*a'*, 2302*b'*, 2302*c'*.

In some cases, LED1 and LED2 are both substantially white emitters (meaning, their emission after full transmission by the display system is substantially white). In day mode, LED1 emits. In blue-free mode, only LED2 emits. LED1 and LED2 may be coupled to the same waveguide/color filter/LC or have two separate waveguide/color filters/LC (for instance, stacked waveguides). The spectra of LEDs 1 and 2, and the color filters, may be configured together such that the display has a desirable emission in both day mode and blue-free mode. For instance, the colorpoint/CCT and gamut may be substantially similar in both modes, such that the two modes are perceptually similar. Or, the CCT may be reduced to a lower value in blue-free mode, which can help further reduce circadian entrainment. For instance, in day mode the system has a white point with a CCT of 6500K and a peak emission around 450-470 nm; in night mode the system has a blue-free emission and white point with a CCT below 5000K (or below 4000K, below 3000K).

Figure 24:
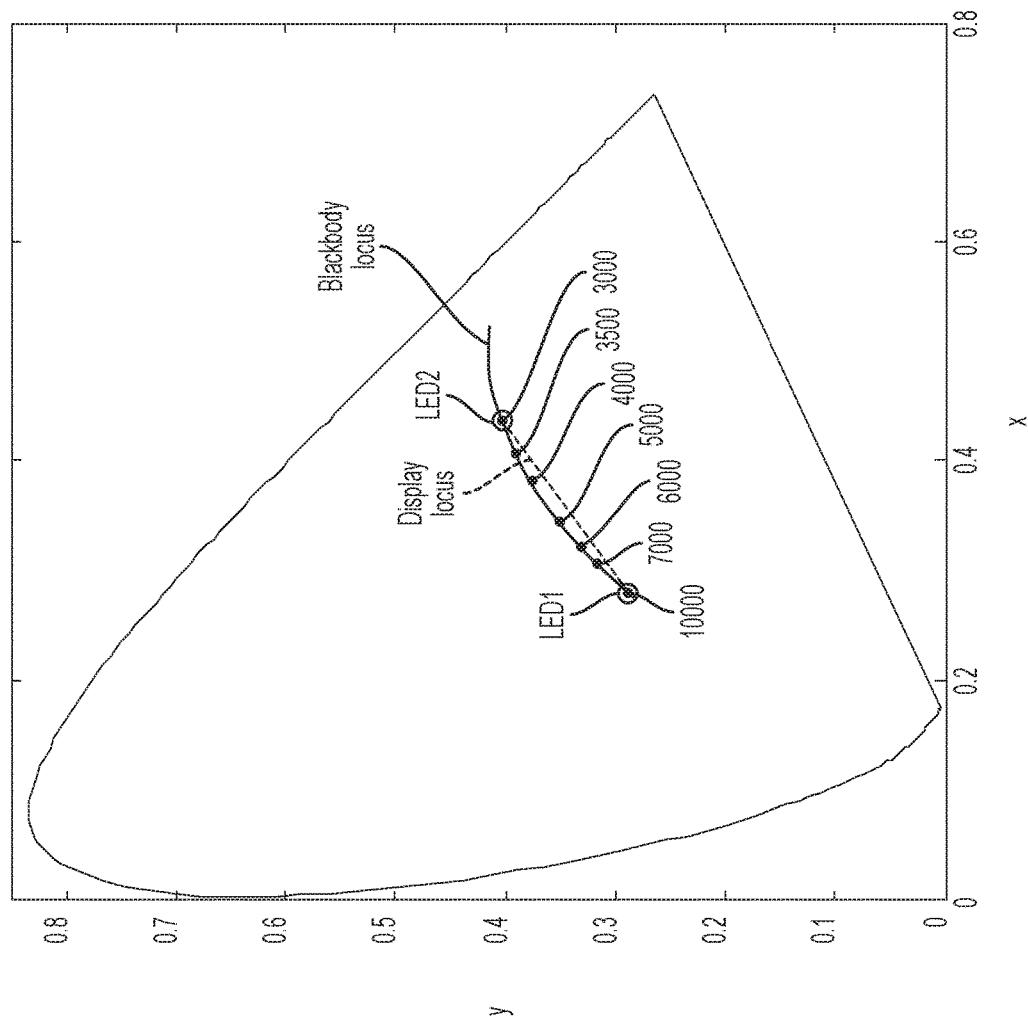
FIG. 24 shows the (xy) color space, the blackbody locus, various CCTs on the blackbody locus from 3000K to 10000K, and the white chromaticity of the display of FIG. 23B under emission front LED1 and LED2.

FIG. 24 illustrates such an embodiment. It shows the (xy) color space, the blackbody locus, various CCTs on the blackbody locus from 3000K to 10000K, and the chromaticity of the display under emission from LED1 and LED2. Here these emissions are on-Planckian with respective CCTs of 10000K and 3000K. When both LED1 and LED2 emit, the display can emit a varying CCT shown as the display locus (of course the CCT of the display can be further modified by tuning the color filters).

In other cases, LED1 is a direct blue/cyan LED and LED2 is a substantially-white emitter (after the system transmission is included) comprising a violet pump LED with a peak below 430 nm, a green phosphor and a red phosphor. In blue-free mode, only LED2 emits. In day mode, LED1 also emits.

Figure 25:
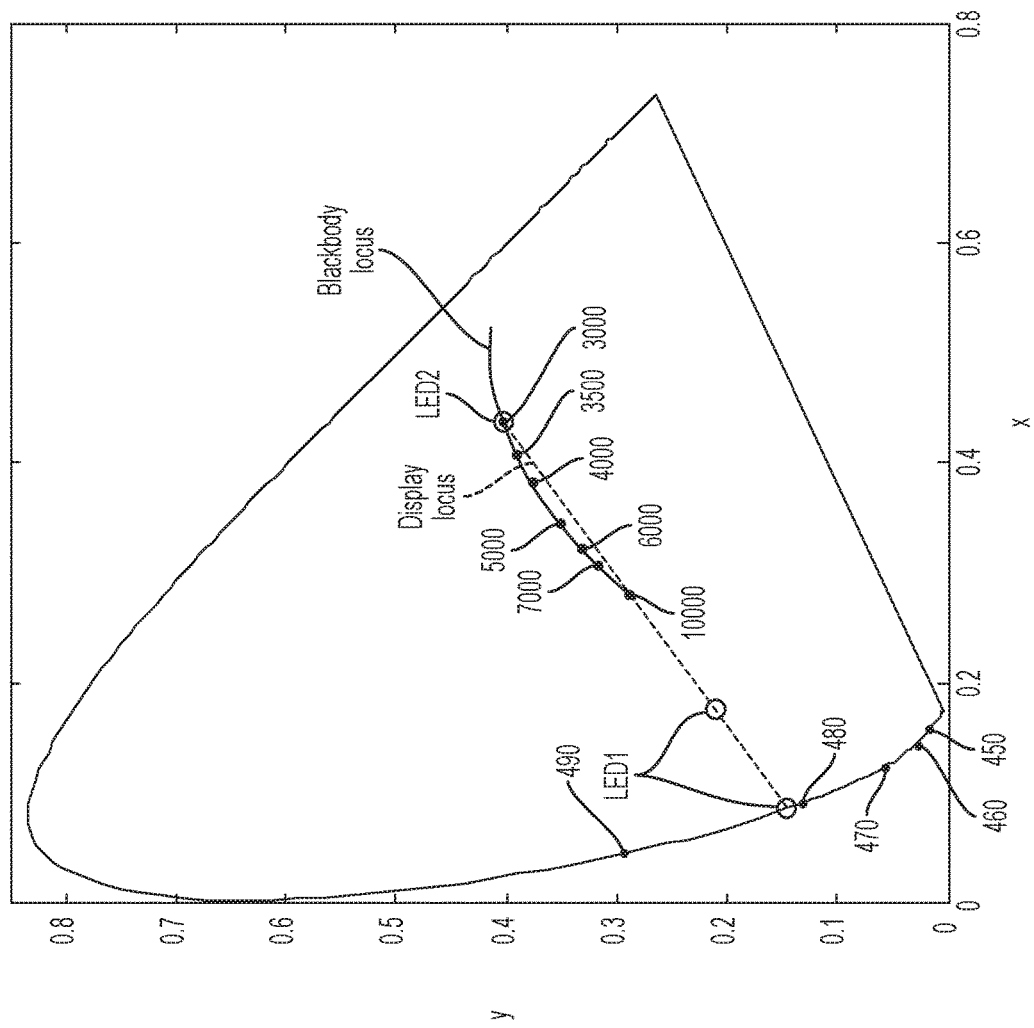
FIG. 25 shows an embodiment where LED1 of FIG. 23B is a blue/cyan.

FIG. 25 illustrates such an embodiment. FIG. 25 is similar to FIG. 24 but here LED1 is blue/cyan. Two possibilities are show, corresponding to a low/high purity LED1. Various dominant wavelengths are also shown for reference.

In other cases, LED1 has a blue/cyan LED, a green phosphor and a red phosphor, and LED2 is a direct violet pump LED with a peak below 430 nm. In day-free mode, only LED2 emits. In day mode, LED1 also emits.

In other cases, the system has four emitters: violet, blue/cyan, green/yellow and orange/red typically. In blue-free mode, the blue/cyan emitter does not emit. In day mode, the violet emitter may or not emit.

In some of the above embodiments, operation modes may occur where both the violet and blue LEDs emit. Time modulation may be applied to the LEDs and to the liquid crystal filters, such that violet and/or blue output is controlled. For instance, in one case, the system has a blue-free LED (violet LED, green phosphor, red phosphor) and a direct blue LED. In blue-free mode, only the blue-free LED is on. In day mode, there is a first time period where only the blue-free LED is on, the green and red pixels of the display are transmitting and the blue pixels are blocking; and a second time period where only the direct blue LED is on, and only the blue pixels are transmitting. With such an operation, the violet light can be removed from the emission in day mode. Other time-modulation schemes can be applied to separate violet and blue emission while maintaining a standard three-primary display. In some of these cases, the modulation speed of the emitters and of the liquid crystal is fast enough that modulation is invisible to the user. For instance, the LEDs and liquid crystals can switch between on and off states with characteristic (gray to gray) times less than 100 ms, 50 ms, 10 ms, 5 ms, 2 ms, 1 ms, 0.5 ms, 0.1 ms, 0.01 ms.

In yet other embodiments, the waveguide-coupled display has four color filters and is a four-primary system, as already described.

Some embodiments have local color conversion at the pixel level. These offer improvements over corresponding prior art local-conversion displays. Some prior art displays use a layer of quantum dots laid out as pixels on a surface of a waveguide.

Figure 26A:
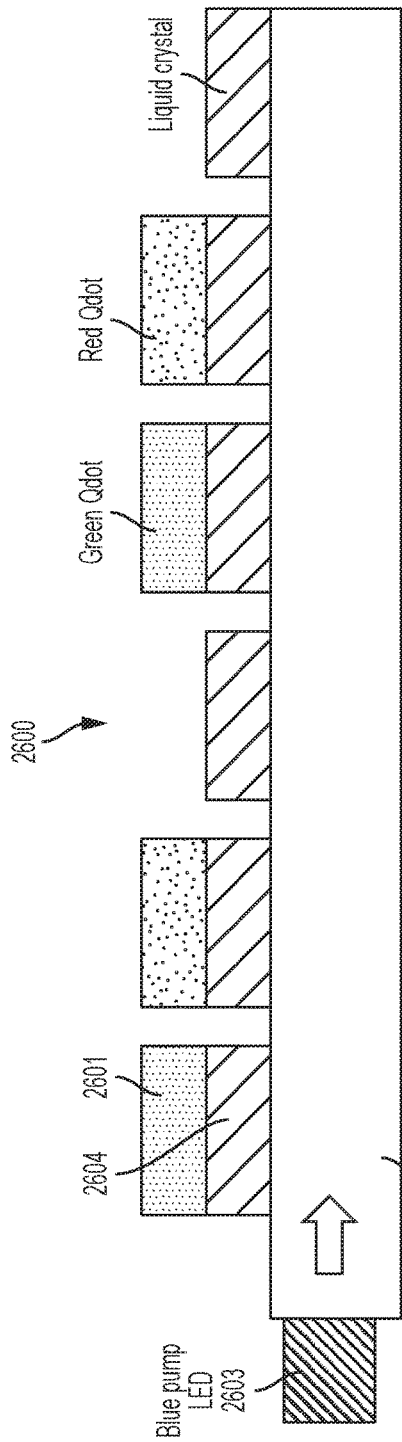
FIG. 26A shows a cross-section of a display with color sub-pixels having local wavelength-conversion materials.

FIG. 26A shows such a prior art display 2600. FIG. 26A shows a cross-section of a display 2600 with a few color sub-pixels 2601 (which may be repeated many times across the surface of the display). The display has a waveguide 2602 coupled to a blue pump LED 2603. Each pixel as a liquid crystal 2604 for transmitting pump light. Some pixels have red or green quantum dots (or other phosphors) for wavelength conversion, and other pixels are clear for blue transmission. Some limitations of this approach are: 1) ambient blue light can excite the quantum dots and cause unwanted fluorescence (this is especially pronounced in bright sunlight) and (2) converted light is emitted in both directions, and incurs loss in the waveguide direction. Other optical elements known in the art are omitted from FIG. 26A for simplicity, including polarizers around the liquid crystal, and a reflector on the backside of the display.

Applicants have discovered that the use of violet pump LEDs could be advantageous in displays with pixel-level color conversion, and could enable blue-free emission. Accordingly, embodiments employ violet pump LED and wavelength-converting materials (such as quantum dots or others). In some cases these are violet-selective materials (as disclosed above) which are configured to highly absorb violet light, but to have low absorption of blue light and/or longer wavelengths.

Figure 26B:
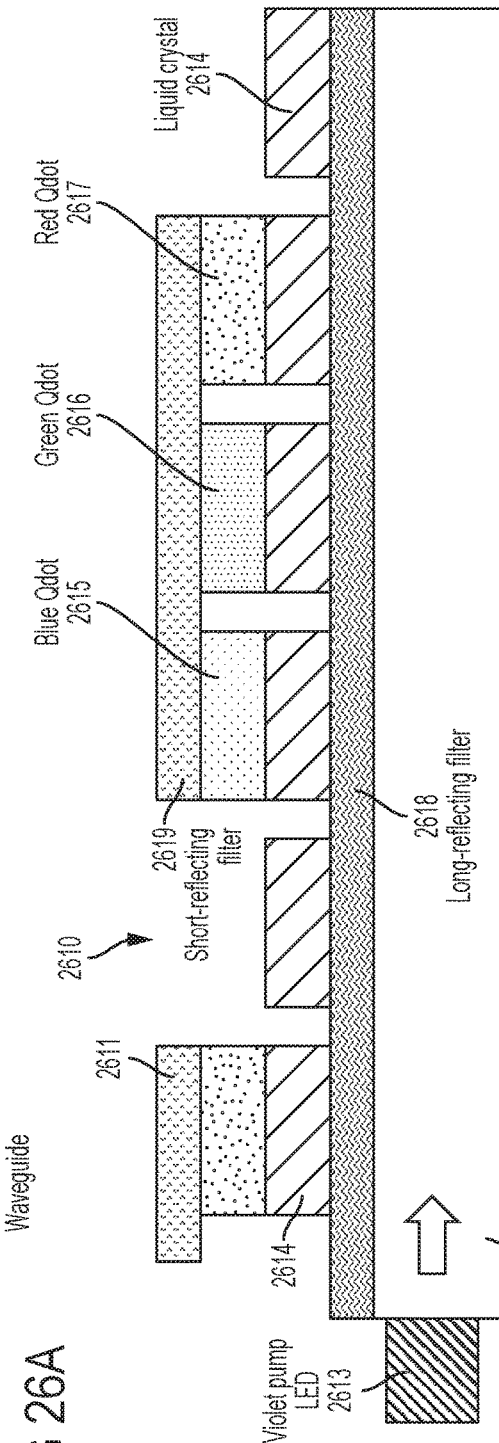
FIG. 26B shows a display with a violet pump LED coupled to a waveguide with color sub-pixels having local wavelength-conversion materials.

FIG. 26B shows such an embodiment. A violet pump LED 2613 is coupled to a waveguide 2612. Pixels 2611 have liquid crystals 2614 to block or transmit light. Some pixels have quantum dots 2615-2616 (other wavelength converters may also be used for some pixels or all pixels) including green and red Qdots 2616, 2617, and optionally blue Qdots 2615. Some of these wavelength-converting materials may be violet-selective materials. Optionally, some other pixels are clear (i.e. without Qdot) to enable violet transmission. A long-wavelength-reflecting filter 2618 may be placed between the waveguide and the Qdots. This filter can be configured to substantially transmit pump light but substantially reflect luminescence from the Qdots. For instance, the filter has a transmission which is at least 90% (or 80%, 95%) at the pump peak wavelength; it has a reflection which is at least 90% (or 80%, 95%) at the peak wavelength of the green Qdots (and/or the red Qdot, the blue Qdot). This filter enables more of the converted light to be emitted out of the display instead of being backscattered in the waveguide and lost. A short-wavelength-reflecting (or absorbing) filter 2619 may be placed above the colored pixels. This filter can be configured to substantially reflect/absorb pump light but substantially transmit luminescence from the Qdots. For instance, the filter has a transmission which is at most 10% (or 20%, 5%, 2%, 1%) at the pump peak wavelength; it has a transmission which is at least 90% (or 80%, 95%) at the peak wavelength of the green Qdots (and/or the red Qdot, the blue Qdot). This filter prevents ambient light from exciting the Qdots; it also increases the spectral purity of the converted light by reducing leakage of the pump light in other primaries. This filter may also be blocking radiation at shorter wavelength than the pump wavelength, especially ultra-violet radiation (i.e. below 400 nm or below 380 nm) which is present in daylight and may otherwise excite the Qdots.

Figure 26C:
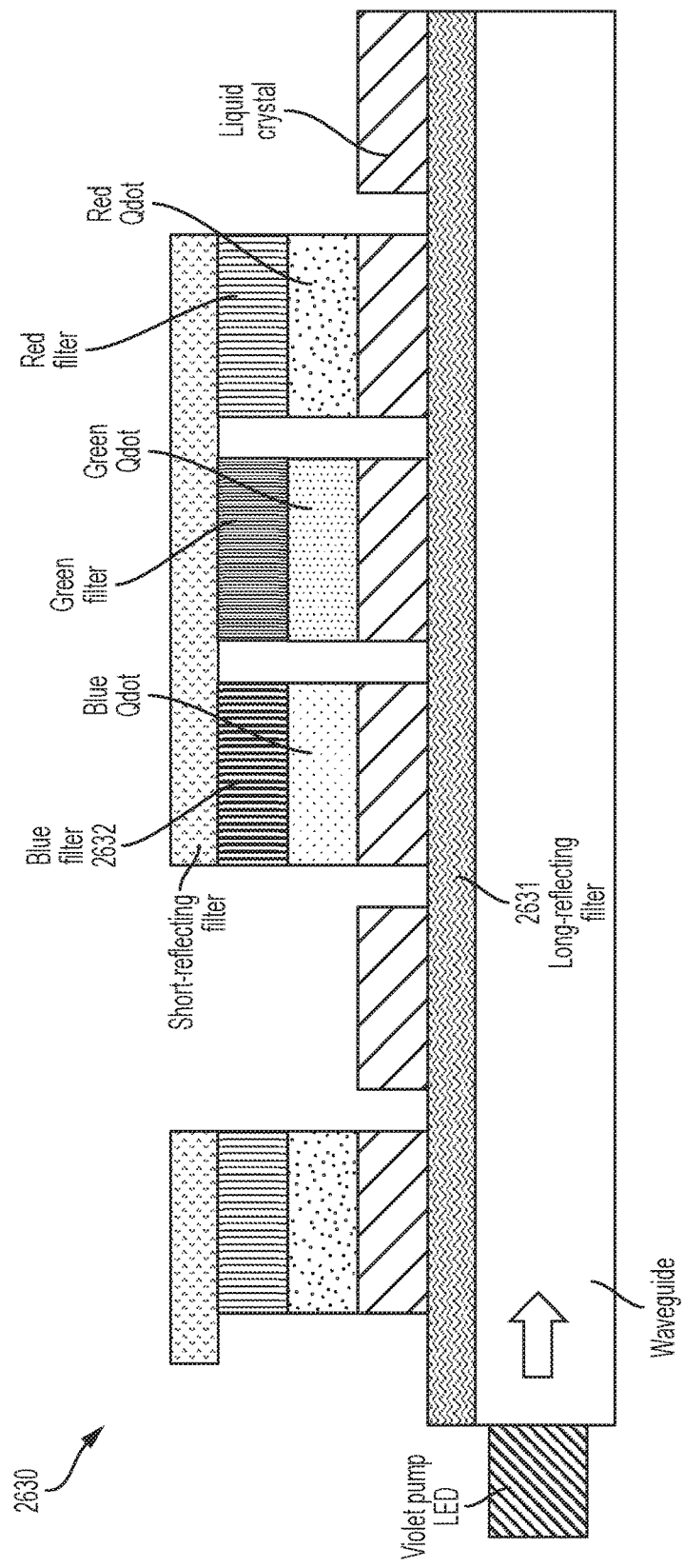
FIG. 26C shows color filters are optically coupled to some or all subpixels.

In some cases, color filters are optically coupled to some or all subpixels. For example, in the display 2630 of FIG. 26C, the blue subpixels 2631 have a blue color filter 2632, and likewise for the green and red subpixels. Each filter can be configured, as disclosed in this Application, to further shape the spectrum of the light emitters and control the color gamut.

In some cases, embodiments do not have blue subpixels and only have violet, green and red subpixels. In such cases, it may be easier to configure the short- and long-wavelength reflecting filters since there is little or no spectral overlap between pump light and converted light.

Variations are possible over the geometries shown in FIG. 26. Air gaps (i.e. air spacers) or low-index layers (such as index below 1.3 or 1.2) can be present between the reflecting filters and other elements. This can be desirable for dichroic filters, as their reflectivity is angle-dependent and is usually more uniform when light is coming from air than from a high-index medium. An air gap placed between the Qdots and the waveguide can also help limit the amount of converted light emitted backward towards the waveguide. The order of some layers can be swapped. The geometry need not be planar; it may be curved or flexible.

Figure 26D:
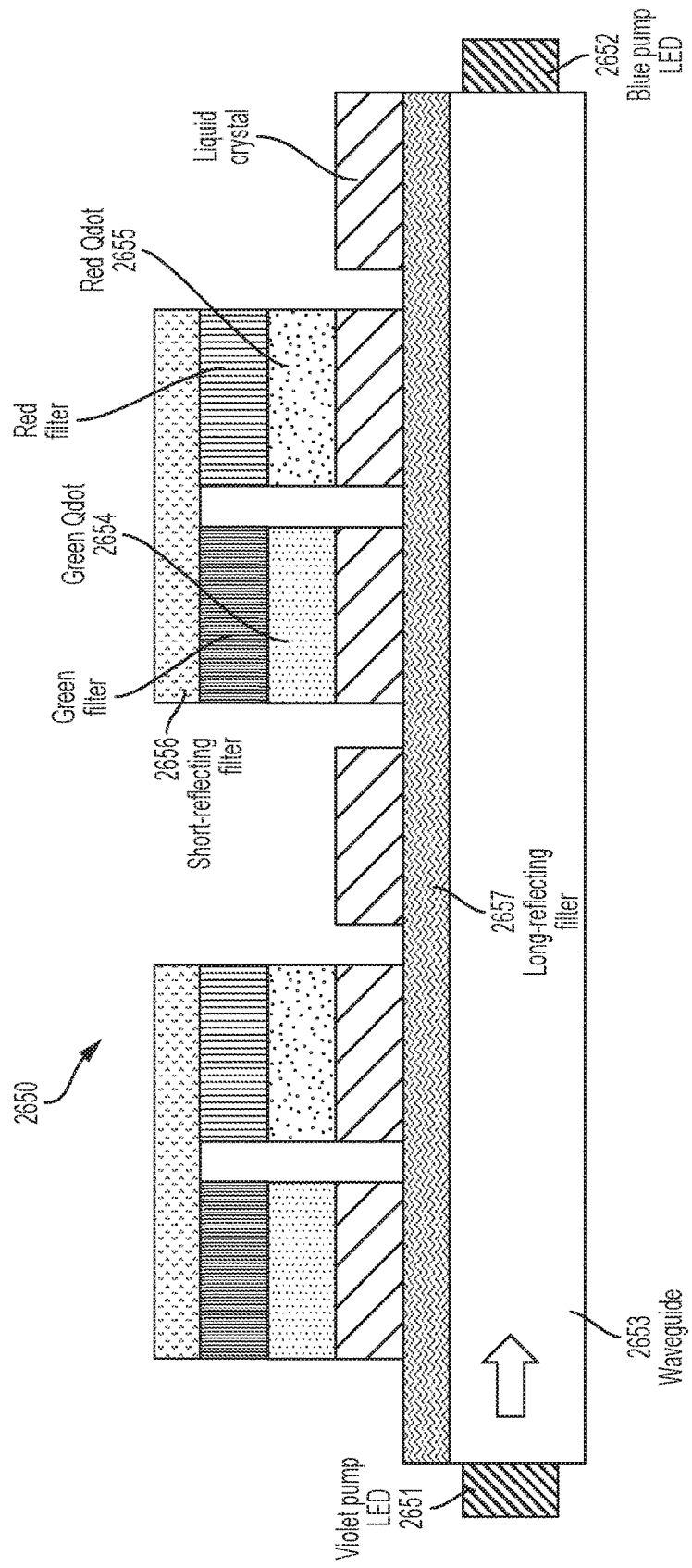
FIG. 26D shows a variation where both blue and violet pump LEDs are coupled to the waveguide, and the Qdots can absorb both violet and blue light.

FIG. 26D shows a variation of a display 2650 where both blue and violet pump LEDs 2651, 2652 are coupled to the waveguide 2653, and the Qdots 2654, 2655 can absorb both violet and blue light. By toggling the pump LEDs between blue and violet, the display switches between day mode and blue-free mode. In this case, the short-reflecting filter 2656 reflects blue and violet light, and the long-reflecting filter 2657 may transmit violet and blue light. In FIG. 26D, both the blue and violet light can be transmitted by the clear subpixels. In a variation, blue and violet clear subpixels are present. The violet subpixels have color filters to block transmission of blue light, and the blue subpixels have color filters to block transmission of violet light. In FIG. 26D the blue and violet pump LEDs are shown at two edges of the waveguide, but other layouts are possible including interspersed LEDs on one or several edges.

In some embodiments, the subpixels which transmit violet light further comprise a cyan-green phosphor to convert a small fraction of the violet pump and to increase its dominant wavelength.

In yet another variation, both blue and violet pump LEDs are coupled to the waveguide, but the Qdots only substantially absorb violet light. Blue light is just used for transmission in clear pixels in day mode.

Emitter Configurations

Regardless of the display architecture, emitters can have a variety of physical configurations and layouts.

A pump LED may be optically coupled to one or more wavelength-converting materials (such as phosphors/quantum dots in a matrix/binder, including a silicone, or in a film including a dry film or a film with binder). These wavelength-converting materials can be used to convert part of the pump radiation, resulting in an emission combining pump radiation and converted radiation.

In some cases substantially all the pump radiation may be converted: for instance, a green emitter can be obtained by combining a pump LED with wavelength-converting materials configured to absorb and convert more than 90% (or 95%, 98%, 99%, 99.5%) of the pump radiation; further, wavelength-selective filters (dye/pigment filters, absorbing filters, dichroic filters) can be used to suppress the pump radiation to result in an emission consisting mostly of converted radiation, or where the converted radiation is more than 90% (or 95%, 98%, 99%, 99.5%) of the total radiation of the filtered emitter.

The wavelength-converting material may be in physical contact with the pump LED (i.e. directly deposited on the pump LED); or it may be a remote coupling, with the pump radiation traveling in air and/or optical elements and/or waveguides to the wavelength-converting material (for instance, the pump LED is coupled to a waveguide and the waveguide comprises films like quantum-dot-enhancement-films on the waveguide surface, or a phosphor bar on the waveguide edge, or patches of wavelength-converting material, which may be formed at the level of each pixel or cover a large area of the waveguide).

A plurality of emitters may be combined to obtain a white emission (for instance in an RGB scheme, or a substantially-white emitter is combined with a colored emitter).

In one embodiment the system has two sets of emitters. One set comprises a pump LED with phosphors. The other set comprises pump LEDs with or without phosphors.

In one embodiment, the system has at least three sets of colored emitters (such as violet, green and blue).

In one embodiment, several emitters are present. Emission from the emitters is mixed to a combined emission. The combined emission is then locally filtered by color filters and light-blocking elements (such as liquid crystals) to form an image. An LCD screen is an example of such a configuration.

In one embodiment, several emitters are present (such as violet, green and blue). Emission from each emitter is directed by optical elements (such as DLPs or fast adaptive optics) to form an image. A laser (or superluminescent-LED) projector is an example of such a configuration.

In one embodiment, several emitters are present (such as violet, green and blue) in each pixel. The intensity of each emitter is modulated in each pixel to form an image. A direct-view LED or OLED screen is an example of such a configuration.

In one embodiment, at least one pump LED is coupled to a waveguide where pump light propagates, and wavelength-converting materials are excited after propagation through the waveguide. For instance, wavelength-converting materials with several colors are placed at each pixel on the waveguide, together with light-blocking elements (such as liquid crystals). For instance the pump LED is violet, and each pixel has a patch of green phosphor, a patch of red phosphor, a patch of blue phosphor, and a patch without phosphor (to enable direct transmission of violet light); each patch has a liquid crystal to turn it on or off.

While this Application is generally relevant to display systems, some of its teachings are more broadly relevant to light-emitting systems, including general lighting systems. Some teachings may be relevant to emitters having blue light, in addition to blue-free emitters. Likewise, it should be understood that the foregoing is illustrative and not limiting and that obvious modifications may be made by those skilled in the art without departing from the spirit of the invention. Accordingly, the specification is intended to cover such alternatives, modifications, and equivalence as may be included within the spirit and scope of the invention as defined in the following claims.

What is claimed is:

1. A display for emitting display light comprising:
   a light source for emitting a source light; and
   a filter positioned in the path of said source light, said filter comprising at least short, medium and long filters, wherein said short filter is configured to transmit short-primary light from said source light, said short-primary light comprising a violet portion having wavelengths from 400 to 440 nm and at least a second portion having wavelengths above 440 nm such that said short-primary light is perceptually blue, said short-primary light having a short-primary SPD having a short-primary power between 380-780 nm and a blue power between 440-500 nm, wherein said blue power is less than 20% of said short-primary power.

2. The display of claim 1, wherein said light source comprises a violet solid-state emitter for emitting pump light having a peak wavelength below 430 nm.

3. The display of claim 2, wherein said short-primary light has a dominant wavelength and said peak wavelength is at least 30 nm shorter than said dominant wavelength.

4. The display of claim 3, wherein said dominant wavelength is above 440 nm.

5. The display of claim 4, wherein said dominant wavelength is above 460 nm.

6. The display of claim 2, wherein said source light has a source light SPD having a source power between 380-780 nm and a source blue power between 440-500 nm, wherein said source blue power is less than 5% of said source power.

7. The display of claim 6, wherein,
   said light source comprises one or more solid state light emitters comprising at least a violet solid-state emitter emitting pump light with a peak wavelength in a range 400-430 nm;
   one or more wavelength converting materials comprising at least a first wavelength-conversion material configured to absorb a portion of said pump light and to convert said portion to converted light, said first wavelength-conversion material having a first absorption coefficient at said peak wavelength, and a second absorption coefficient at 450 nm, wherein said first absorption coefficient is less than 70% of said second absorption coefficient;
   wherein said one or more solid state emitters and said one or more wavelength-conversion materials are configured such that said first wavelength-conversion material does not substantially absorb light between 440-490 nm; and
   wherein said emitted light is substantially white light essentially free of blue light.

8. The display of claim 1, wherein said short filter is configured to block a substantial portion of said source light in the range 440-500 nm while transmitting said violet and second portions.

9. The display of claim 1, wherein said medium filter is configured to transmit medium-primary light from said source light, and said long filter is configured to transmit long-primary light from said source light, wherein the combination of said short-primary light, said medium-primary light, and said long-primary light is substantially white light.

10. The display of claim 9, wherein said medium-primary light is perceptually green, and said long-primary light is perceptually red.

11. The display of claim 1, wherein, when said short, medium, and long filters are fully transmitting, said display light is substantially white light with a display SPD having a display power between 380-780 nm, and display blue power between 440-500 nm, wherein said display blue power is less than 5% of said display power.

12. The display of claim 11, wherein said filter is configured such that at least 40% of said display power is below the wavelength of 430 nm.

13. The display of claim 11, wherein said substantially white light is within an (x, y) distance less than 0.03 from a D65 chromaticity.

14. The display of claim 11, wherein said display has a gamut which is at least 90% of DCI-P3 (calculated in (xy)).

15. The display of claim 1, wherein said second portion has a second portion SPD having a second portion power between 440-780 nm, wherein at least 80% of said second portion power is in the range 490-780 nm.

16. The display of claim 15, wherein at least 80% of said second portion power is within a wavelength range 500-540 nm.

17. The display of claim 1, wherein said short filter is configured such that at least 10% of said short-primary power is in a range 490-780 nm.

18. The display of claim 17, wherein said short filter is configured such that at least 20% of said short-primary power is in a range 500-780 nm.

19. The display of claim 1, wherein the short filter has a transmission at a wavelength of 500 nm which is at least 30% of its transmission at said pump wavelength.

20. The display of claim 2, wherein the violet solid-state emitter is selected from one of an LED, a laser diode, or an OLED.

21. The display of claim 1, wherein said display defines a plurality of pixels comprising subpixels, each subpixel comprising one of said short, medium and long filters.

22. The display of claim 21, wherein each of said pixels comprising subpixels having each of said short, medium and long filters.

23. A light source for emitting emitted light, said light source comprising:
   one or more solid state light emitters comprising at least a violet solid-state emitter emitting pump light with a peak wavelength in a range 400-430 nm;
   one or more wavelength converting materials comprising at least a first wavelength-conversion material configured to absorb a portion of said pump light and to convert said portion to converted light, said first wavelength-conversion material having a first absorption coefficient at said peak wavelength, and a second absorption coefficient at 450 nm, wherein said first absorption coefficient is less than 70% of said second absorption coefficient;

wherein said one or more solid state emitters and said one or more wavelength-conversion materials are configured such that said first wavelength-conversion material does not substantially absorb light between 440-490 nm; and wherein said emitted light is substantially white light essentially free of blue light.

24. The light source of claim 23, wherein said one or more wavelength converting materials are configured to leak a second portion of said pump light such that said emitted light comprises said second portion.

25. The light source of claim 23, wherein said first wavelength converting material is configured not to absorb a second portion of said pump light.

26. The light source of claim 23, wherein said emitted light has an SPD having an emitted power between 380-780 nm and a violet power between 400-440 nm, wherein said violet power is at least 20% of said emitted power.

27. The light source of claim 26, wherein said violet power is at least 40% of said emitted power.

28. The light source of claim 26, wherein said one or more solid state emitters and said wavelength-conversion materials are configured to provide package efficiency for the light source of at least 70%.

29. The light source of claim 28, wherein said package efficiency is at least 85%.

30. The light source of claim 23, wherein said emitted light has an emitted light SPD having an emitted power between 380-780 nm and a violet power between 400-430 nm, and a blue power between 440-500 nm, wherein said violet power is at least 20% of said emitted power and said blue power is less than 5% of said emitted power.

31. The light source of claim 30, wherein said blue power is less than 10% of said violet power.

32. The light source of claim 23, wherein said first wavelength-conversion material has a maximum peak absorption coefficient outside of said range.

33. The light source of claim 32, wherein said maximum peak absorption coefficient is between 440 and 490 nm.

34. The light source of claim 32, wherein said emitted light has an SPD with a local minimum within +/−25 nm of the wavelength corresponding to said maximum peak absorption coefficient.

35. The light source of claim 23, wherein said first wavelength conversion material is one of KSF or MFG.

36. The light source of claim 23, wherein the violet solid-state emitter is selected from one of an LED, a laser diode, an OLED.

37. A display comprising the light source of claim 23 plus a second light source that emits substantial light between 440-490 nm.

38. A display comprising the light source of claim 23, wherein said display is configured to emit a display light when set to display a white point, said display light being substantially white light.

39. The display of claim 38, wherein said display light has a CCT above 4000K.

40. The display of claim 38, where the display light has a display SPD having a white display power between 380-780 nm and a blue display power between 440-500 nm, wherein said blue display power is less than 5% of said white display power.

* * * * *